(12) United States Patent
Nakata et al.

(10) Patent No.: US 9,443,885 B2
(45) Date of Patent: Sep. 13, 2016

(54) SEMICONDUCTOR DEVICE AND DISPLAY DEVICE

(71) Applicant: Sharp Kabushiki Kaisha, Osaka-shi, Osaka (JP)

(72) Inventors: Yukinobu Nakata, Osaka (JP); Masaki Maeda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 20 days.

(21) Appl. No.: 14/431,823

(22) PCT Filed: Sep. 25, 2013

(86) PCT No.: PCT/JP2013/075859
§ 371 (c)(1),
(2) Date: Mar. 27, 2015

(87) PCT Pub. No.: WO2014/054483
PCT Pub. Date: Apr. 10, 2014

(65) Prior Publication Data
US 2015/0221680 A1    Aug. 6, 2015

(30) Foreign Application Priority Data

Oct. 2, 2012    (JP) .................................. 2012-220373

(51) Int. Cl.
*H01L 27/12*      (2006.01)
*H01L 27/02*      (2006.01)
*G02F 1/1362*     (2006.01)

(52) U.S. Cl.
CPC ......... *H01L 27/1244* (2013.01); *G02F 1/1368* (2013.01); *G02F 1/133345* (2013.01);

(58) Field of Classification Search
CPC ........... H01L 27/1244; H01L 27/1262; H01L 27/127; H01L 27/0296; H01L 27/1225; G02F 1/133345; G02F 1/1368; G02F 1/136277; G02F 1/136204
See application file for complete search history.

(56) References Cited

U.S. PATENT DOCUMENTS 5,677,745 A     10/1997  Kawano et al.
2010/0134740 A1  6/2010  Nakao

FOREIGN PATENT DOCUMENTS

JP        2010-230744 A    10/2010

*Primary Examiner* — Donald Raleigh
*Assistant Examiner* — Kevin Quarterman
(74) *Attorney, Agent, or Firm* — Keating & Bennett, LLP

(57) ABSTRACT

An array board 11*b* includes a first diode 29, a contact portion 32, and a static protection portion 51. The first diode 29 includes first electrodes 29*a*, 29*b* and a first semiconductor portion 29*d*. The first electrodes 29*a*, 29*b* are formed from a second metal film 38. The first semiconductor portion 29*d* is connected to the first electrodes 29*a*, 29*b* via first diode-side holes 29*c*1, 29*c*2. The contact portion 32 includes agate line-side connecting portion 48 and a diode-side connecting portion 50. The gate line-side connecting portion 48 is formed from a first metal film at an end of a gate line 19. The diode-side connecting portion 50 is connected to the gate line-side connecting portion 48 via a contact portion-side hole 49*a*. The static protection portion 51 includes a static dissipating portion 52 and a static dissipation portion protection portion 53. The static dissipating portion 52 is formed from a semiconductor film 36 and for dissipating static electricity that builds up in one of the first diode 29 and the contact portion 32 in a stage prior to formation of the second metal film 38. The static dissipating portion protection portion 53 is formed from a protection film 37 and includes a static dissipating hole 53*a* that is a through hole formed at a position overlapping the static dissipating portion 52 in a plan view.

20 Claims, 33 Drawing Sheets

SEMICONDUCTOR DEVICE AND DISPLAY DEVICE

TECHNICAL FIELD

The present invention relates to a semiconductor device and a display device.

BACKGROUND ART

A liquid crystal panel in a liquid crystal display device includes TFTs arranged in a matrix. The TFTs are switching components for controlling operations of pixels. Silicon semiconductors such as amorphous silicon semiconductors have been used for semiconductor films of the TFTs. In recent years, use of oxide semiconductors having higher electron mobility for semiconductor films has been proposed. An example of a liquid crystal display device including TFTs using such oxide semiconductors as switching components is disclosed in Patent Document 1.

RELATED ART DOCUMENT

Patent Document

Patent Document 1: Japanese Unexamined Patent Application Publication No. 2010-230744

Problem to be Solved by the Invention

An oxide semiconductor has high electron mobility. Therefore, sizes of TFTs can be reduced and an aperture ratio of a liquid crystal panel can be increased. Furthermore, various circuits can be arranged on an array board on which the TFTs are disposed. However, if circuits are disposed on the array board, voltages caused by static electricity may be applied to the circuits in a fabrication process. This may cause malfunctions of the circuits.

DISCLOSURE OF THE PRESENT INVENTION

The present invention was made in view of the above circumstances. An object is to provide technology for reducing malfunctions due to static electricity.

Means for Solving the Problem

A first semiconductor device according to the present invention includes a substrate, a first metal film, an insulation film, a semiconductor film, a protection film, second metal film, two electrodes, a semiconductor component, a signal line, a signal line-side connecting portion, a contact portion, and a static protection portion. The first metal film is formed on the substrate. The insulation film is formed at least on the first metal film. The semiconductor film is formed on the insulation film. The protection film is formed at least on the semiconductor film and protects the semiconductor film. The second metal film is formed on the protection film. The electrodes are formed from the second metal film. The semiconductor component includes at least a protection portion and a semiconductor portion. The protection portion is formed from the protection film. The protection portion includes two semiconductor component-side holes that are through holes formed at positions overlapping the electrodes. The semiconductor portion is formed from the semiconductor film and connected to the two electrodes via the semiconductor component-side holes. The signal line is formed from the first metal film. The signal line-side connecting portion is formed from the first meal film at an end of the signal line. The contact portion includes at least an insulator and a semiconductor component-side connecting portion. The insulator is formed from the protection film and the insulation film. The insulator includes a contact portion-side hole that is a through hole formed at a position overlapping the signal line-side connecting portion. The semiconductor component-side connecting portion is formed from the second metal film. The semiconductor component-side connecting portion continues from one of the two electrodes of the semiconductor component. The semiconductor component-side connecting portion is connected to the signal line-side connecting portion via the contact portion-side hole. The static protection portion includes at least a static dissipating portion and a static dissipating portion protection portion. The static dissipating portion is formed from the semiconductor film and arranged between the semiconductor component and the contact portion in a plan view. The static dissipating portion is for dissipating static that builds up in one of the semiconductor component and the contact portion in a stage prior to formation of the second metal film. The static dissipating portion protection portion is formed from the protection film. The static dissipating portion protection portion includes a static dissipating hole that is a through hole formed at a position overlapping the static dissipating portion in a plan view.

The signal line-side connecting portion is formed at the end of the signal line in the contact portion. The signal line is formed from the first metal film. The semiconductor component-side connecting portion is formed from the second metal film and continues from one of the electrodes of the semiconductor component. The signal line-side connecting portion is connected to the semiconductor component-side connecting portion via the contact portion-side hole that is a through hole in the insulator. According to this configuration, signals from the semiconductor component are supplied to the signal line. In a stage prior to formation of the second metal film in the fabrication process of the semiconductor device, the semiconductor component-side hole that is a through hole in the protection portion formed from the protection film is formed in the semiconductor component. In the contact portion, the contact portion-side hole that is a through hole in the insulator formed from the protection film and the insulation film is formed. The semiconductor portion formed from the semiconductor film is exposed through the semiconductor component-side hole. The signal line-side connecting portion formed from the first metal film is exposed through the contact portion-side hole. Under this configuration, if static electricity builds up in the semiconductor component or the contact portion, the static may be applied to the other semiconductor component or the signal line-side connecting portion. This may cause a malfunction of the semiconductor component or the contact portion.

The semiconductor device includes the static protection portion that includes at least the static dissipating portion and the static dissipating portion protection portion. The static dissipating portion is formed from the semiconductor film and arranged between the semiconductor component and the contact portion in a plan view. The static dissipating portion protection portion is formed from the protection film. The static dissipating portion protection portion includes the static dissipating hole that is a through hole formed at the position overlapping the static dissipating portion in a plan view. According to the static protection portion, in the stage prior to the formation of the second metal film in the fabrication process of the semiconductor device, the static dissipating portion is exposed through the static dissipating hole that is a through hole in the static dissipating portion protection portion. Even if static electricity builds up in the semiconductor component or the contact portion in the stage prior to the formation of the second metal film, the static electricity is transferred to the static dissipating portion via the static dissipating hole that is present in a path toward the other. Therefore, the malfunction of the semiconductor component or the contact portion due to the static electricity is less likely to occur.

Furthermore, the static dissipating portion is formed from the semiconductor film that also forms the semiconductor portion of the semiconductor component. If static electricity builds up in the signal line-side connecting portion in the contact portion, the static is effectively dissipated and application of the static to the semiconductor portion is properly restricted.

Preferable embodiments may include the following configurations.

(1) The semiconductor film may be made of oxide semiconductor. The semiconductor film made of oxide semiconductor is more likely to be etched during formation of the second metal film in the fabrication process. After the formation of the second metal film, oxidation or reduction of the semiconductor film is more likely to occur. However, the protection film is disposed between the semiconductor film and the second metal film, that is, the semiconductor film is protected by the protection film. Therefore, the semiconductor film is less likely to be etched during the formation of the second metal film and the oxidation or the reduction thereof is less likely to occur after the formation of the second metal film.

(2) The semiconductor device may include a static dissipating line formed from the first metal film. The static dissipating line may be arranged between the semiconductor component and the contact portion in a plan view and such that at least a portion of the static dissipating line overlaps the static dissipating portion and the static dissipating portion protection portion to dissipate static electricity that is transferred to the static dissipating portion. Because the static electricity that may build up in the semiconductor component or the contact portion and transferred to the static dissipating portion is dissipated to the static dissipating line, a malfunction due to the static electricity is further less likely to occur.

(3) The semiconductor device may include two second electrodes, a second semiconductor component, a first shorting line, a second shorting line, a second insulator, and a static dissipating line-side connecting portion. The electrodes may be formed from the second metal film. The second semiconductor component may include at least a second protect portion and a second semiconductor portion. The second protection portion may be formed from the protection film. The second protection portion may include two second semiconductor component-side holes that through holes formed at positions overlapping the two second electrodes. The second semiconductor portion may be formed from the semiconductor film and connected to the second electrodes via the second semiconductor component-side holes. The first shorting line may be formed from the second metal film. The first shorting line may continue to the semiconductor component-side connecting portion. The first shorting line may short one of the electrodes to one of the second electrodes. The second shorting line may be formed from the second metal film. The second shorting line may short another one of the electrodes to another one of the second electrodes. The second insulator may be formed from the protection film and the insulation film. The second insulator may include a second shorting line-side hole that is a through hole formed at a position overlapping the second shorting line. The static dissipating line-side connecting portion may be formed from the first metal film and arranged so as to overlap the static dissipating line and such that at least a portion of static dissipating line-side connecting portion overlaps the second shorting line in a plan view. The static dissipating line-side connecting portion may be connected to the second shorting line via the second shorting line-side hole. Regarding the semiconductor component and the second semiconductor component, one of the electrodes is shorted to one of the second electrodes by the first shorting line. Furthermore, the other one of the electrodes is shorted to the other one of the second electrodes by the second shorting line. The first shorting line continues to the semiconductor component-side connecting portion that is connected to the signal line in the contact portion. The second shorting line is connected to the static dissipating line-side connecting portion that continues from the static dissipating line via the second shorting line-side hole that is a through hole formed in the second insulator. According this configuration, if a large potential difference occurs between the static dissipating line and the signal line due to static electricity, the potential difference is compensated by passing a current to the semiconductor portion of the semiconductor component or the second semiconductor portion of the second semiconductor component.

(4) The semiconductor device may include a third insulator, a gate electrode, and a second gate electrode. The third insulator may be formed from the protection film and the insulation film. The third insulator may include a first shorting line-side hole that is a through hole formed at a position overlapping the first shorting line. The gate electrode may be included in the semiconductor component. The gate electrode may be formed from the first metal film. The gate electrode may be arranged so at to overlap at least portions of the electrode, the semiconductor portion, and the first shorting line in a plan view. The gate electrode may be connected to the first shorting line via the first shorting line-side hole. The second gate electrode may be included in the second semiconductor component. The second gate electrode may be formed from the first metal film. The second gate electrode may be arranged so as to overlap the second electrodes and the second semiconductor portion in a plan view. The second gate electrode may continue to the static dissipating line-side connecting portion. The gate electrode is shorted to one of the electrodes and one of the second electrodes by the first shorting line. The second gate electrode is shorted to the other one of the electrodes and the other one of the second electrodes by the second shorting line. The semiconductor component and the second semiconductor component may be configured as diodes having transistor configurations. However, the static electricity can be transferred to the static dissipating line only when the static electricity builds up by setting the threshold voltage higher than the voltage of the signal transmitted through the signal line but lower than the voltage that may be applied when the static electricity builds up. Furthermore, the second gate electrode is directly connected to the static dissipating line-side connecting portion. In comparison to a configuration in which the second gate electrode is connected to the static dissipating line-side connecting portion via the second shorting line, there is the smaller number of contact portions that connect different metal films. Therefore, loose connections are less likely to occur in the contact portions.

(5) The semiconductor device may include a third insulator, agate electrode, a fourth insulator, and a second gate electrode. The third insulator may be formed from the protection film and the insulation film. The third insulator may include a first shorting line-side hole that is a through hole formed at a position overlapping the first shorting line. The gate electrode may be included in the semiconductor component. The gate electrode may be formed from the first metal film. The gate electrode may be arranged so as to overlap the two electrodes, the semiconductor portion, and the first shorting line in a plan view. The gate electrode may be connected to the first shorting line via the first shorting line-side hole. The fourth insulator may be formed from the protection film and the insulation film. The fourth insulator may include a second second shorting line-side hole that is a through hole formed at a position overlapping the second shorting line. The second gate electrode may be included in the second semiconductor component. The second gate electrode may be formed from the first metal film. The second gate electrode may be arranged so as to overlap the second electrodes, the second semiconductor portion, and the second shorting line in a plan view. The second gate electrode may be connected to the second shorting line via the second second shorting line-side hole. The gate electrode is shorted to one of the electrodes and one of the second electrodes by the first shorting line. The second gate electrode is shorted to the other one of the electrodes and the other one of the second electrodes by the second shorting line. The semiconductor component and the second semiconductor component may be configured as diodes having transistor configurations. However, the static electricity can be transferred to the static dissipating line only when the static electricity builds up by setting the threshold voltage higher than the voltage of the signal transmitted through the signal line but lower than the voltage that may be applied when the static electricity builds up. Furthermore, the second gate electrode is indirectly connected to the static dissipating line-side connecting portion via the second shorting line. In the stage prior to the formation of the second metal film, static electricity may be transferred to the static dissipating portion. According the above configuration, in comparison to a configuration in which the second gate electrode is directly connected to the static dissipating line-side connecting portion, malfunctions of the semiconductor component and the second semiconductor component due to the static electricity are less likely to occur.

(6) The semiconductor device may include two second electrodes, a second semiconductor component, a first shorting line, and a second shorting line. The second electrodes may be formed from the second metal film. The second semiconductor component may be formed from the semiconductor film. The second semiconductor component may include at least a second protection portion and a second semiconductor portion. The second protection portion may be formed from the protection film. The second protection portion may include two second semiconductor component-side holes that are through holes formed at positions overlapping the second electrodes. The second semiconductor portion may be formed from the semiconductor film and connected to the second electrodes via the second semiconductor component-side holes. The second semiconductor portion may be arranged along a plate surface of the substrate and relative to the semiconductor component in a second direction that is perpendicular to a first direction in which the second electrodes are arranged. The first shorting line may be formed from the second metal film. The first shorting line may continue to the semiconductor component-side connecting portion. The first shorting line may short one of the electrodes to one of the second electrodes. The second shorting line may short the other one of the electrodes to the other one of the second electrodes. Multiple sets of the semiconductor component, the second semiconductor component, the contact portion, the signal line, the static protection portion, the first shorting line, and the second shorting line may be arranged along the second direction. The second shorting line may be connected to the first shorting line in an adjacent set with respect to the second direction. Regarding the semiconductor component and the second semiconductor component, one of the electrodes may be shorted to one of the second electrodes by the first shorting line. The other one of the electrodes may be shorted to the other one of the second electrodes by the second shorting line. The first shorting line may continue to the semiconductor component-side connecting portion that is connected to the signal line. The second shorting line may be shorted to the first shorting line in the set adjacent thereto with respect to the second direction. If static electricity is applied to the signal line, the static electricity is transferred to the second shorting line and the signal line in the adjacent set connected via the first shorting line in the adjacent set. Therefore, malfunctions due to the static electricity are less likely to occur. Furthermore, the second shorting line is not connected to the static dissipating line-side connecting portion. In the stage prior to the formation of the second metal film, static electricity may be transferred to the static dissipating portion. In comparison to a configuration in which the second shorting line is connected to the static dissipating line-side connecting portion, malfunctions of the semiconductor component and the second semiconductor component due to the static electricity are less likely to occur.

(7) The semiconductor device may include second static dissipating portions formed at a portion of the signal line-side connecting portion in the contact portion and a portion of the static dissipating line. The portions are opposite to each other. The second static dissipating portions project toward each other. Even if static electricity builds up in the semiconductor component or the contact portion in the stage prior to the formation of the second metal film, the static electricity is transferred to the second dissipating portion in a path toward the other. Therefore, the malfunctions of the semiconductor component and the contact portion due to the static electricity are further less likely to occur.

(8) The second static dissipating portion formed at the static dissipating line may be arranged adjacent to the static dissipating portion. According to the configuration in which the second static dissipating portion formed at the static dissipating line is arranged adjacent to the static dissipating portion, in comparison to a configuration in which they are not adjacently arranged, that is, separated from each other, the static electricity that builds up in the stage prior to the formation of the second metal film is properly dissipated by one of the static dissipating portion and the second static dissipating portion.

(9) The static protection portion may include static dissipating holes each having the same configuration as that of the static dissipating hole. The static dissipating holes may be arranged across the second static dissipating portion along a plate surface of the substrate and a direction perpendicular to a direction in which the two second static dissipating portions are arranged. According to the configuration in which static dissipating holes are arranged across the second static dissipating portion along a plate surface of the substrate and a direction perpendicular to a direction in which the two second static dissipating portions are arranged, the static electricity that builds up in the stage prior to the formation of the second metal film is further properly dissipated to the static dissipating portion or the second static dissipating portion.

(10) The static protection portion may include a static dissipating portion connecting portion formed from the second metal film. The static dissipating portion may be arranged so as to overlap the static dissipating portion in a plan view and connected to the static dissipating portion via the static dissipating hole. The static dissipating portion connecting portion is connected to the static dissipating portion, which is formed from the semiconductor film, via the static dissipating hole. This connecting configuration is similar to the connecting configuration of the semiconductor component in which the electrode is connected to the semiconductor portion, which is formed from the semiconductor film, via the semiconductor component-side hole. Without the static dissipating portion connecting portion, the static dissipating portion, which is formed from the semiconductor film, is subject to etching during the formation of the second metal film in the fabrication process of the semiconductor device. In comparison to the configuration, such a problem is less likely to occur.

A second semiconductor device according to the present invention includes a substrate, a first metal film, an insulation film, a semiconductor film, a protection film, a second metal film, two electrodes, a semiconductor component, a signal line, a signal line-side connecting portion, a contact portion, and a static protection portion. The first metal film is formed on the substrate. The insulation film is formed at least on the first metal film. The semiconductor film is formed on the insulation film. The protection film is formed at least on the semiconductor film. The protection film protects the semiconductor film. The second metal film is formed on the protection film. The electrodes are formed from the second metal film. The semiconductor component includes at least a protection portion and a semiconductor portion. The protection portion is formed from the protection film. The protection portion includes two semiconductor component-side holes that are through holes formed at positions overlapping the electrodes. The semiconductor portion is formed from the semiconductor film and connected to the two electrodes via the semiconductor component-side holes. The signal line is formed from the first metal film. The signal line-side connecting portion is formed from the first metal film at an end of the signal line. The contact portion includes at least an insulator and a semiconductor component-side connecting portion. The insulator is formed from the protection film and the insulation film. The insulator includes a contact portion-side hole that is a through hole formed at a position overlapping the signal line-side connecting portion. The semiconductor component-side connecting portion continues from one of the electrodes of the semiconductor component. The semiconductor component-side connecting portion is connected to the signal line-side connecting portion via the contact portion-side hole. The static protection portion includes at least a static dissipating portion and a static dissipating portion protection portion. The static dissipating portion is formed from the first metal film and arranged between the semiconductor component and the contact portion in a plan view. The static dissipating portion is for dissipating static electricity that builds up in one of the semiconductor component and the contact portion in a stage prior to formation of the second metal film. The static dissipating portion protection portion is formed from the protection film and the insulation film. The static dissipating portion protection portion includes a static dissipating hole that is a through hole formed at a position overlapping the static dissipating portion in a plan view.

The signal line-side connecting portion that is formed as the end of the signal line that is formed from the first metal film is connected to the semiconductor component-side connecting portion via the contact portion-side hole in the contact portion. The semiconductor component-side connecting portion is formed from the second metal film and continues from one of the electrodes of the semiconductor component. The contact portion-side hole is a through hole in the insulator. According to this configuration, signals from the semiconductor component are supplied to the signal line. In the stage prior to the formation of the second metal film in the fabrication process of the semiconductor device, the semiconductor component-side hole that is a through hole in the protection film is formed in the semiconductor component. In the contact portion, the contact portion-side hole that is a through hole in the insulator formed form the protection film and the insulation film is formed. The semiconductor component formed from the semiconductor film and the signal line-side connecting portion formed from the first metal film are exposed through the semiconductor component-side hole and the contact portion-side hole, respectively. If static electricity builds up in the semiconductor component or the contact portion under this condition, the static electricity may be applied to the other semiconductor component or the signal line-side connecting portion. This may cause a malfunction of the semiconductor component or the contact portion.

The semiconductor device includes the static protection portion that includes at least the static dissipating portion and the static dissipating portion protection portion. The static dissipating portion is formed from the first metal film and arranged between the semiconductor component and the contact portion in a plan view. The static dissipating portion protection portion is formed from the protection film and the insulation film. The static dissipating portion protection portion includes the static dissipating hole that is a through hole formed at the position overlapping the static dissipating portion in a plan view. In the stage prior to the formation of the second metal film in the fabrication process of the semiconductor device, the static dissipating portion is exposed through the static dissipating hole that is a through hole in the static dissipating portion protection portion. According to this configuration, even if static electricity builds up in the semiconductor component or the contact portion in the stage prior to the formation of the second metal film, the static electricity is transferred to the static dissipating portion via the static dissipating hole that is present in the path toward the other. Therefore, a malfunction of the semiconductor component or the contact portion due to the static electricity is less likely to occur.

Furthermore, the static dissipating portion is formed from the first metal film that also forms the signal line-side connecting portion in the contact portion. If static electricity builds up in the semiconductor portion of the semiconductor component, the static is effectively dissipated. According to this configuration, the application of the static to the signal line-side connecting portion is further properly restricted.

Next, to resolve the problem described earlier, a display device according to the present invention includes the semiconductor device that is described above, a counter substrate, a liquid crystal layer, and a switching component. The counter substrate is arranged opposite the semiconductor device. The liquid crystal layer is arranged between the semiconductor device and the counter substrate. The switching component is included in the semiconductor device and connected to at least the semiconductor component.

According to the display device, malfunctions of the semiconductor device due to static electricity are less likely to occur. Namely, the display device has high operation reliability.

Advantageous Effect of the Invention

According to the present invention, malfunctions due to static electricity are less likely to occur.

MODE FOR CARRYING OUT THE INVENTION

<First Embodiment>

Figure 1:
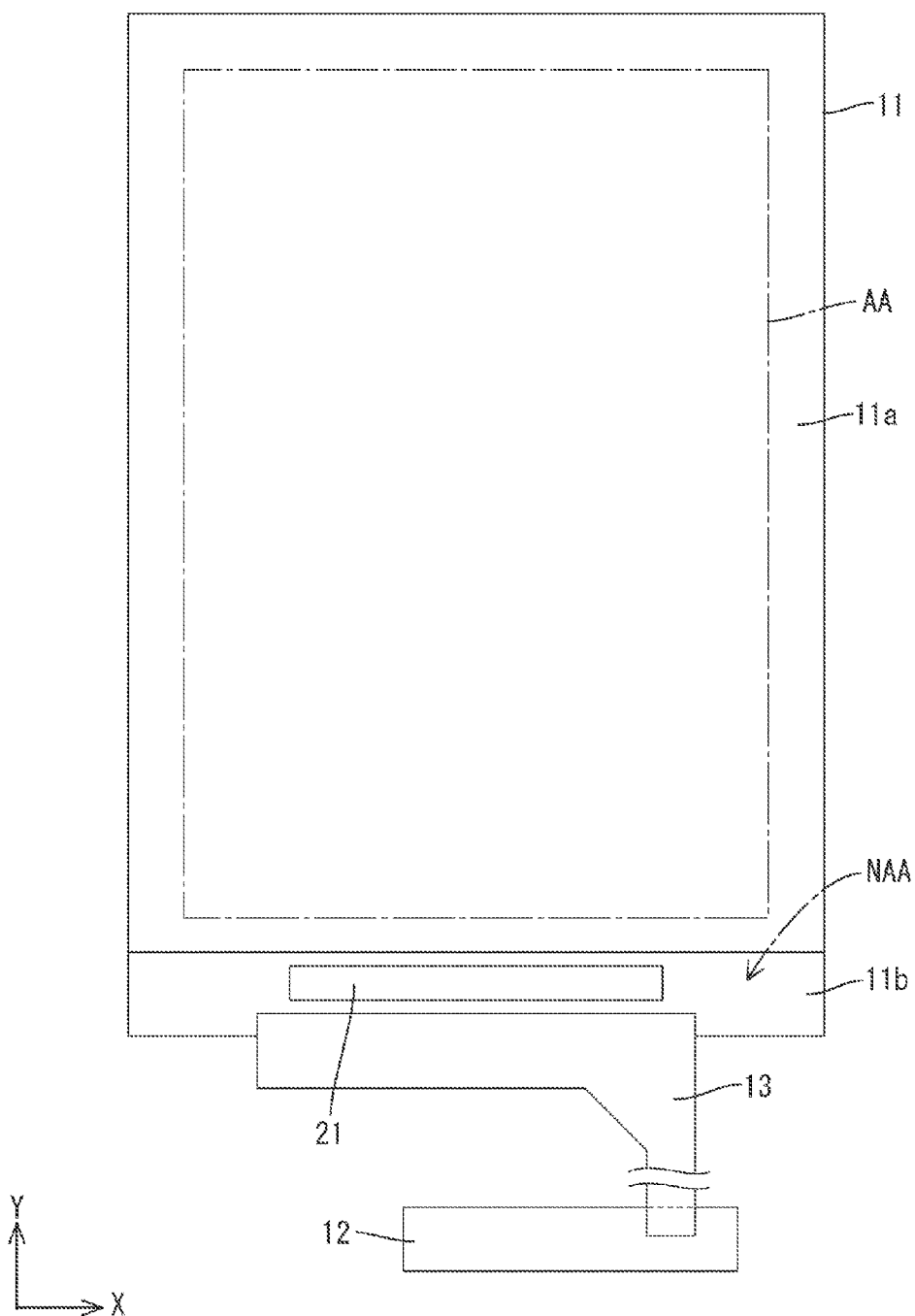
FIG. 1 is a schematic plan view of a liquid crystal panel on which a driver is mounted, a flexible printed circuit board, and a control circuit board according to a first embodiment of the present invention illustrating connection among those.

A first embodiment will be described with reference to FIGS. 1 to 18. A liquid crystal display device 10 according to this embodiment will be described. X-axis, Y-axis and Z-axis may be indicated in the drawings. The axes in each drawing correspond to the respective axes in other drawings. The vertical direction is defined based on FIG. 2. An upper side and a lower side in FIG. 2 correspond to a front side and a back side of the liquid crystal display device 10, respectively.

Figure 2:
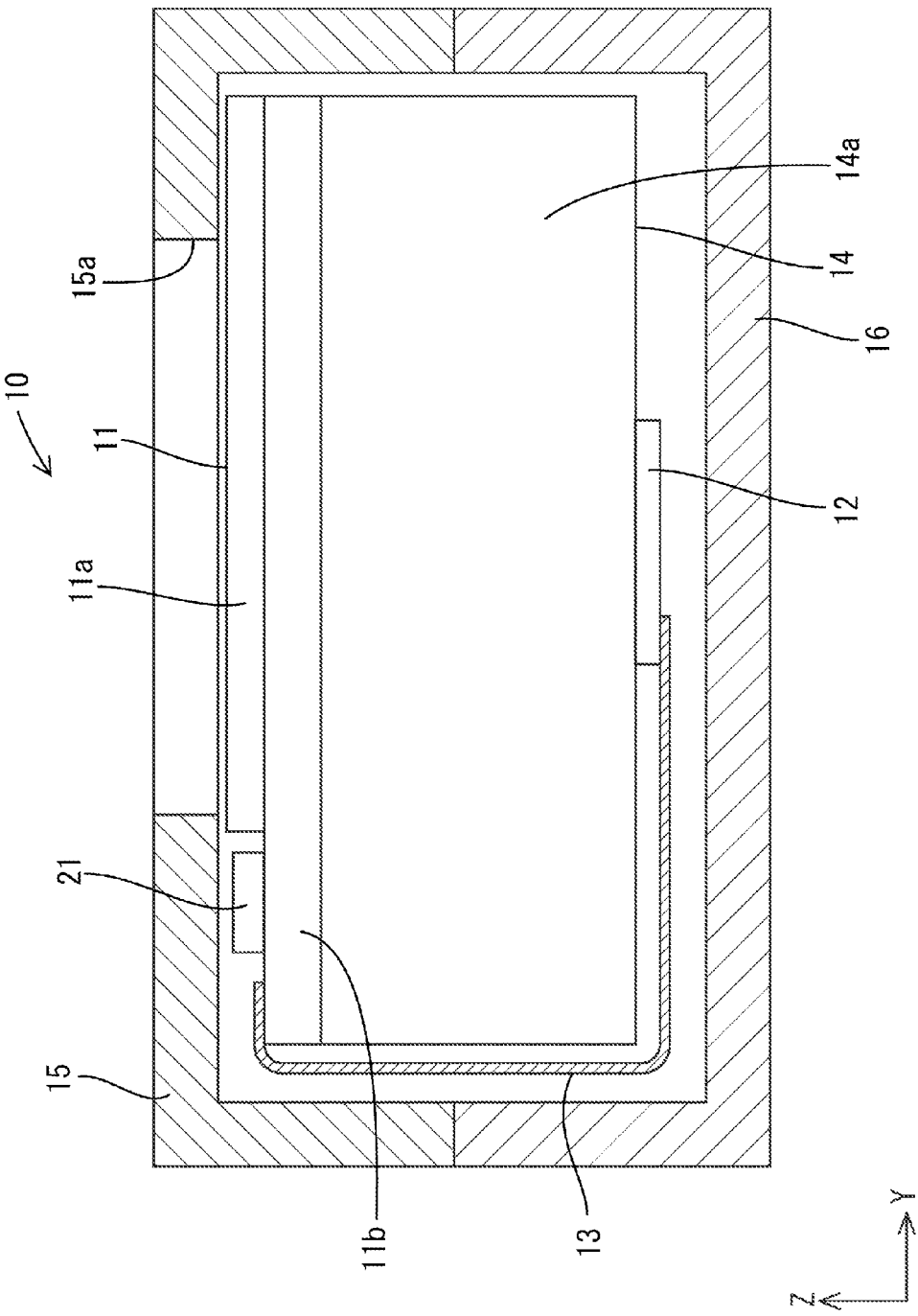
FIG. 2 is a schematic cross-sectional view of a liquid crystal display device illustrating a cross-sectional configuration along a long-side direction thereof.

As illustrated in FIGS. 1 and 2, the liquid crystal display device 10 includes a liquid crystal panel (a display device) 11, a driver (a panel driver) 21, a control circuit board (an external signal source) 12, a flexible printed circuit board (an external connector) 13, and a backlight unit (a backlight device) 14. The liquid crystal panel 11 includes a display area AA in which images are displayed and a non-display area NAA outside the display area AA. The driver 21 is configured to drive the liquid crystal panel 11. The control circuit board 12 is configured to supply various input signals to the driver 21 from the outside. The flexible printed circuit board 13 electrically connects the liquid crystal panel 11 to the control circuit board 12 outside the liquid crystal panel 11. The backlight unit 14 is an external light source for supplying light to the liquid crystal panel 11. The liquid crystal display device 10 further includes a pair of exterior components 15 and 16 that are front and rear components used in a pair to hold the liquid crystal panel 11 and the backlight unit 14 that are attached together. The exterior component 15 on the front has an opening 15a through which images displayed in the display area AA of the liquid crystal panel 11 are viewed from the outside. The liquid crystal display device 10 according to this embodiment may be used in various kinds of electronic devices (not illustrated) such as handheld terminals (including electronic books and PDAs), mobile phones (including smartphones), notebook computers (including tablet computers), digital photo frames, portable video game players, and electronic-ink papers. The liquid crystal panel 11 in the liquid crystal display device 10 is in a range between some inches to ten and some inches. Namely, the liquid crystal panel 11 is in a size that is classified as a small or a small-to-medium.

The backlight unit 14 will be described. As illustrated in FIG. 2, the backlight unit 14 includes a chassis 14a, light sources (e.g., cold cathode fluorescent tubes, LEDs, organic ELs), and an optical member. The chassis 14a has a box-like shape with an opening on the front (on a liquid crystal panel 11 side). The light sources, which are not illustrated, are disposed inside the chassis 14a. The optical member, which is not illustrated, is arranged so as to cover the opening of the chassis 14a. The optical member has a function to convert light from the light sources into planar light.

Next, the liquid crystal panel 11 will be described. As illustrated in FIG. 1, the liquid crystal panel 11 has a vertically-long rectangular overall shape. The liquid crystal panel 11 includes a display area (an active area) AA that is off centered toward one of ends of a long dimension thereof (the upper side in FIG. 1). The driver 21 and the flexible printed circuit board 13 are arranged at the other end of the long dimension of the liquid crystal panel 11 (the lower side in FIG. 1). An area of the liquid crystal panel 11 outside the display area AA is a non-display area (non-active area) NAA in which images are not displayed. The non-display area NAA includes a frame-shaped area around the display area AA (a frame portion of a CF board 11a, which will be described later) and an area provided at the other end of the long dimension of the liquid crystal panel 11 (an exposed area of an array board 11b which does not overlap the CF board 11a, which will be described later). The area provided at the other end of the long dimension of the liquid crystal panel 11 includes amounting area (an attachment area) in which the driver 21 and the flexible printed circuit board 13 are mounted. A short-side direction and a long-side direction of the liquid crystal panel 11 correspond to the X-axis direction and the Y-axis direction in each drawing. In FIG. 1, a chain line box slightly smaller than the CF board 11a indicates a boundary of the display area AA. An area outside the solid line is the non-display area NAA.

Next, the components connected to the liquid crystal panel 11 will be described. As illustrated in FIGS. 1 and 2, the control circuit board 12 is mounted to the back surface of the chassis 14a (an outer surface on a side opposite from the liquid crystal panel 11) of the backlight unit 14 with screws. The control circuit board 12 includes a substrate made of paper phenol or glass epoxy resin and electronic components mounted on the substrate and configured to supply various input signals to the driver 21. Traces (electrically conductive paths) which are not illustrated are formed in predetermined patterns. An end of the flexible printed circuit board 13 is electrically and mechanically connected to the control circuit board 12 via an anisotropic conductive film (ACF), which is not illustrated.

The flexible printed circuit board (an FPC board) 13 includes a base member made of synthetic resin having insulating property and flexibility (e.g., polyimide resin). A number of traces are formed on the base member (not illustrated). As illustrated in FIG. 2, the end of the long dimension of the flexible printed circuit board 13 is connected to the control circuit board 12 disposed on the back surface of the chassis 14a as described above. The other end of the long dimension of the flexible printed circuit board 13 is connected to the array board 11b in the liquid crystal panel 11. The flexible printed circuit board 13 is bent or folded back inside the liquid crystal display device 10 such that a cross-sectional shape thereof forms a U-like shape. At the ends of the long dimension of the flexible printed circuit board 13, portions of the traces are exposed to the outside and configured as terminals (not illustrated). The terminals are electrically connected to the control circuit board 12 and the liquid crystal panel 11. With this configuration, input singles supplied by the control circuit board 12 are transmitted to the liquid crystal panel 11.

As illustrated in FIG. 1, the driver 21 is on an LSI chip including drive circuits. The driver 21 is configured to operate according to signals supplied by the control circuit board 12, which is a signal source, to process the input signal supplied by the control circuit board 12, to generate output signals, and to output the output signals to the display area AA in the liquid crystal panel 11. The driver 21 has a vertically-long rectangular shape (an elongated shape that extends along the short side of the liquid crystal panel 11) in a plan view. The driver 21 is directly connected to the non-display area NAA of the liquid crystal panel 11 (or the array board 11b, which will be described later), that is, mounted by the chip-on-glass (COG) mounting method. A long-side direction and a short-side direction of the driver 21 correspond to the X-axis direction (the short-side direction of the liquid crystal panel 11) and the Y-axis direction (the long-side direction of the liquid crystal panel 11), respectively.

Figure 3:
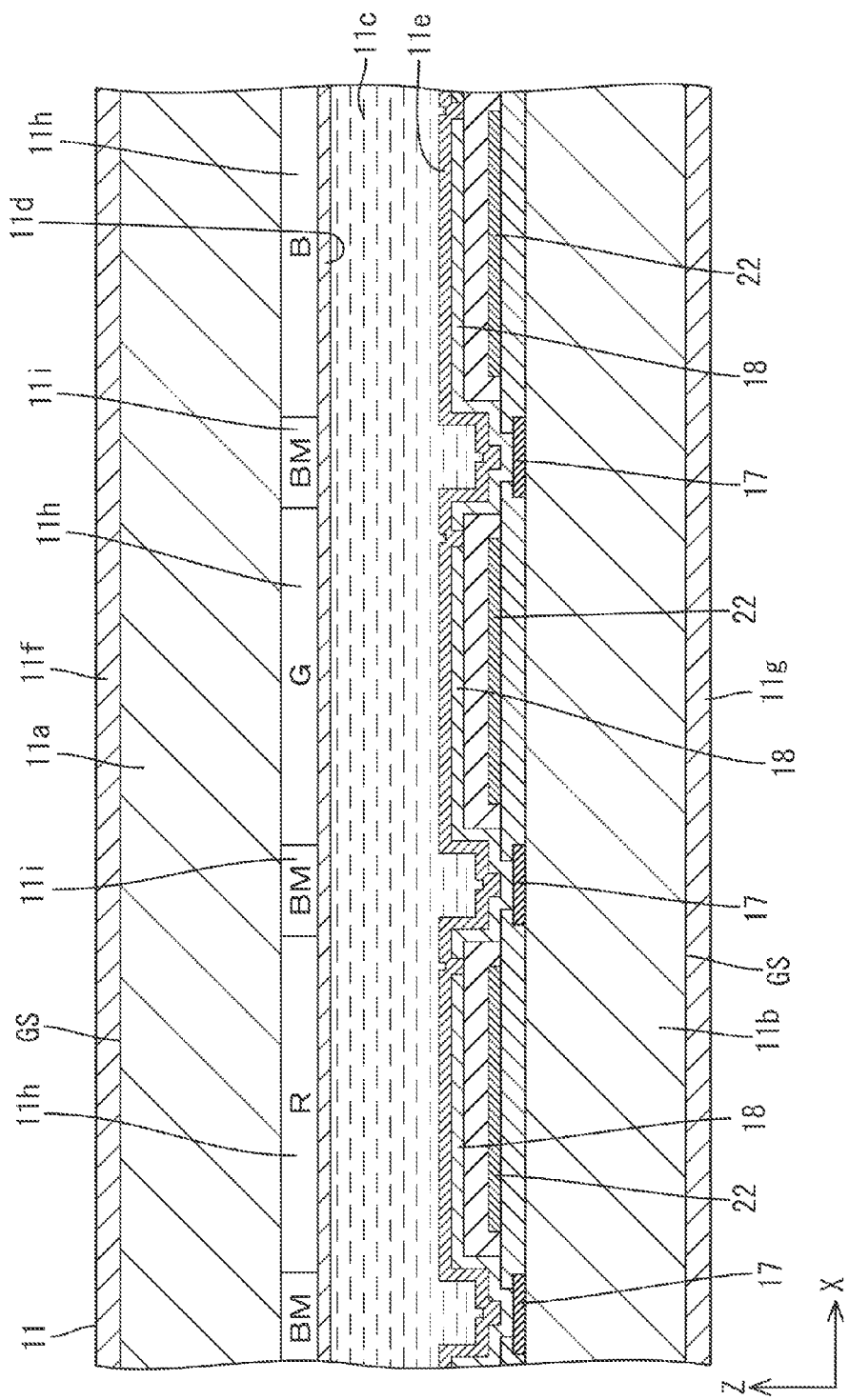
FIG. 3 is a schematic cross-sectional view illustrating a cross-sectional configuration of the liquid crystal panel.

The liquid crystal panel 11 will be described in more detail. As illustrated in FIG. 3, the liquid crystal panel 11 includes a pair of substrates 11a and 11b and a liquid crystal layer 11c between the substrates 11a and 11b. The liquid crystal layer 11c includes liquid crystal molecules having optical characteristics that vary according to application of electric field. The substrates 11a and 11b are bonded together with a sealing agent, which is not illustrated, with a gap therebetween. A size of the gap corresponds to the thickness of the liquid crystal layer 11c. The liquid crystal panel 11 in this embodiment operates in fringe field switching (FFS) mode that is a mode improved from an in-plane switching (IPS) mode. On one of the substrates 11a and 11b, specifically, on the array board 11b, pixel electrodes (second transparent electrodes) 18 and common electrodes (first transparent electrodes) 22, which will be described later, are formed. The pixel electrodes 18 and the common electrodes 22 are formed in different layers. One of the substrates 11a and 11b on the front is the CF board (a counter substrate) 11a and one on the rear (on the back) is the array board (a semiconductor device) 11b. The CF board 11a and the array board 11b include glass substrates GS that are substantially transparent (i.e., having high light transmissivity). Various films are formed in layers on each glass substrate GS. As illustrated in FIGS. 1 and 2, the CF board 11a has a short dimension substantially equal to that of the array board 11b and a long dimension smaller than that of the array board 11b. The CF board 11a is bonded to the array board 11b with one of ends of the long dimension (the upper end in FIG. 1) aligned with a corresponding edge of the array board 11b. A predetermined area of the other end of the long dimension of the array board 11b (the lower end in FIG. 1) does not overlap the CF board 11a and front and back plate surfaces in the area are exposed to the outside. The mounting area in which the driver 21 and the flexible printed circuit board 13 are mounted is provided in this area. Alignment films 11d and 11e are formed on inner surfaces of the substrates 11a and 11b, respectively, for alignment of the liquid crystal molecules included in the liquid crystal layer 11c. Polarizing plates 11f and 11g are attached to outer surfaces of the substrates 11a and 11b, respectively.

Figure 4:
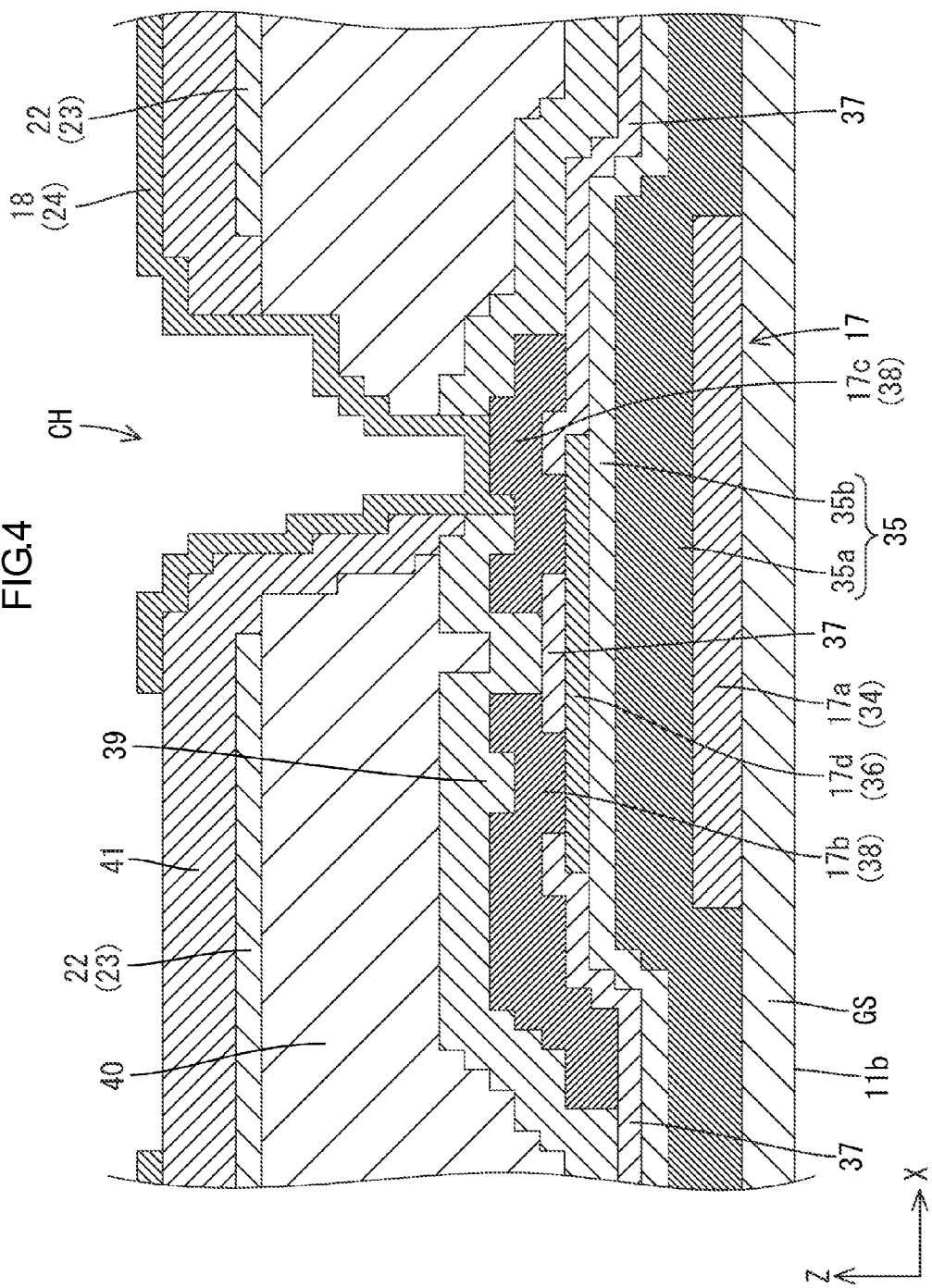
FIG. 4 is a cross-sectional view of a TFT in a display area of an array board illustrating a cross-sectional configuration thereof.

The films formed in layers on the inner surface of the array board 11b (on the liquid crystal layer 11c side, a surface opposite the CF board 11a) by a known photolithography method will be described. As illustrated in FIG. 4, on the array board 11b, the following films are formed in the following sequence from the lowest layer (the grass substrate GS): a first metal film (a gate metal film) 34, a gate insulator (an insulation film) 35, a semiconductor film 36, a protection film 37, a second metal film (a source metal film) 38, a first interlayer insulation film 39, an organic insulation film 40, a first transparent electrode film 23, a second interlayer insulation film 41, and a second transparent electrode film 24.

The first metal film 34 is a multilayered film of titanium (Ti) and copper (Cu). The first metal film 34 forms gate lines 19 and gate electrodes 17a of TFTs 17, which will be described later, in the display area AA. The first metal film 34 forms a common line 25 and ends of the gate lines (gate line-side connecting portions 48), and portions of diodes 29 and 30 (gate electrodes 29e and 30e) in a static protection circuit portion 26, which will be described later, in the non-display area NAA. The gate insulator 35 is a multilayered film that includes a lower gate insulator 35a that contains silicon nitride ($SiN_x$) and an upper gate insulator 35b that contains of silicon oxide ($SiO_2$). The semiconductor film 36 is an oxide thin film that is a kind of oxide semiconductors containing indium (In), gallium (Ga), and zinc (Zn). The oxide semiconductor that contains indium (In), gallium (Ga), and zinc (Zn), that is, the semiconductor film 36 may be amorphous or crystalline. In the display area AA, the semiconductor film 36 forms a channel 17d of each TFT 17, which will be described later. In the non-display area NAA, the semiconductor film 36 forms portions of the diodes 29 and 30 in the static protection circuit portion 26 (semiconductors 29d and 30d), which will be described later. The protection film 37 contains silicon oxide ($SiO_2$).

The second metal film 38 is a layered film that contains titanium (Ti) and copper (Cu). The second metal film 38 forms source lines 20 and source electrodes 17b and drain electrodes 17c of the TFTs 17, which will be described later, in the display area AA. The second metal film 38 forms a first shorting line 31, a second shorting line 33, and portions of the diodes 29 and 30 (electrodes 29a, 30a, 29b and 30b) in the static protection circuit portion 26, which will be described later, in the non-display area NAA. The first interlayer insulation film 39 contains silicon oxide ($SiO_2$). The organic insulation film 40 contains acrylic resin (e.g., polymethyl methacrylate (PMMA) and polyimide resin), which is an organic material. The first transparent electrode film 23 and the second transparent electrode film 24 are made of transparent electrode material such as indium tin oxide (ITO) and zinc oxide (ZnO). The second interlayer insulation film 41 contains silicon nitride (SiNx). The first transparent electrode film 23 and the second transparent electrode film 24 among the films are formed only in the display area AA of the array board 11b, that is, are not formed in the non-display area NAA. The insulation films made of insulating materials including the gate insulator 35, the protection film 37, the first interlayer insulation film 39, the organic insulation film 40, and the second interlayer insulation film 41 are formed in solid patterns arranged in a whole area of the surface of the array board 11b. The first metal film 34, the semiconductor film 36, and the second metal film 38 are formed in predetermined patterns in the display area AA and the non-display area NAA of the array board 11b.

Next, configurations of components in the display area AA of the array board 11b will be described in sequence. As illustrated in FIG. 3, in the display area AA of the array board 11b, the thin film transistors (TFTs) 17, which are switching components, and pixel electrodes 18 are disposed in a matrix. Furthermore, gate lines (signal lines, row control lines, scanning lines) 19 and source lines (column control lines, data lines) 20 are routed in a matrix such that each pair of the TFT 17 and the pixel electrode 18 is in a cell defined by the gate lines 19 and the source lines 20. Namely, the TFTs 17 and the pixel electrodes 18 are arranged in a matrix at respective corners defined by the gate lines 19 and the source lines 20 that are formed in a matrix. The first metal film 34 forms the gate lines 19 and the second metal film 38 forms the source lines 20. The gate insulator 35 and the protection film 37 are arranged between the gate line 19 and the source line 20 at an intersection thereof. As illustrated in FIG. 4, the gate lines 19 and the source lines 20 are connected to first gate electrodes 17a and first source electrodes 17b of the respective TFTs 17, respectively. The pixel electrodes 18 are connected to first drain electrodes 17c of the respective TFTs 17. Each TFT 17 includes a first channel 17d that is formed from the semiconductor film 36. The first channel 17d bridges the first source electrode 17b and the first drain electrode 17c so that electrons move between the source electrode 17b and the drain electrode 17c. The semiconductor film 36 that forms the first channel 17d is an oxide thin film that contains indium (In), gallium (Ga), and zinc (Zn). The oxide thin film that contains indium (In), gallium (Ga), and zinc (Zn) has electron mobility higher than that of an amorphous silicon film, for example, 20 to 50 times higher. Therefore, the TFTs 17 can be easily downsized and an amount of transmitted light through each pixel electrode 18 can be increased to a maximum level. This configuration is preferable for enhancement of image resolution and reduction of power consumption. Each TFT 17 including such an oxide thin film that contains indium (In), gallium (Ga), and zinc (Zn) is an inverted-staggered type having a configuration in which the first gate electrode 17a is arranged at the bottom and the first channel 17d is arranged thereon via the gate insulator 35. A stacking structure of the TFT 17 is similar to that of a TFT including a common amorphous silicon thin film. Because the oxide thin film that contains indium (In), gallium (Ga), and zinc (Zn) is an oxide, it is subject to oxidation or reduction. Furthermore, the oxide thin film is subject to etching during etching in formation of the source electrodes 17b and the drain electrodes 17c. Each TFT 17 in this embodiment includes the protection film 37 arranged between the channel 17d and the source electrode 17b and between the channel 17d and the drain electrode 17c. The channel 17d is formed from the semiconductor film 36 (an oxide thin film that contains indium (In), gallium (Ga), and zinc (Zn)). The protection film 37 is made of silicon oxide ($SiO_2$). According to this configuration, oxidation or reduction of the channel 17d is less likely to occur and thus the electrical characteristics are less likely to change. Furthermore, the channel 17d is less likely to be etched during the formation of the source electrode 17b and the drain electrode 17c. The protection film 37 includes holes at positions overlapping the source electrode 17b and the drain electrode 17c in a plan view. The source electrode 17b and the drain electrode 17c are connected to the channel 17d via the holes.

The pixel electrode 18 has a vertically-long rectangular overall shape in a plan view and arranged in an area defined by the gate lines 19 and the source lines 20. The pixel electrode 18 includes a comb-shaped portion with longitudinal slits 18a. As illustrated in FIG. 4, the pixel electrode 18 is formed on the second interlayer insulation film 41. The second interlayer insulation film 41 is between the pixel electrode 18 and a common electrode 22, which will be described later. The pixel electrode 18 is connected to the first drain electrode 17c of the TFT 17 via contact holes CH formed in the first interlayer insulation film 39, the organic insulation film 40, and the second interlayer insulation film 41. When the TFT 17 is driven, a predetermined potential is applied to the pixel electrode 18. The common electrode 22 is a solid trace formed in a substantially whole area of the display area AA of the array board 11b. The common electrode 22 is formed on the organic insulation film 40. A common potential (a reference potential) is applied to the common electrode 22 through a common line (a static dissipating line), which will be described later. By controlling the potential applied to the pixel electrode by the TFT 17 as described above, a predetermined potential difference occurs between the electrodes 18 and 22. When a potential difference appears between the electrodes 18 and 22, a fringe field (an oblique field) including a component in a direction normal to a plate surface of the array board 11b is applied to the liquid crystal layer 11c in addition to a component in a direction along the plate surface of the array board 11b because of the slits 18a of the pixel electrode 18. Therefore, not only alignment of the liquid crystal molecules in the slits 18a in the liquid crystal layer 11c but also alignment of the liquid crystal molecules on the pixel electrode 18 is properly switchable. With this configuration, the aperture ratio of a liquid crystal panel 11 improves and a sufficient amount of transmitted light is achieved. Furthermore, high view-angle performance is achieved. Capacitor lines may be provided (not illustrated). The capacitor lines may extend parallel to the gate lines 19, and may cross and overlap the gate lines 19 via the pixel electrodes 18, and overlap the gate insulator 35, the protection film 37, the first interlayer insulation film 39, the organic insulation film 40, and the second insulation film 41.

Next, configurations of components in the display area AA of the CF board 11a will be described in detail. As illustrated in FIG. 3, the CF board 11a includes color filters 11h including red (R), green (G), and blue (B) color portions arranged in a matrix so as to overlap the pixel electrodes 18 on the array board 11b in a plan view. A light blocking layer (a black matrix) 11i is formed in a grid to restrict colors from mixing. Each line of the grid is located between the adjacent color portions of the color filters 11h. The light blocking layer 11i is arranged over the gate lines 19 and the source lines 20 in a plan view. An alignment film 11d is formed on the surfaces of the color filters 11h and the light blocking layer 11i. Each display pixel of the liquid crystal panel 11 includes three color portions, that is, R, G and B color portions and three pixel electrodes 18 opposite the color portions, respectively. The display pixel includes a red pixel including the R color portion, a green pixel including the G color portion, and a blue pixel including the B color portion. The pixels are arranged on the plate surface of the liquid crystal panel 11 in repeated sequence along the row direction (the X-axis direction) and form groups of pixels. The groups of pixels are arranged along the column direction (the Y-axis direction).

Figure 5:
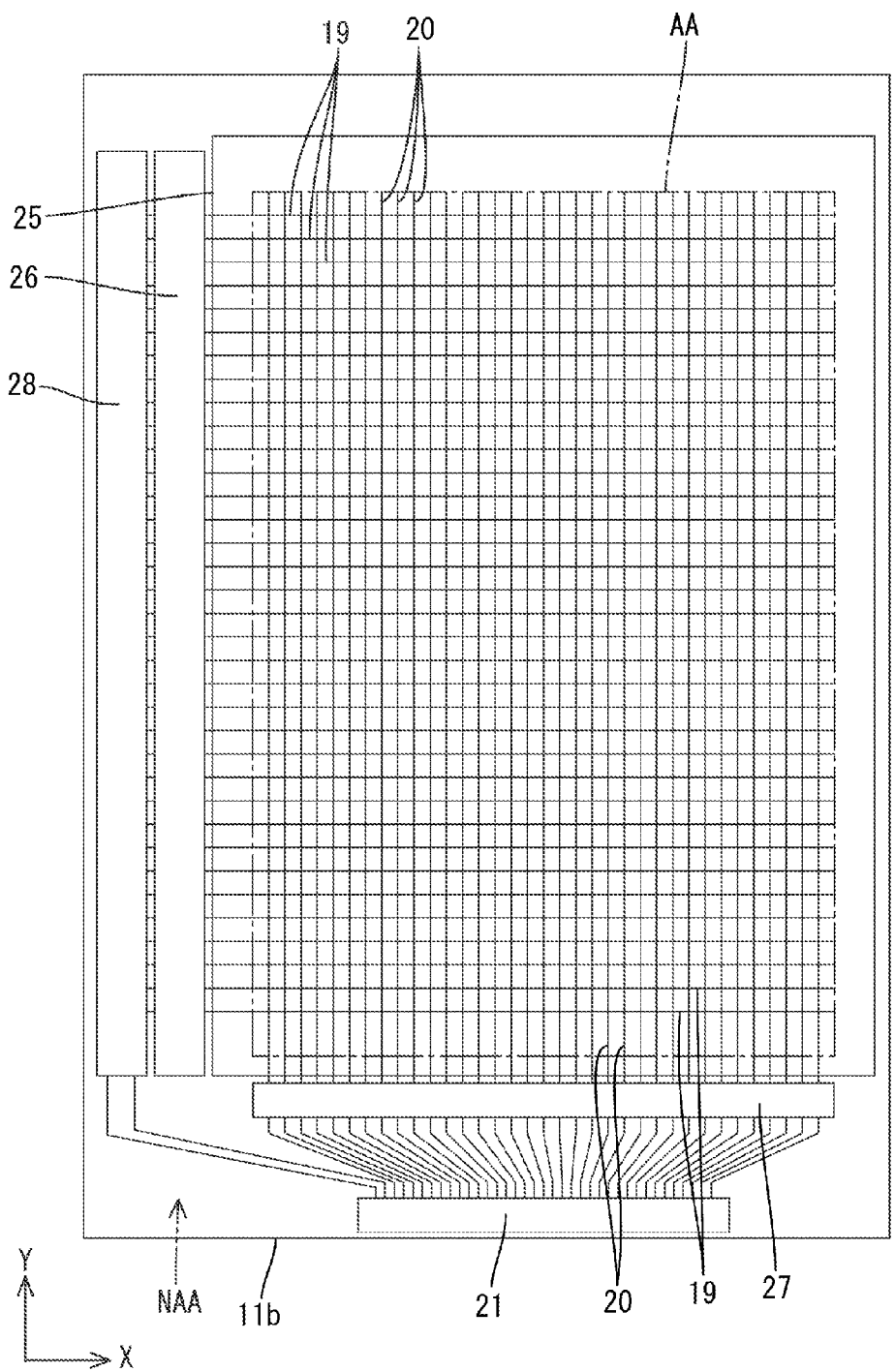
FIG. 5 is a plan view schematically illustrating a wiring layout of the array board included in the liquid crystal panel.

Next, configurations of components in the non-display area NAA of the array board 11b will be described in detail. As illustrated in FIG. 5, the common line 25 is routed around the display area AA (or formed in a frame-like shape or a ring shape). The common line 25 is connected to the common electrode 22 via a contact portion, which is not illustrated. With this configuration, a common potential is applied to the common electrode 22 by the driver 21. The column control circuit 27 is arranged in an area of the non-display area NAA of the array board 11b adjacent to the short edge of the display area AA. The static protection circuit portion 26 and the row control circuit 28 are arranged in an area of the non-display area NAA adjacent to the long edge of the display area AA. The column control circuit 27 and the row control circuit 28 are configured to control for supplying the output signals from the driver 21 to the TFTs 17. The static protection circuit portion 26 is configured to protect the TFTs 17 in the display area AA from electrostatic breakdown. Each of the static protection circuit portion 26, the column control circuit 27, and the row control circuit 28 is a monolithic circuit formed on an array board 11b with an oxide film (the semiconductor film 36) containing indium (In), gallium (Ga), and zinc (Zn) as a base, which is similar to each TFT 17. The static protection circuit portion 26, the column control circuit 27, and the row control circuit 28 include control circuits for controlling supply of the output signals to the TFTs 17 and static control circuits (diodes 29, 30, which will be described later). The common line 25, the static protection circuit portion 26, the column control circuit 27, and the row control circuit 28 are formed on the array board 11b by patterning using a known photolithography method at the same time when the TFTs 17 are formed by patterning in a fabrication process of the array board 11b.

As illustrated in FIG. 5, the column control circuit 27 is arranged adjacent to the short edge of the display area AA on the lower side in FIG. 5. Namely, the column control circuit 27 is arranged between the display area AA and the driver 21 with respect to the Y-axis direction and in a horizontally-long rectangular area that is elongated in the X-axis direction. The column control circuit 27 is connected to the source lines 20 in the display area AA. The column control circuit 27 includes switching circuit (RGB switching circuit) configured to sort image signals in the output signals from the driver 21 to the respective source lines 20. The source lines 20 are arranged in the display area AA of the array board 11b along the X-axis direction and parallel to each other. The source lines 20 are connected to the TFTs 17 that form R (red), G (green) and B (blue) pixels, respectively. The column control circuit 27 sorts the image signals from the driver 21 using the switching circuit and supplies the sorted signals to the respective R, G, B source lines 20. The column control circuit 27 may include ancillary circuits such as a level-shifter circuit.

As illustrated in FIG. 5, the row control circuit 28 is arranged adjacent to the long edge of the display area AA on the left in FIG. 5 such that the static protection circuit portion 26 is sandwiched between the row control circuit 28 and the long edge of the display area AA. The row control circuit 28 is arranged in a vertically-long area that extends in the Y-axis direction. The row control circuit 28 is connected to the gate lines 19 in the display area AA. The row control circuit 28 includes a scanning circuit configured to supply scan signals included in the output signals from the driver 21 to the gate lines 19 at the predetermined timing to scan the gate lines 19 in sequence. The gate lines 19 are arranged in the display area AA of the array board 11*b* along the Y-axis direction and parallel to each other. The row control circuit 28 supplies control signals (the scan signals) from the driver 21 using the scanning circuit to the gate lines 19 in sequence from the one at the top in FIG. 5 to the one at the bottom to scan the gate lines 19. The row control circuit 28 may include ancillary circuits such as a level-shifter circuit and a buffer circuit. The column control circuit 27 and the row control circuit 28 are connected to the driver 21 via lines formed on the array board 11*b*.

Figure 6:
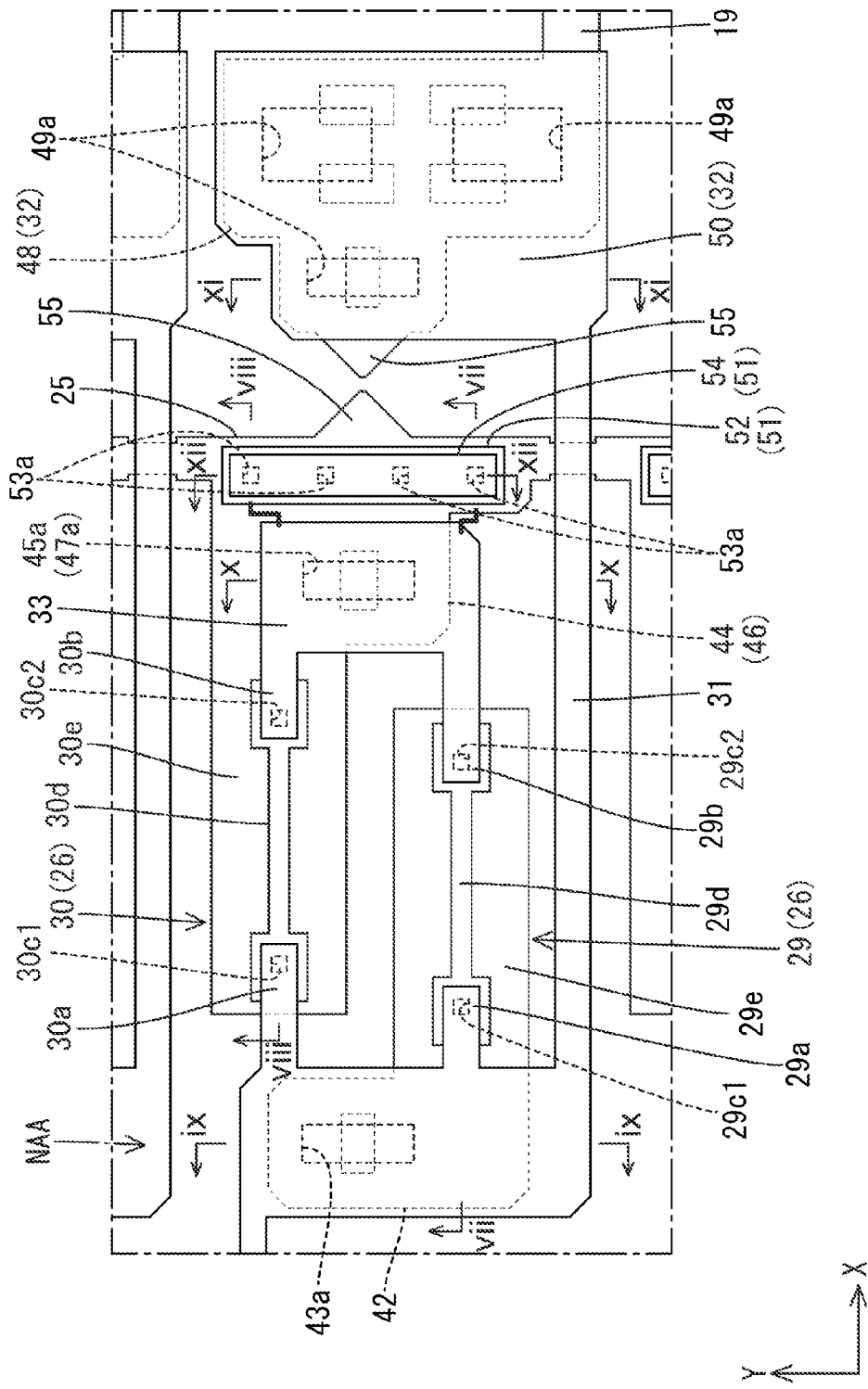
FIG. 6 is a plan view of the array board illustrating a static protection circuit portion, a common line, a static protection portion, and a contact portion.

As illustrated in FIG. 5, the static protection circuit portion 26 is arranged adjacent to the long edge of the display area AA on the left side in FIG. 5. The static protection circuit portion 26 is arranged in a vertically-long rectangular area that is elongated in the Y-axis direction similar to the row control circuit 28. The static protection circuit portion 26 is electrically connected to the gate lines 19, the common line 25, and the row control circuit 28. As illustrated in FIG. 6, the static protection circuit portion 26 includes two diodes 29, 30 for each gate line 19 as static protection circuits. The diodes 29, 30 are circularly arranged. An electrode 29*a* of the diode 29 and an electrode 30*a* of the diode 30 are connected to the corresponding gate line 19 and the row control circuit 28. The other electrode 29*b* of the diode 29 and the other electrode 30*b* of the diode 30 are connected to the common line 25. According to this configuration, an electrostatic charge (ESD) in the gate line 19 or the row control circuit 28 is dissipated to the common line 25 and thus the TFTs 17 in the display area AA are protected from the electrostatic damages. Pairs of the diodes 29, 30 that function as the static protection circuits are arranged along the Y-axis direction, which corresponds to an arrangement direction of the gate lines 19. The number of the pairs is equal to the number of the gate lines 19.

More specifically, in the static protection circuit portion 26, the electrodes 29*a*, 30*a* of a pair of diodes 29, 30 are shorted by a first shorting line 31 (a semiconductor component connecting line) as illustrated in FIG. 6. An end of the first shorting line 31 (on the left side in FIG. 6) is connected to the row control circuit 28, which is not illustrated in FIG. 6. The other end of the first shorting line 31 (on the right side in FIG. 6) is connected to the gate line 19. At a connecting point of the first shorting line 32 and the gate line 19, a contact portion 32 is present. The contact portion 32 is arranged closer to the display area AA, which is not illustrated in FIG. 6, (i.e., on a side opposite from the row control circuit 28) than the static protection circuit portion 26 and such that the common line 25 is between the static protection circuit portion 26 and the contact portion 32. In the static protection circuit portion 26, the other one of the electrodes 29*b*, 30 of a pair of diodes 29, 30 are shorted by a second shorting line 33. The second shorting line 33 is connected to the common line 25.

Next, detailed configurations of the static protection circuit portion 26, the shorting lines 31, 33, the contact portions 32, and the common line 25 will be described in sequence. As illustrated in FIG. 6, the static protection circuit portion 26 includes the same number of pairs of diodes 29, 30 as the number of the gate lines 19. Each diode 29 and the corresponding diode 30 are connected to each other to form a circular path. One of the diodes 29, 30 in one pair (the diode on the lower side in FIG. 6) is defined as a first diode (a semiconductor component) 29. The other one of the diodes 29, 30 in the pair (the diode on the upper side in FIG. 6) is defined as a second diode (a second semiconductor component) 30. An arrangement direction in which the first diode 29 and the second diode 30 are arranged is parallel to a plate surface of the glass substrate GS of the array board 11*b* and corresponds to the Y-axis direction (the arrangement direction of the gate lines 19, an extending direction in which the common line 25 extends).

Figure 7:
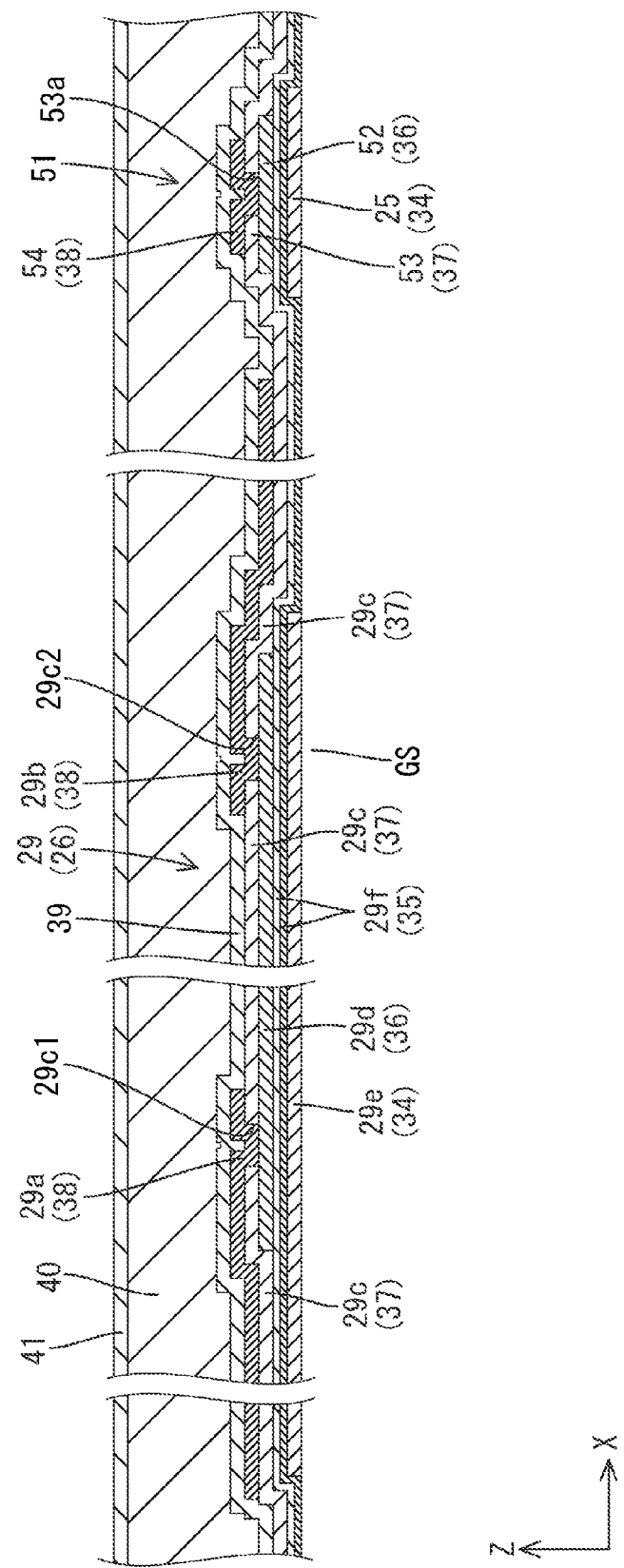
FIG. 7 is a cross-sectional view of FIG. 6 along line vii-vii.
Figure 9:
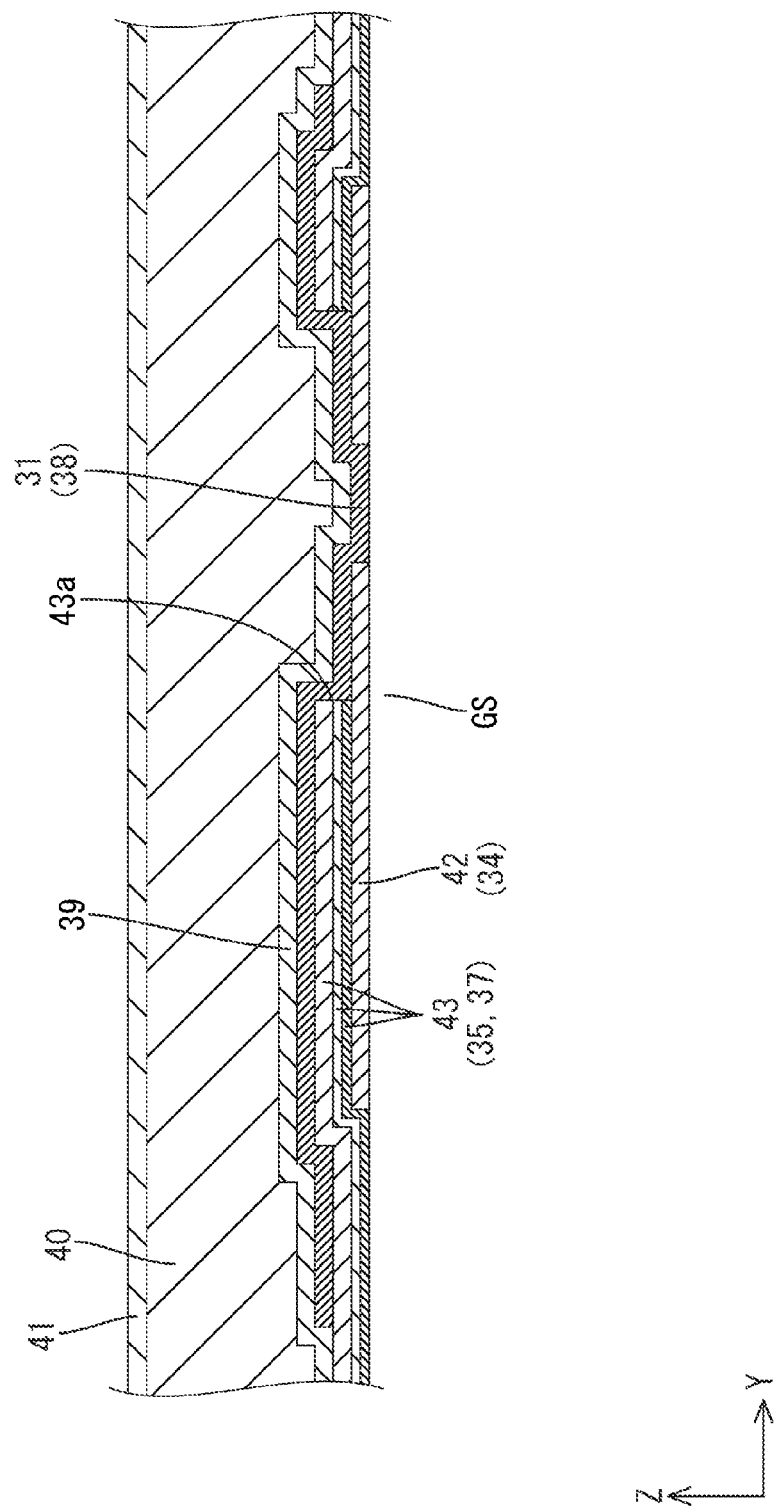
FIG. 9 is a cross-sectional view of FIG. 6 along line ix-ix.

As illustrated in FIG. 7, the first diode 29 includes two first electrodes 29*a*, 29*b*, a first protection portion (a protection portion) 29*c*, and a first semiconductor portion (a semiconductor portion) 29*d*. The first electrodes 29*a*, 29*b* are formed from the second metal film 38. The first protection portion 29*c* is formed from the protection film 37. The first protection portion 29*c* includes two first diode-side holes (semiconductor component-side holes) 29*c*1, 29*c*2 that are through holes formed at positions overlapping the first electrodes 29*a*, 29*b*, respectively, in a plan view. The first semiconductor portion 29*d* is formed from the semiconductor film 36 and connected to the first electrodes 29*a*, 29*b* via the first diode-side holes 29*c*1, 29*c*2, respectively. An arrangement direction of the first electrodes 29*a*, 29*b* in each pair and the longitudinal direction of the first semiconductor portion 29*d* are parallel to the plate surface of the glass substrate GS of the array board 11*b* and correspond to the X-axis direction (a direction perpendicular to the arrangement direction of the diodes 29, 30 in the corresponding pair). The first diode 29 includes a first gate electrode (a gate electrode) 29*e* and a first insulating layer 29*f*. The first gate electrode 29*e* is formed from the first metal film 34 and arranged so as to overlap the first electrodes 29*a*, 29*b* and the first semiconductor portion 29*d* in a plan view. The first insulating layer 29*f* is formed from the gate insulator 35. The first insulating layer 29*f* insulates the first gate electrode 29*e* from the first semiconductor portion 29*d*. The first gate electrode 29*e* continues to a first shorting line-side connecting portion (a semiconductor component connecting line-side connecting portion) 42 that is formed from the second metal film 38 and arranged so as to overlap the first shorting line 31 in a plan view. The first shorting line-side connecting portion 42 is connected to the first shorting line 31. The first shorting line-side connecting portion 42 is formed from the first metal film 34, which also forms the first gate electrode 29*e*. As illustrated in FIG. 9, the first shorting line-side connecting portion 42 is connected to the first shorting line 31 via a first shorting line-side hole 43*a* that is a through hole formed in a first shorting line-side insulator (a third insulator) 43 arranged between the first shorting line-side connecting portion 42 and the first shorting line 31. The first shorting line-side insulator 43 is formed from the gate insulator 35 and the protection film 37. The first electrode 29*a* that is one of the electrodes of the first diode 29 (on the left side in FIG. 6) continues to the first shorting line 31 that is formed from the second metal film 38, which also forms the first electrode 29*a*. Namely, the first electrode 29*a* and the first gate electrode 29*e* of the first diode 29 are shorted by the first shorting line 31. Although the first diode 29 has a structure similar to a transistor, the first diode 29 functions as a diode.

The first shorting line 31 is formed from the second metal film 38. As illustrated in FIG. 6, the first shorting line 31 is routed from the row control circuit 28 side to the contact portion 32 side with respect to the X-axis direction while crossing the static protection circuit portion 26 and the common line 25 therebetween. One of the ends of the first shorting line 31 is connected to the row control circuit 28 and the other end is connected to the gate line 19 via the contact portion 32. A portion of the first shorting line 31 adjacent to the diodes 29, 30 in the static protection circuit portion 26 on the left side in FIG. 6 overlaps the first shorting line-side connecting portion 42 that continues from the first gate electrode 29e in a plan view. The portion is connected to the first shorting line-side connecting portion 42 via the first shorting line-side hole 43a of the first shorting line-side insulator 43. The portion continues from the electrodes 29a, 30a of the diodes 29, 30 in the corresponding pair.

Figure 8:
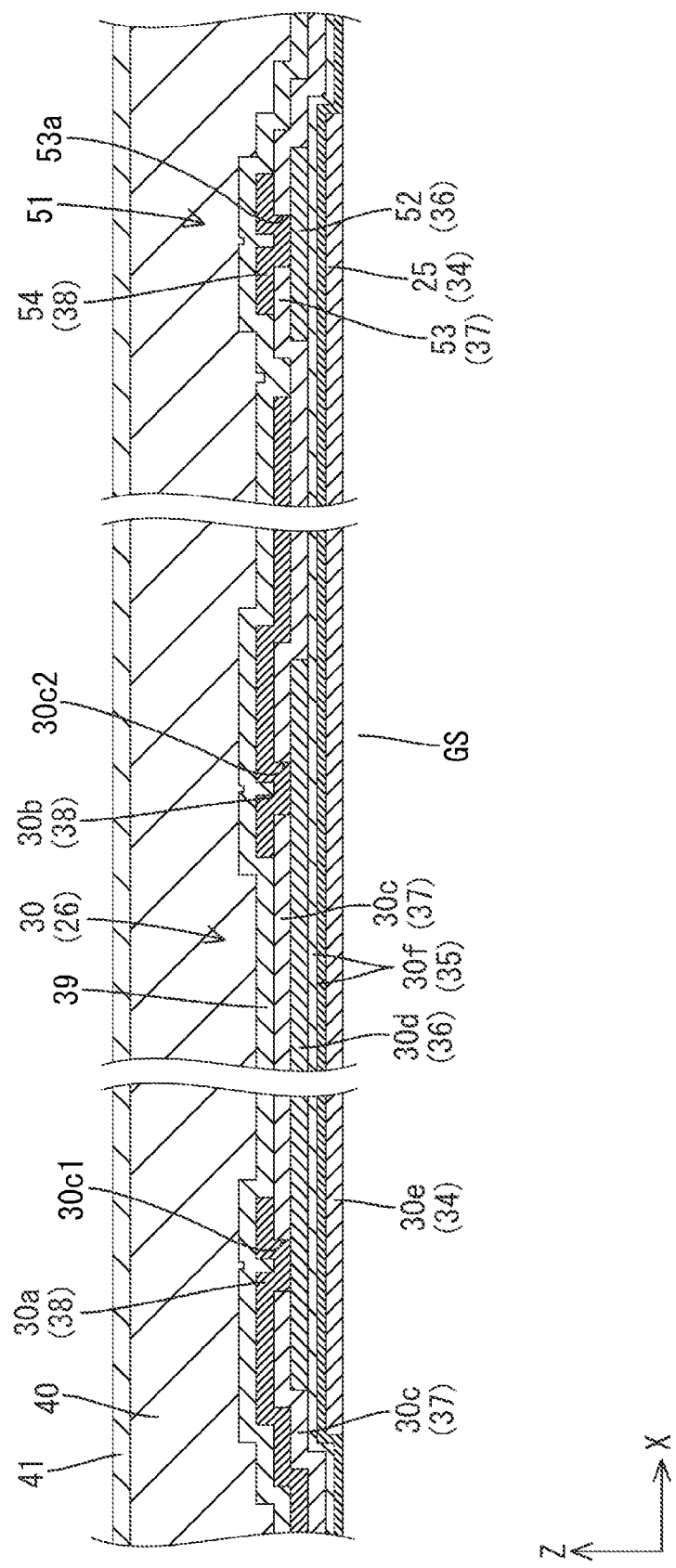
FIG. 8 is a cross-sectional view of FIG. 6 along line viii-viii.
Figure 10:
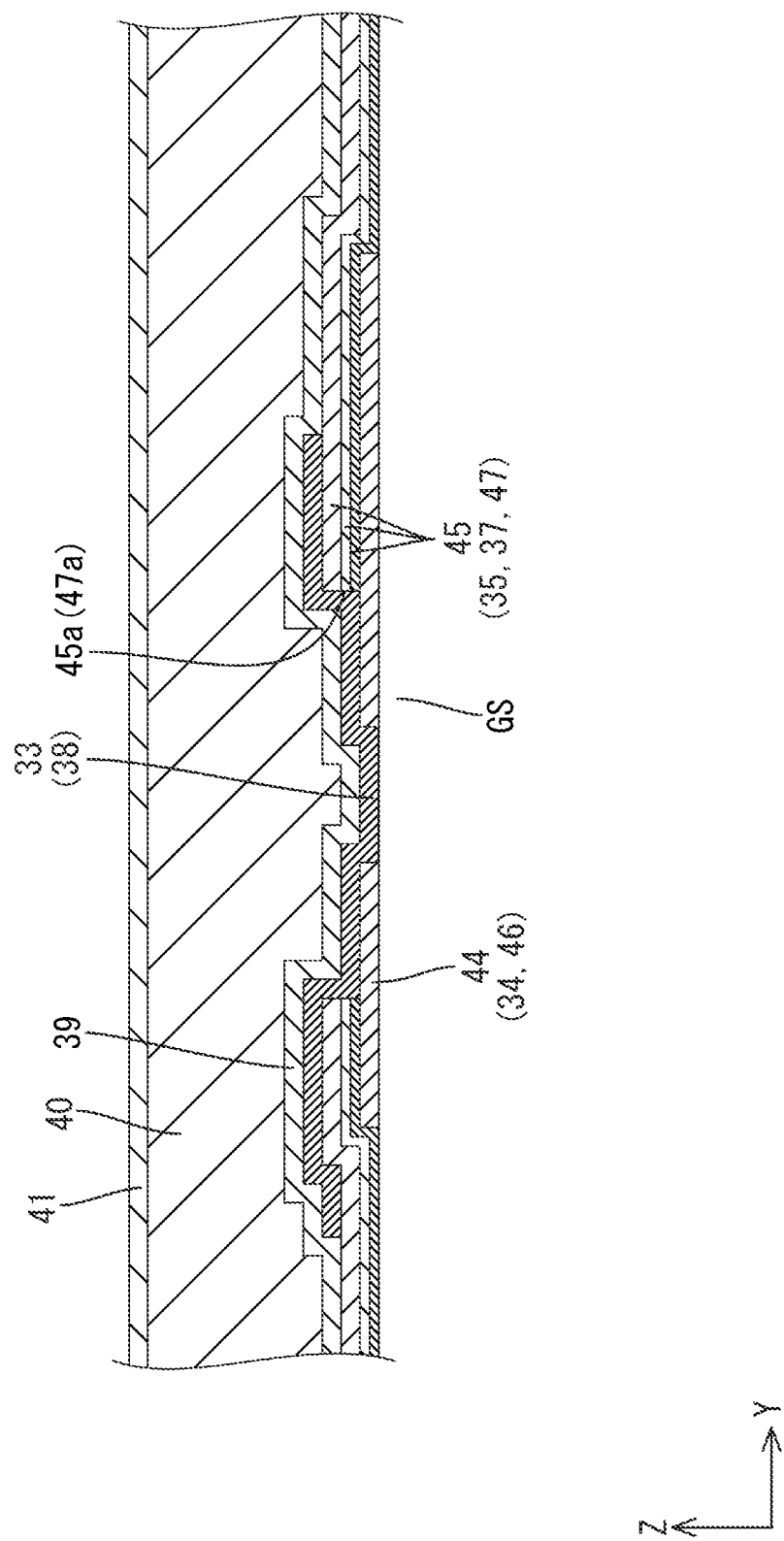
FIG. 10 is a cross-sectional view of FIG. 6 along line x-x.

As illustrated in FIG. 8, the second diode 30 includes two second electrodes (second electrodes) 30a, 30b, a second protection portion (a second protection portion) 30c, and a second semiconductor portion (a second semiconductor portion) 30d. The second electrodes 30a, 30b are formed from the second metal film 38. The second protection portion 30c is formed from the protection film 37. The second protection portion 30c includes two second diode-side holes (second semiconductor component-side holes) 30c1, 30c2 that are through holes formed at positions overlapping the second electrodes 30a, 30b, respectively, in a plan view. The second semiconductor portion 30d is formed from the semiconductor film 36. The second semiconductor portion 30d is connected to the second electrodes 30a, 30b via the second diode-side holes 30c1, 30c2, respectively. An arrangement direction of the second electrodes 30a, 30b in each pair and the longitudinal direction of the second semiconductor portion 30d correspond to the Y-axis direction, that is, to the arrangement direction of the first electrodes 29a, 29b and the longitudinal direction of the first semiconductor portion 29d. The second diode 30 includes a second gate electrode (a second gate electrode) 30e and a second insulating layer 30f. The second gate electrode 30e is formed from the first metal film 34 and arranged so as to overlap the second electrodes 30a, 30b and the second semiconductor portion 30d in a plan view. The second insulating layer 30f is formed from the gate insulator 35. The second insulating layer 30f insulates the second gate electrode 30e from the second semiconductor portion 30d. The second gate electrode 30e continues to a second shorting line-side connecting portion (a second semiconductor component connecting line-side connecting portion) 44 that is formed from the second metal film 38 and arranged so as to overlap the second shorting line 33 in a plan view. The second shorting line-side connecting portion 44 is connected to the second shorting line 33. The second shorting line-side connecting portion 44 is formed from the first metal film 34, which also forms the first gate electrode 30e. As illustrated in FIG. 10, the second shorting line-side connecting portion 44 is connected to the second shorting line 33 via a second shorting line-side hole (a second shorting line-side hole) 45a that is a through hole formed in the second shorting line-side insulator (a second shorting line-side insulator) 45 arranged between the second shorting line-side connecting portion 44 and the second shorting line 33. The second shorting line-side insulator 45 is formed from the gate insulator 35 and the protection film 37. The second electrode 30b that is one of the electrodes of the second diode 30 (on the right side in FIG. 6) continues to the second shorting line 33 that is formed from the second metal film 38, which also forms the second electrode 30b. Namely, the second electrode 30a and the second gate electrode 30e of the second diode 30 are shorted by the second shorting line 33. Although the second diode 30 has a structure similar to a transistor, the second diode 30 functions as a diode.

The second shorting line 33 is formed from the second metal film 38. As illustrated in FIG. 6, the second shorting line 33 is arranged adjacent to the common line 25 on a side opposite from the contact portion 32 with respect to the X-axis direction. With respect to the Y-axis direction, the second shorting line 33 is arranged between the adjacent first shorting lines 31. The second shorting line 33 is arranged between the common line 25 and the diodes 29, 30 in the static protection circuit portion 26. The second shorting line 33 overlaps the second shorting line-side connecting portion 44 that continues from the second gate electrode 20e. The second shorting line 33 is connected to the second shorting line-side connecting portion 44 via the second shorting line-side hole 45a in the second shorting line-side insulator 45. The second shorting line 33 continues from the electrodes 29b, 30b of the diodes 29, 30 in the corresponding pair. The second shorting line-side connecting portion 44 is formed from the first metal film 34. The second shorting line-side connecting portion 44 continues to the common line 25 arranged adjacent thereto. With this configuration, the other electrodes 29b, 30b of the diodes 29, 30 are connected to the common line 25. The second shorting line-side connecting portion 44 is also configured as a common line-side connecting portion (a static dissipating line-side connecting portion) 46 that connects the second shorting line 33 to the common line 25. Furthermore, the second shorting line-side insulator 45 is also configured as a common line-side insulator (a fourth insulator) 47 that insulates the common line-side connecting portion 46 from the second shorting line 33. The second shorting line-side hole 45a is also configured as a common line-side hole (a second second shorting line-side hole) 47a that is a through hole in the common line-side insulator 47 for connecting the second shorting line 33 to the common line-side connecting portion 46.

Figure 13:
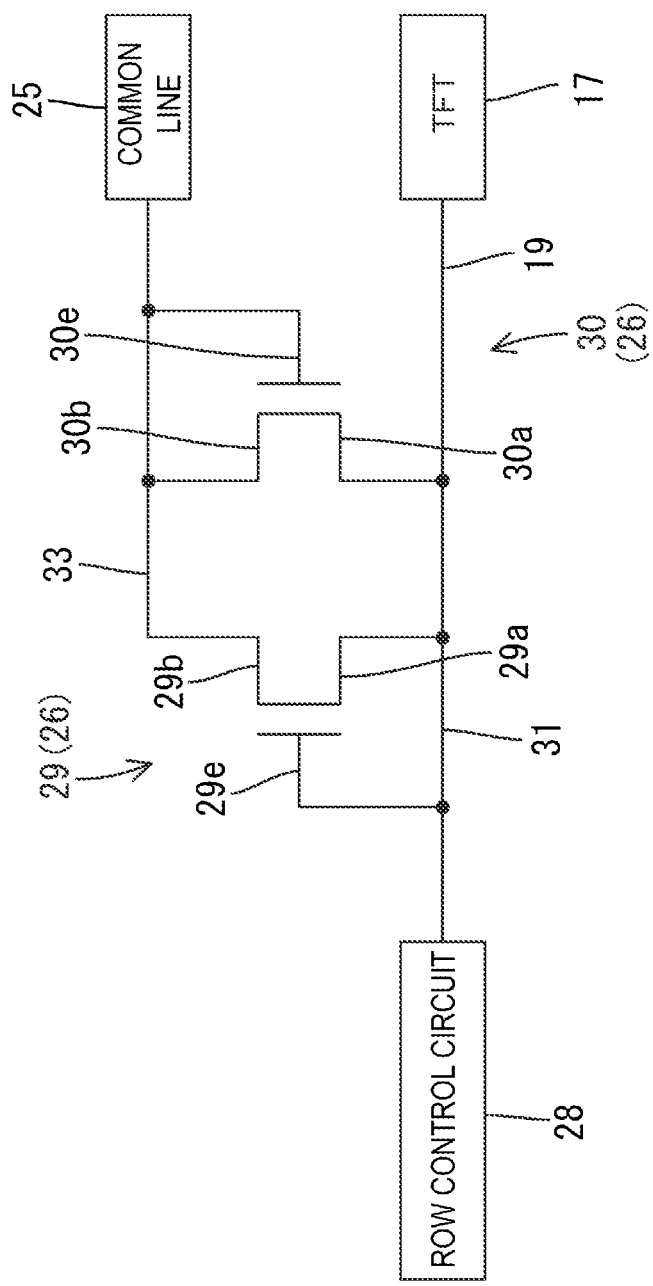
FIG. 13 is a schematic circuit diagram illustrating a configuration of the static protection circuit portion in the static protection portion.

The connections of the diodes 29, 30 in the static protection circuit portion 26 will be described with reference to the circuit diagram in FIG. 13. As illustrated in FIG. 13, the first electrode 29a and the first gate electrode 29e of the first diode 29 and the second electrode 30a of the second diode 30 are shorted by the first shorting line 31 and connected to the gate line 19. The first electrode 29b of the first diode 29 and the second electrode 30b and the second gate electrode 30e of the second diode 30 are shorted by the second shorting line 33 and connected to the common line 25. Each of the diodes 29, 30 having the transistor configuration has a threshold voltage that is set higher than a voltage related to a signal transmitted from the row control circuit 28 to the gate line 19 via the first shorting line 31 but lower than a voltage that may be applied when static electricity builds up. According to this configuration, the diodes 29, 30 does not turn on when the liquid crystal panel 11 is driven and signals from the row control circuit 28 are properly transmitted to the gate line 19. If static electricity is applied to the gate line 19 and a potential at the gate line 19 becomes higher than a potential at the common line 25, the diodes 29, 30 turn on and the static electricity is transferred to the common line 25. If the static electricity is applied to the common line 25 and the potential at the gate line 19 becomes lower than the potential at the common line 25, the diodes 29, 30 also turn on and the static electricity is dissipated.

Figure 11:
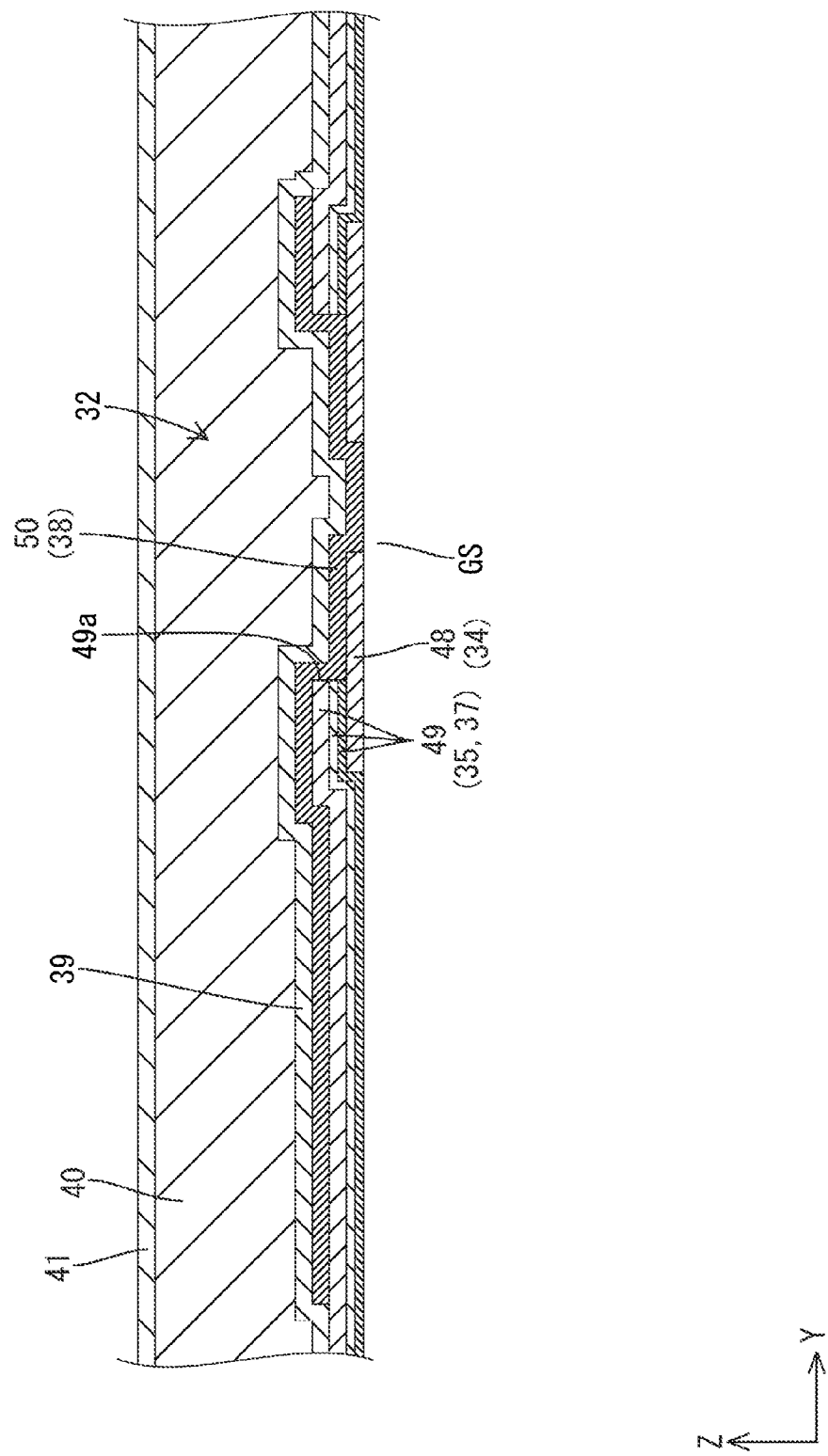
FIG. 11 is a cross-sectional view of FIG. 6 along line xi-xi.

Next, the contact portion 32 will be described. As illustrated in FIG. 6, the contact portion 32 is arranged in an area between the common line 25 and the display area AA with respect to the X-axis direction. As illustrated in FIG. 11, the contact portion 32 includes a gate line-side connecting portion (a signal line-side connecting portion) 48, a contact portion-side insulator (an insulation film) 49, and a diode-side connecting portion (a semiconductor component-side connecting portion) 50. The gate line-side connecting portion 48 is formed from the first metal film 34 at an end of the gate line 19. The contact portion-side insulator 49 is formed from the gate insulator 35 and the protection film 37. The contact portion-side insulator 49 includes contact portion-side holes 49a that are through holes formed at positions overlapping the gate line-side connecting portion 48 in a plan view. The diode-side connecting portion 50 is formed from the second metal film 38 at the other end of the first shorting line 31. The diode-side connecting portion 50 is connected to the gate line-side connecting portion 48 via the contact portion-side holes 49a. The diode-side connecting portion 50 is shorted to the electrodes 29a, 30a of the diodes 29, 30 in the static protection circuit portion 26 and the first gate electrode 29e. The gate line-side connecting portion 48 and the diode-side connecting portion 50 project toward the upper side in FIG. 6 relative to the gate line 19 and the first shorting line 31. The gate line-side connecting portion 48 and the diode-side connecting portion 50 are arranged along the X-axis direction relative to the static protection circuit portion 26 such that the common line 25 is therebetween. Three contact portion-side holes 49a are formed at positions overlapping the gate line-side connecting portion 48 and the diode-side connecting portion 50. Namely, the gate line-side connecting portion 48 and the diode-side connecting portion 50 are connected at three points.

Next, the common line 25 will be described. The common line 25 is formed from the first metal film 34. As illustrated in FIG. 6, the common line 25 is arranged at a position so as to separate the static protection circuit portion 26 and the contact portion 32 from each other. The common line 25 extends in the Y-axis direction and crosses a number of the first shorting lines 31. The common line 25 continues to the common line-side connecting portion 46 that overlaps a portion of the second shorting line 33, which is described earlier, in a plan view. Namely, the common line 25 continues to a portion that projects from an edge of the common line 25 opposite the static protection circuit portion 26 toward the static protection circuit portion (opposite from the contact portion 32). The portion is configured as the common line-side connecting portion 46.

Figure 12:
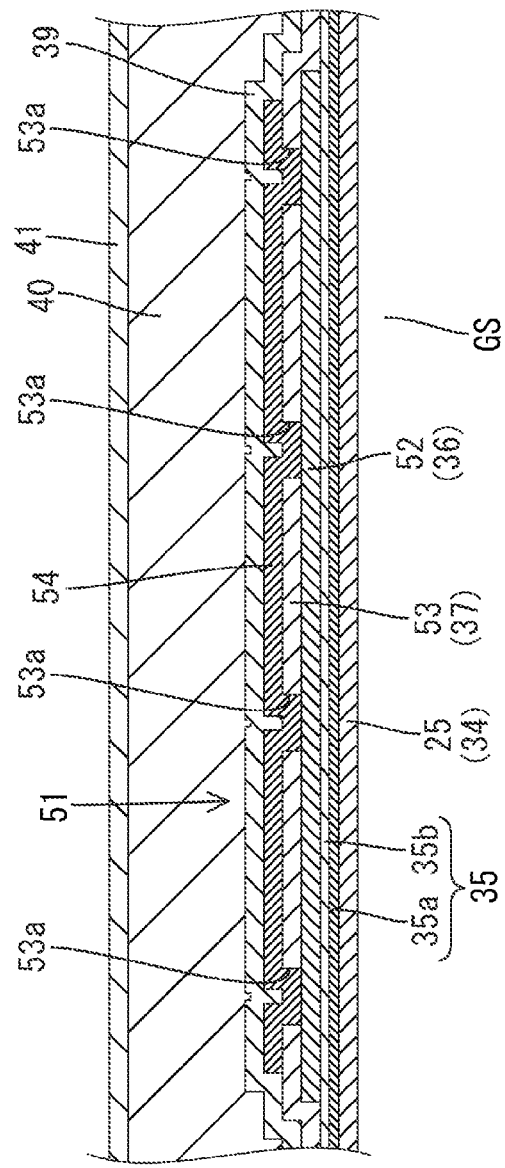
FIG. 12 is a cross-sectional view of FIG. 6 along line xii-xii.

As illustrated in FIG. 6, a static protection portion 51 is formed at the position overlapping a portion of the common line 25 in a plan view (in a normal direction to the plate surface of the glass substrate GS) between the static protection circuit portion 26 and the contact portion 32. The static protection portion 51 is for protecting the static protection circuit portion 26 from static electricity that may build up in the contact portion 32 in a stage prior to the formation of the second metal film 38 in the fabrication process of the array board 11b and for protecting the contact portion 32 from static electricity that may build up in the static protection circuit portion 26 in a stage prior to the formation of the second metal film 38 in the fabrication process of the array board 11b. A portion of the common line 25 overlapping the static protection portion 51 in a plan view has a width larger than a width of other portions not overlapping the static protection portion 51. As illustrated in FIGS. 7, 8 and 12, the static protection portion 51 includes a static dissipating portion 52 and a static dissipating portion protection portion 53. The static dissipating portion 52 is formed from the semiconductor film 36. The static dissipating portion protection portion 53 is formed from the protection film 37. The static dissipating portion protection portion 53 includes static dissipating holes 53a that are through holes formed at positions overlapping the static dissipating portion 52 in a plan view. Furthermore, the static protection portion 51 includes a static dissipating portion connecting portion 54 at a position overlapping the static dissipating portion 52 in a plan view. The static dissipating portion connecting portion 54 is formed from the second metal film 38 and connected to the static dissipating portion 52 via the static dissipating holes 53a.

As illustrated in FIG. 6, the static dissipating portion 52 extends for a predetermined length in a direction in which the common line 25 extends, that is, the Y-axis direction. The static dissipating portion 52 has a vertically-long rectangular shape in a plan view. The static dissipating portion 52 is arranged so as to overlap the wide portion of the common line 25 for the entire area thereof in a plan view. A Y-axis dimension (a length) of an area in which the static dissipating portion 52 is formed is about equal to or slightly larger than a Y-axis dimension of the area in which the first electrodes 29a, 29b (the first diode-side holes 29c1, 29c2) and the second electrodes 30a, 30b (the second diode-side holes 30c1, 30c2) of the diodes 29, 30 in the static protection circuit portion 26. A Y-axis dimension of the area in which the static dissipating portion 52 is formed is larger than a Y-axis dimension of an area in which the three contact portion-side holes 49a are formed. Regarding a location of the area in which the static dissipating portion 52 is formed with respect to the X-axis (the width) direction thereof, an edge of the area on the right in FIG. 6 is located inner than the right edge of the common line 25 and an edge of the area on the left in FIG. 6 is located at a position not overlapping the second shorting line 33.

As illustrated in FIGS. 7, 8 and 12, the static dissipating portion protection portion 53 is arranged so as to cover a large area of the static dissipating portion 52 except for the static dissipating holes 53a. Four static dissipating holes 53a are arranged at intervals along the direction in which the static dissipating portion 52 extends (the Y-axis direction) in the static dissipating portion protection portion 53. The intervals of the static dissipating holes 53a are about equal. As illustrated in FIG. 6, two out of four static dissipating holes 53a located at the ends of the Y-axis dimension are arranged outer than the first electrodes 29a, 29b (the first diode-side holes 29c1, 29c2) and the second electrodes 30a, 30b (the second diode-side holes 30c1, 30c2) of the static protection circuit portion 26 with respect to the Y-axis direction (closer to portions of first shorting lines 31 extending along the X-axis direction). In the plan view in FIG. 6, a line that connects four static dissipating holes 53a described above crosses a line that connects the diode-side holes 29c1, 29c2, 30c1, 30c2 of the static protection circuit portion 26 and a line that connects three contact portion-side holes 49a of a contact portion 32.

As illustrated in FIG. 6, the static dissipating portion connecting portion 54 extends for a predetermined length in a direction in which the common line 25 and the static dissipating portion 52 extend, that is, the Y-axis direction. The static dissipating portion connecting portion 54 has a vertically-long rectangular shape in a plan view. The static dissipating portion connecting portion 54 is slightly smaller than the static dissipating portion 52 in the plan view and arranged so as to overlap the static dissipating portion 52 for the entire area thereof. The static dissipating portion connecting portion 54 is connected to the static dissipating portion 52 at four points via the four static dissipating holes 53a. According to this configuration, exposure of the static dissipating portion 52 via the static dissipating holes 53a to the first interlayer insulation film 39 is restricted.

As illustrated in FIG. 6, at a portion of the common line 25 opposite to the contact portion 32 and a portion of the gate line-side connecting portion 48 of the contact portion 32, second static dissipating portions 55 are formed so as to project toward each other and configured as a pair. With the second static dissipating portions 55, the static protection circuit portion 26 is protected from static electricity that may build up in the contact portion 32 in the stage prior to the formation of the second metal film 38 in the fabrication process of the array board 11b. Furthermore, the contact portion 32 is protected from static electricity that may build up in the static protection circuit portion 26 in the stage prior to the formation of the second metal film 38 in the fabrication process of the array board 11b. Each of the second static dissipating portions 55 is formed from the first metal film 34 and in a triangular shape in a plan view such that it tapers from a base to a distal end thereof. The distal ends of the second static dissipating portions 55 are arranged at about the same Y-axis position and opposite to each other with a small gap therebetween in the X-axis direction. Namely, the second static dissipating portions 55 are arranged along the X-axis direction.

As illustrated in FIG. 6, the second static dissipating portion 55 that continues from the common line 25 is arranged adjacent to the static dissipating portion 52. The Y-axis position of the second static dissipating portion 55 corresponds to about the middle of the static dissipating portion 52 in the extending direction of the static dissipating portion 52. Namely, the second static dissipating portion 55 is located between the inner two static dissipating holes 53a of the four static dissipating holes 53a that overlap the static dissipating portion 52 in the plan view. The four static dissipating holes 53a are arranged across the second static dissipating portion 55 with respect to the Y-axis direction.

With the static dissipating portion 52 and the second static dissipating portion 55 of the static protection portion 51 having the configurations described above, the following functions and effects are achieved. In the fabrication process of the array board 11b, the films described above are formed on the glass substrate GS in sequence from the bottom by a known photolithography method. When the first metal film 34, the gate insulator 35, the semiconductor film 36, and the protection film 37 are formed on the glass substrate GS, the semiconductor portion 29d, 30d of each protection portion 29c, 30c in the static protection circuit portion 26 is exposed to the outside through the diode-side holes 29c1, 29c2, 30c1, 30c2 in the non-display area NAA as illustrated in FIGS. 14 to 17. Furthermore, the gate line-side contact portion 48 of each contact portion 32 is exposed to the outside through the three contact portion-side holes 49a in the contact portion-side insulator 49. While the glass substrate GS in this stage is transferred to different machines until the second metal film 38 is formed, static electricity may build up on the glass substrate GS or the outermost surface of the formed films due to peeling electrostatic charge. Although the surface of the glass substrate GS is covered with the protection film 37 mainly made of insulating material, the semiconductor portions 29d, 30d and the gate line-side connecting portion 48 made of conductive material are exposed through the holes 29c1, 29c2, 30c1, 30c2, 49a in the non-display area NAA. Therefore, static electricity may be applied from one of the semiconductor portion 29d, 30d to the gate line-side connecting portion 48 or from the gate line-side connecting portion 48 to the semiconductor portion 29d, 30d.

Figure 14:
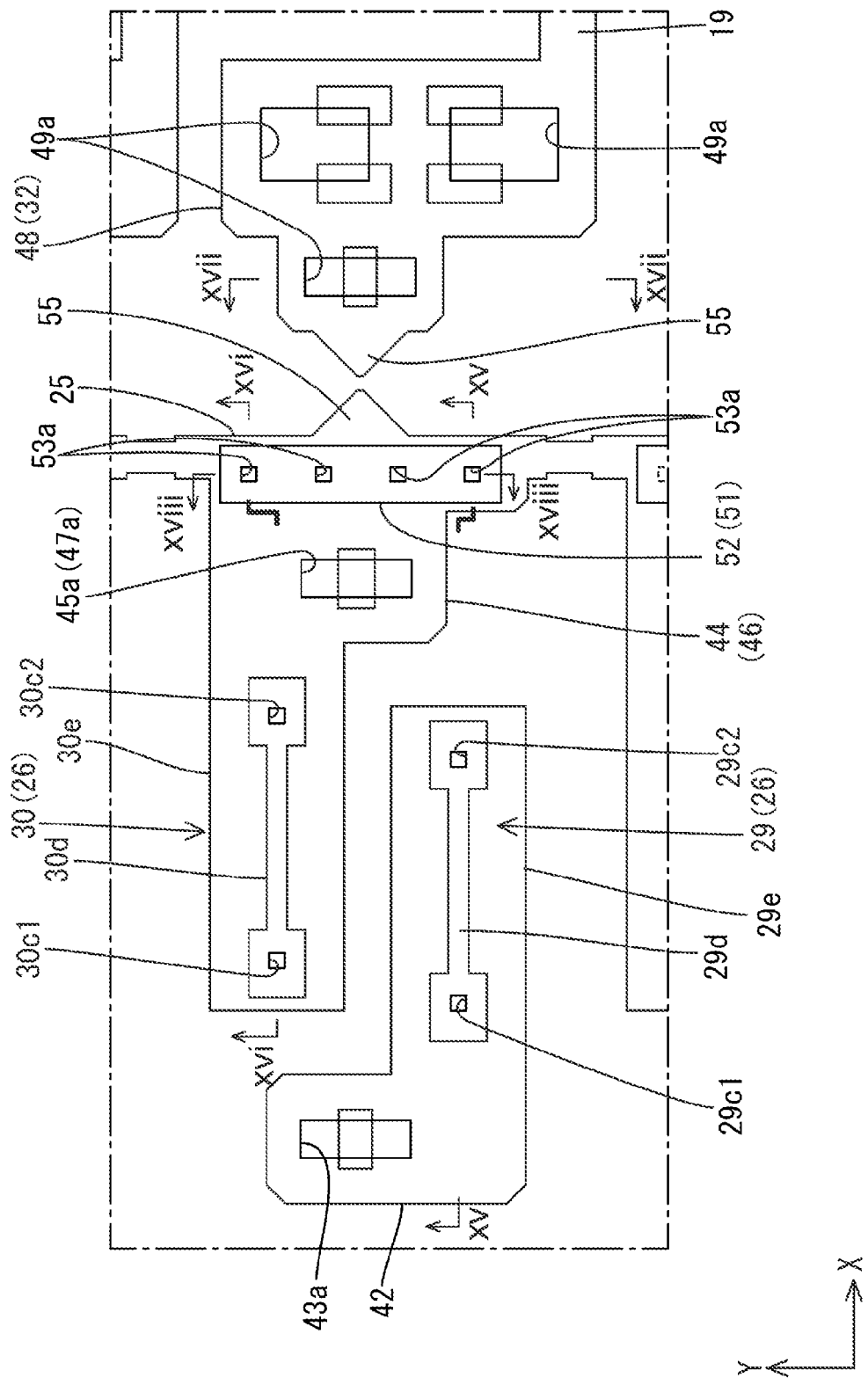
FIG. 14 is a plan view of the array board illustrating the static protection circuit portion, the common line, the static protection portion, and the contact portion in a stage prior to formation of the second metal film.
Figure 15:
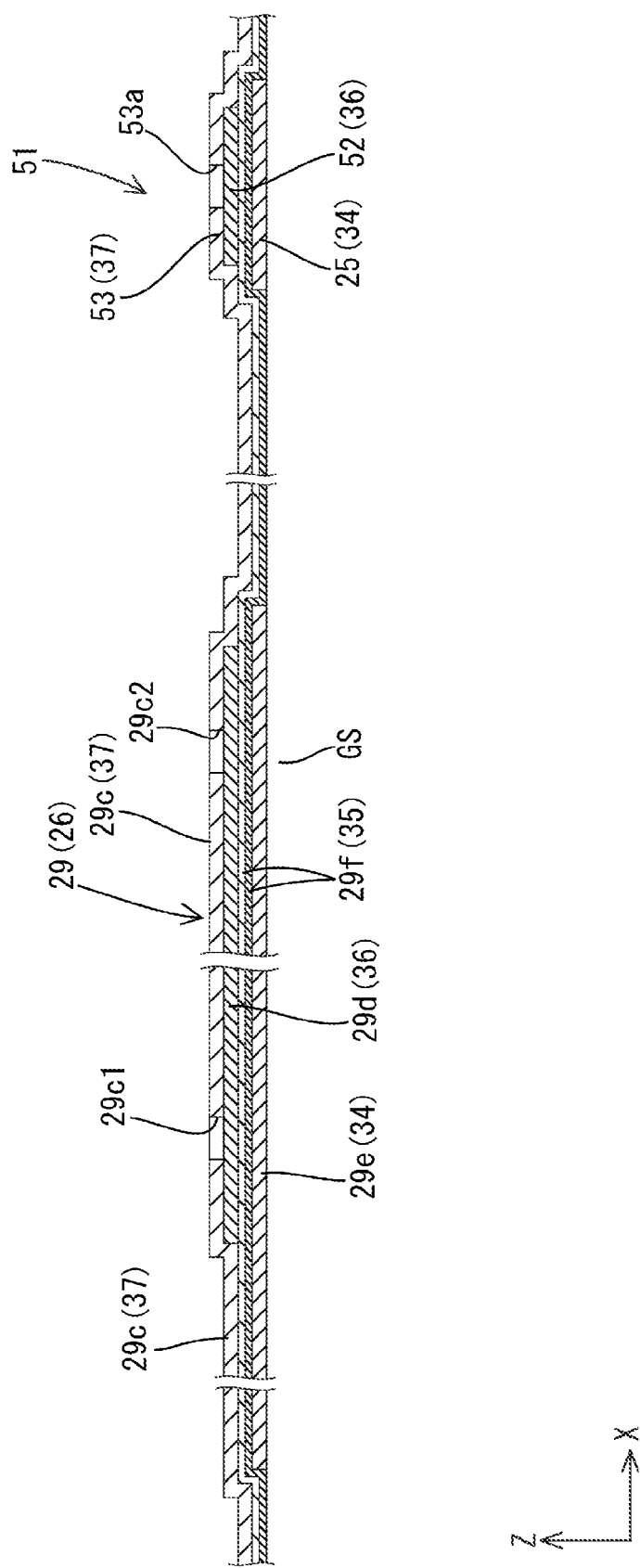
FIG. 15 is a cross-sectional view of FIG. 14 along line xv-xv.
Figure 16:
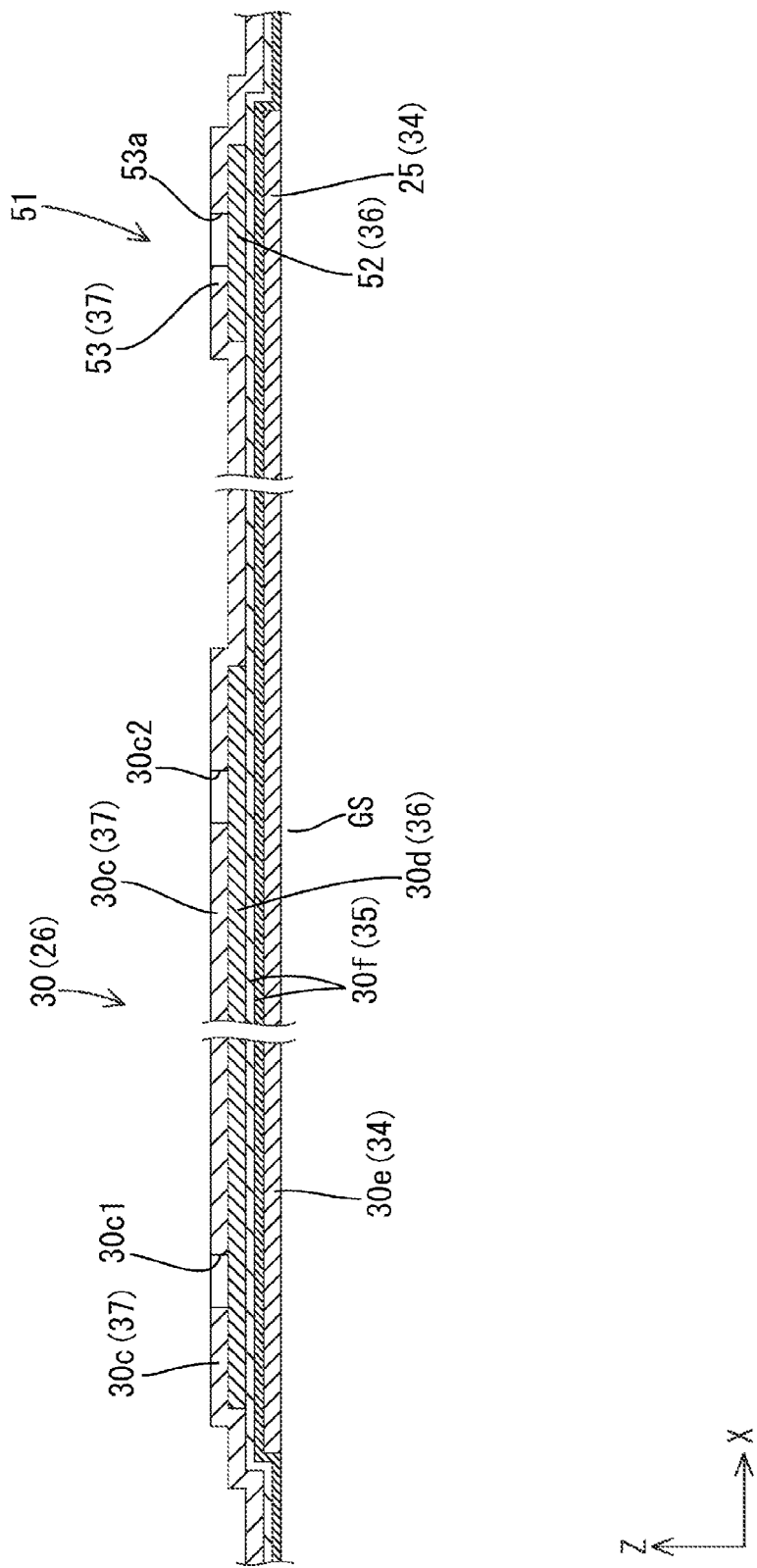
FIG. 16 is a cross-sectional view of FIG. 14 along line xvi-xvi.
Figure 17:
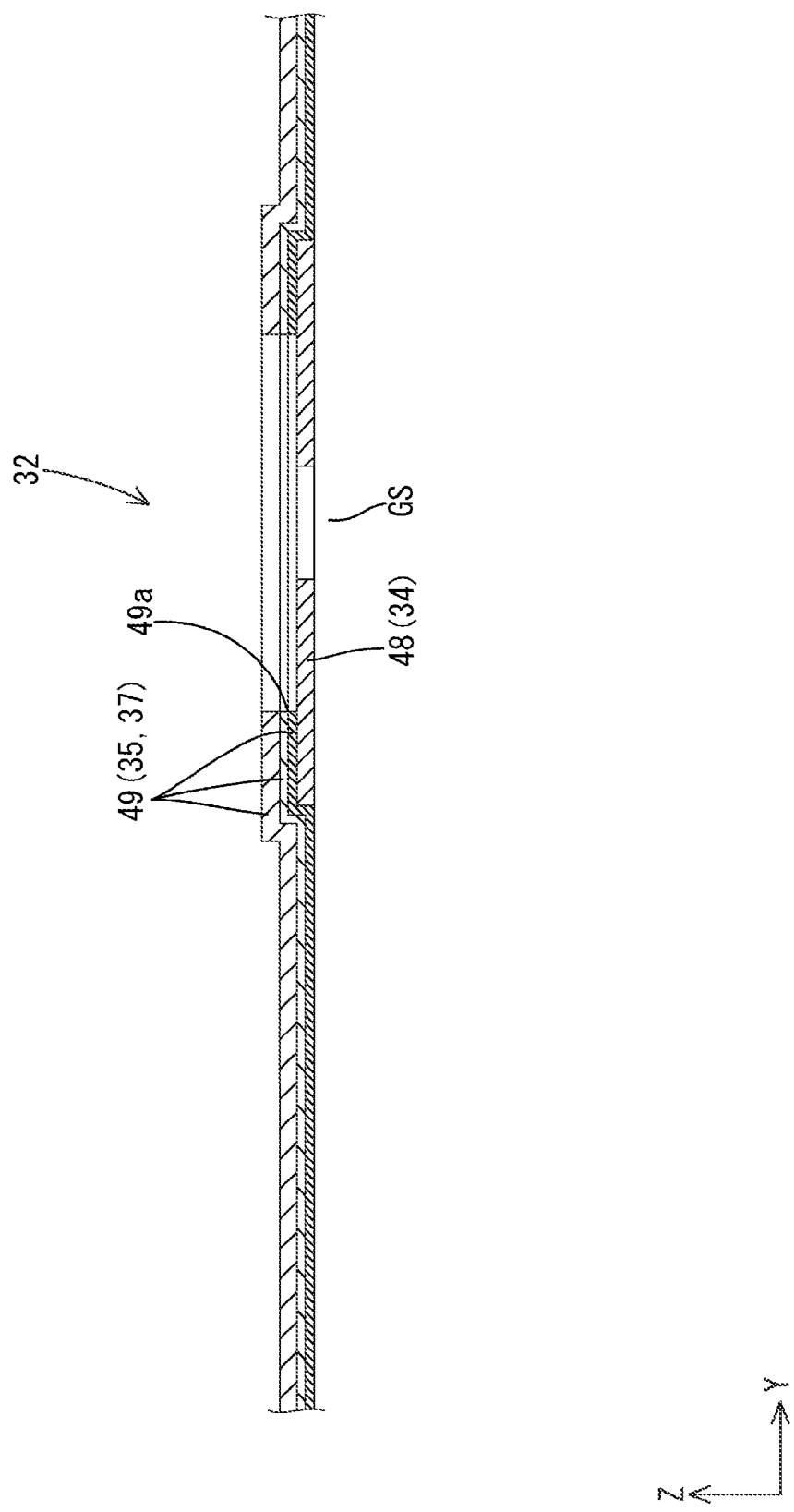
FIG. 17 is a cross-sectional view of FIG. 14 along line xvii-xvii.
Figure 18:
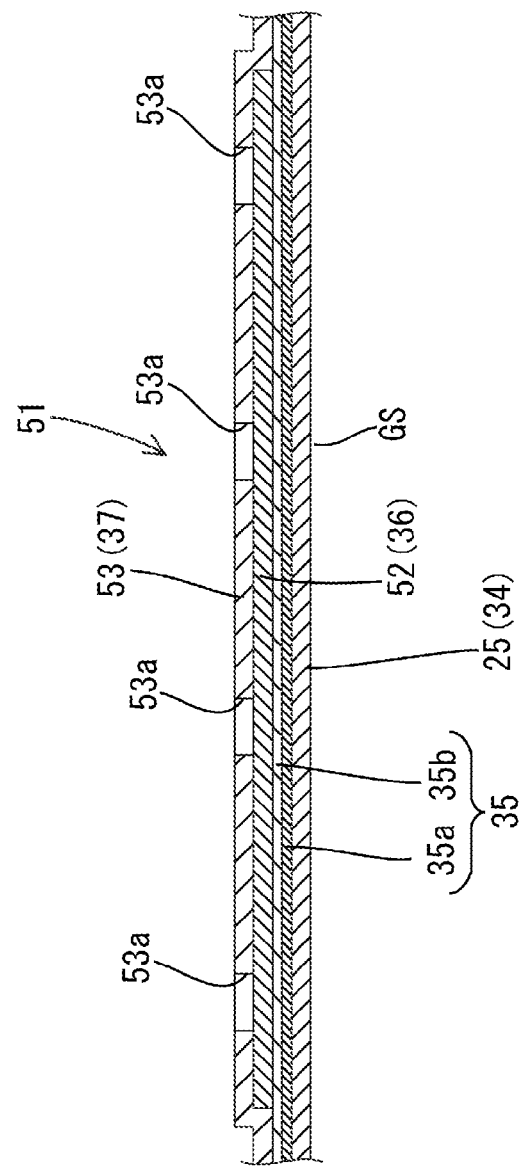
FIG. 18 is a cross-sectional view of FIG. 14 along line xviii-xviii.

In this embodiment, as illustrated in FIG. 14, the static protection portion 51 is formed between the static protection circuit portion 26 and the contact portion 32. As illustrated in FIGS. 15, 16 and 18, the static dissipating portion 52 of the static protection portion 51 is exposed to the outside through the static dissipating holes 53a. The static electricity that may be applied from one of each semiconductor portion 29d, 30d and the gate line-side connecting portion 48 to the other one of each semiconductor portion 29d, 30d and the gate line-side connecting portion 48 is dissipated to the static dissipating portion 52 through the static dissipating holes 53a. According to this configuration, shorting of the semiconductor portions 29d, 30d to the gate electrodes 29e, 30e due to electrostatic breakdown of the diodes 29, 30 is less likely to occur. Furthermore, disconnection due to electrostatic breakdown of the contact portion 32 is less likely to occur between the gate line-side connecting portion 48 and the diode-side connecting portion 50. The static dissipating portion 52 is formed from the semiconductor film 36 that also forms the semiconductor portions 29d, 30d of the diodes 29, 30. If static electricity builds up in the gate line-side connecting portion 48 of the contact portion 32, the static electricity is effectively dissipated by the static dissipating portion 52. According to this configuration, the application of the static electricity to the semiconductor portions 29d, 30d is further properly restricted. If the static electricity is transferred to the static dissipating portion 52, an electrostatic breakdown may occur and the static dissipating portion 52 may be shorted to a common line 25. If that occurs, the static electricity is transferred to the common line 25.

Furthermore, as illustrated in FIG. 14, the second static dissipating portions 55 are formed in the portion of the gate line-side connecting portion 48 and the portion of the common line 25. The portions are opposite to each other. The second static dissipating portions 55 project toward each other. Even if static electricity builds up in one of the semiconductor portion, 29d, 30d and the gate line-side connecting portion 48, the static electricity is transferred to the second static dissipating portions 55 in a path toward the other one of the semiconductor portion, 29d, 30d and the gate line-side connecting portion 48. With the static dissipating portion 52 and the second static dissipating portions 55, electrostatic breakdowns of the diode 29, 30 and the contact portion 32 due to the static electricity are effectively reduced.

As described earlier, the array board (a semiconductor device) 11b in this embodiment includes the glass substrate (a substrate) GS, the first metal film 34, the gate insulator (an insulation film) 35, the semiconductor film 36, the protection film 37, the second metal film 38, the first diodes (a semiconductor component) 29, the gate lines (signal lines) 19, the contact portions 32, and the static protection portions 51. The first metal film 34 is formed on the glass substrate GS. The gate insulator 35 is formed at least on the first metal film 34. The semiconductor film 36 is formed on the gate insulator 35. The protection film 37 is formed at least on the semiconductor film 36 and configured to protect the semiconductor film 36. The second metal film 38 is formed on the protection film 37. Each of the first diodes 29 includes at least two first electrodes (electrodes) 29a, 29b, the first protection portion (a protection portion) 29c, and the first semiconductor portion (a semiconductor portion) 29d. The first electrodes 29a, 29b are formed from the second metal film 38. The first protection portion 29c is formed from the protection film 37. The first protection portion 29c includes two first diode-side holes (semiconductor component-side holes) 29c1, 29c2 that are through holes formed at the positions overlapping the first electrodes 29a, 29b. The first semiconductor portion 29d is formed from the semiconductor film 36. The first semiconductor portion 29d are connected to the first electrodes 29a, 29b via the first diode-side holes 29c1, 29c2, respectively. The gate line 19 is formed from the first metal film 34. Each of the contact portions 32 includes at least the gate line-side connecting portion (a signal line-side connecting portion) 48, the contact portion-side insulator (an insulation film) 49, and the diode-side connecting portion (a semiconductor component-side connecting portion) 50. The gate line-side connecting portion 48 is formed from the first metal film 34 at the end of the gate line 19. The contact portion-side insulator 49 is formed from the protection film 37 and the gate insulator 35. The contact portion-side insulator 49 includes the contact portion-side holes 49a that are through holes formed at positions overlapping the gate line-side connecting portion 48. The diode-side connecting portion 50 is formed from the second metal film 38. The diode-side connecting portion 50 continues from one of the first electrodes 29a, 29b of the first diode 29. The diode-side connecting portion 50 is connected to the gate line-side connecting portion 48 via the contact portion-side holes 49a. Each of the static protection portions 51 includes the static dissipating portion 52 and the static dissipating portion protection portion 53. The static dissipating portion 52 is formed from the semiconductor film 36. The static dissipating portion 52 is arranged between the first diode 29 and the contact portion 32 in a plan view. The static dissipating portion 52 is configured to dissipate static electricity that may build up in the first diode 29 or the contact portion 32 in the stage prior to the formation of the second metal film 38. The static dissipating portion protection portion 53 is formed from the protection film 37. The static dissipating portion protection portion 53 includes the static dissipating holes 53a that are through holes formed at positions overlapping the static dissipating portion 52 in a plan view.

In this configuration, the gate line-side connecting portion 48 formed at the end of the gate line 19 in the contact portion 32 is connected to the diode-side connecting portion 50 via the contact portion-side holes 49a that are through holes in the contact portion-side insulator 49. The diode-side connecting portion 50 continues from one of the first electrodes 29a, 29b of the first diode 29 formed from the second metal film 38. Therefore, signals from the first diode 29 are supplied to the gate line 19 formed from the first metal film 34. In the stage prior to the formation of the second metal film 38 in the fabrication process of the array board 11b, the first diode-side holes 29c1, 29c2 are formed in the first protection portion 29c in the first diode 29. The first diode-side holes 29c1, 29c2 are through holes. The first protection portion 29c is formed from the protection film 37. In the contact portion 32, the contact portion-side holes 49a are formed in the contact portion-side insulator 49 formed from the protection film 37 and the gate insulator 35. The contact portion-side holes 49a are through holes. The first semiconductor portion 29d formed from the semiconductor film 36 and are exposed through the first diode-side holes 29c1, 29c2 and the gate line-side connecting portion 48 formed from the first metal film 34 is exposed through the contact portion-side holes 49a. If static electricity build up in any one of the first diode 29 and the contact portion 32 under this condition, the static electricity may be applied to the other first diode 29 or the gate line-side connecting portion 48. This may cause a malfunction of the first diode 29 or the contact portion 32.

This embodiment includes the static protection portion 51 that includes at least the static dissipating portion 52 and the static dissipating portion protection portion 53. The static dissipating portion 52 is formed from the semiconductor film 36 and arranged between the first diode 29 and the contact portion 32 in a plan view. The static dissipating portion protection portion 53 is formed from the protection film 37. The static dissipating portion protection portion 53 includes the static dissipating holes 53a that are through holes formed at the positions overlapping the static dissipating portion 52 in a plan view. With the static protection portion 51, in the stage prior to the formation of the second metal film 38 in the fabrication process of the array board 11b, the static dissipating portion 52 is exposed via the static dissipating holes 53a that are through holes in the static dissipating portion protection portion 53. Therefore, even if static electricity builds up in any one of the first diode 29 and the contact portion 32 in the stage prior to the formation of the second metal film 38, the static electricity is transferred to the static dissipating portion 52 via the static dissipating hole 53a in the path toward the other one of the first diode 29 and the contact portion 32. With this configuration, malfunctions of the first diode 29 and the contact portion 32 due to static electricity are less likely to occur.

The static dissipating portion 52 is formed from the semiconductor film 36, which also forms the first semiconductor portion 29d of the first diode 29. According to this configuration, if static electricity builds up in the gate line-side connecting portion 48 of the contact portion 32, the static electricity is effectively dissipated and application of static electricity to the first semiconductor portion 29d is properly restricted.

The semiconductor film 36 is made of oxide semiconductor. The semiconductor film 36 made of oxide semiconductor may be subject to etching during the formation of the second metal film 38 in the fabrication process. Furthermore, oxidation or reduction of the semiconductor film 36 may occur after the formation of the film. However, the protection film 37 is arranged between the semiconductor film 36 and the second metal film 38, that is, the semiconductor film 36 is protected by the protection film 37. Therefore, the semiconductor film 36 is less likely to be etched during the formation of the second metal film 38 and the oxidation or the reduction of the semiconductor film 36 is less likely to occur after the formation of the film.

This embodiment includes the common line (a static dissipating line) 25 formed from the first metal film 34. The common line 25 is arranged between the first diode 29 and the contact portion 32 in a plan view such that at least a portion thereof overlaps the static dissipating portion 52 and the static dissipating portion protection portion 53. According to this configuration, the static electricity transferred to the static dissipating portion 52 is transferred to the common line 25. The static electricity that builds up in any one of the first diode 29 and the contact portion 32 is transferred to the static dissipating portion 52 and to the common line 25. Therefore, the malfunction due to the static electricity is further less likely to occur.

This embodiment includes the second diode (a second semiconductor component) 30, the first shorting line 31, the second shorting line 33, the second shorting line-side insulator (a second insulator) 45, and the common line-side connecting portion (a static dissipating line-side connecting portion) 46. The second diode 30 includes at least two second electrodes (second electrodes) 30a, 30b, the second protection portion (a second protection portion) 30c, and the second semiconductor portion (a second semiconductor portion) 30d. The second electrodes 30a, 30b are formed from the second metal film 38. The second protection portion 30c is formed from the protection film 37. The second protection portion 30c includes two second diode-side holes (second semiconductor component-side holes) 30c1, 30c2 that are through holes formed at the positions overlapping the second electrodes 30a, 30b, respectively. The second semiconductor portion 30d is formed from the semiconductor film 36. The second semiconductor portion 30d is connected to the second electrodes 30a, 30b via the second diode-side holes 30c1, 30c2. The first shorting line 31 is formed from the second metal film 38. The first shorting line 31 shorts one of the first electrodes 29a, 19b to one of the second electrodes 30a, 30b. The first shorting line 31 continues to the diode-side connecting portion 50. The second shorting line 33 is formed from the second metal film 38. The second shorting line 33 shouts the other one of the first electrode 29a, 29b to the other second electrode 30a, 30b. The second shorting line-side insulator (a second insulator) 45 is formed from the protection film 37 and the gate insulator 35. The second shorting line-side insulator 45 includes the second shorting line-side hole 45a that is a through hole formed at the position overlapping the second shorting line 33. The common line-side connecting portion 46 is formed from the first metal film 34. The common line-side connecting portion 46 continues from the common line 25. The common line-side connecting portion 46 is arranged such that at least a portion thereof overlaps the second shorting line 33 in a plan view and connected to the second shorting line 33 via the second shorting line-side hole 45a. The first electrodes 29a of the first diode 29 is shorted to the second electrode 30a of the second diode 30 by the first shorting line 31. The first electrode 29b of the first electrode 29 is shorted to the second electrode 30b by the second shorting line 33. The first shorting line 31 continues to the diode-side connecting portion 50 that is connected to the gate line 19 in the contact portion 32. The second shorting line 33 is connected to the common line-side connecting portion 46 that continues from the common line 25 via the second shorting line-side hole 45a that are through hole formed in the second shorting line-side insulator 45. If a significant potential difference occurs between the common line 25 and the gate line 19 due to static electricity, the potential difference is compensated by passing a current through the first semiconductor portion 29d of the first diode 29 or the second semiconductor portion 30d of the second diode 30.

This embodiment includes the first shorting line-side insulator (a third insulator) 43, the first gate electrode (a gate electrode) 29e, and the second gate electrode (a second gate electrode) 30e. The first shorting line-side insulator 43 is formed from the protection film 37 and the gate insulator 35. The first shorting line-side insulator 43 includes the first shorting line-side hole 43a that is a through hole formed at the position overlapping the first shorting line 31. The first gate electrode 29e is included in the first diode 29 and formed from the first metal film 34. The first gate electrode 29e is arranged so as to overlap at least portions of the first electrodes 29a, 29b, the first semiconductor portion 29d, and the first shorting line 31. The first gate electrode 29e is connected to the first shorting line 31 via the first shorting line-side hole 43a. The second gate electrode 30e is included in the second diode 30 and formed from the first metal film 34. The second gate electrode 30e is arranged so as to overlap the second electrodes 30a, 30b and the second semiconductor portion 30d in a plan view. The second gate electrode 20e continues to the common line-side connecting portion 46. The first gate electrode 29e is shorted to the first electrode 29a and the second electrode 30b by the first shorting line 31. The second gate electrode 30e is shorted to the first electrode 29b and the second electrode 30b by the common line-side connecting portion 46 and the second shorting line 33. The first diode 29 and the second diode 30 have transistor configurations. However, the static electricity can be transferred to the common line 25 only when the static electricity builds up by setting the threshold voltage higher than the voltage of the signal transmitted through the gate line 19 but lower than the voltage that may be applied when the static electricity builds up. Furthermore, the second gate electrode 30e is directly connected to the common line-side connecting portion 46. In comparison to a configuration in which the second gate electrode is connected to the common line-side connecting portion 46 via the second shorting line 33, the smaller number of contact portions that connect different metal films is smaller and thus a probability of occurrence of loose connections in the contact portions is smaller.

Furthermore, the second static dissipating portions 55 are formed in the portion of the gate line-side connecting portion 48 in the contact portion 32 and the portion of the common line 25. The portions are opposite to each other. The second static dissipating portions 55 project toward each other. In the stage prior to the formation of the second metal film 38, even if static electricity builds up in one of the first diode 29 and the contact portion 32, the static electricity is transferred to the second static dissipating portions 55 in a path toward the other one of the first diode 29 and the contact portion 32. With this configuration, a malfunction of the first diode 29 or the contact portion 32 due to the static electricity is further less likely to occur.

The second static dissipating portion 55 formed at the common line 25 is arranged adjacent to the static dissipating portion 52. Because the second static dissipating portion 55 formed at the common line 25 is arranged adjacent to the static dissipating portion 52, the static electricity that builds up in the stage prior to the formation of the second metal film 38 is properly dissipated by either one of the static dissipating portion 52 or the second static dissipating portion 55 in comparison to a configuration in which the static dissipating portion 52 and the second static dissipating portion 55 are not adjacent to each other and are separated from each other.

The static protection portion 51 includes the static dissipating holes 53a arranged along the plate surface of the glass substrate GS and the direction perpendicular to the arrangement direction of the two second static dissipating portions 55 across the second static dissipating portion 55. Because the static dissipating holes 53a arranged along the plate surface of the glass substrate GS and the direction perpendicular to the arrangement direction of the two second static dissipating portions 55 across the second static dissipating portion 55, the static electricity that builds up in the state prior to the formation of the second metal film 38 is properly transferred to one of the static dissipating portion 52 and the second static dissipating portion 55.

The static protection portion 51 includes the static dissipating portion connecting portion 54. The static dissipating portion connecting portion 54 is formed from the second metal film 38. The static dissipating portion connecting portion 54 is arranged so as to overlap the static dissipating portion 52 in a plan view and connected to the static dissipating portion 52 via the static dissipating holes 53a. This configuration in which the static dissipating portion connecting portion 54 is connected to the static dissipating portion 52 that is formed from the semiconductor film 36 via the static dissipating holes 53a is similar to the configuration of the first diode 29 in which the first electrodes 29a, 29b are connected to the first semiconductor portion 29d that is formed from the semiconductor film 36 via the first diode-side holes 29c1, 29c2. Without the static dissipating portion connecting portion, the static dissipating portion 52 that is formed from the semiconductor film 36 is subject to etching during the formation of the second metal film in the fabrication process of the array board 11b. According to the above configuration of this embodiment, such a problem is less likely to occur.

The liquid crystal panel (a display device) 11 in this embodiment includes the array board 11b described above, the CF board (a counter substrate) 11a, the liquid crystal layer 11c, and the TFTs (switching components) 17. The CF board 11a is arranged opposite the array board 11b. The liquid crystal layer 11c is arranged between the array board 11b and the CF substrate 11a. The TFTs 17 are disposed on the array board 11b and connected to the gate lines 19. Because the array board 11b described above is less likely to cause malfunctions due to static electricity, the liquid crystal panel 11 has high operation reliability.

<Second Embodiment>

A second embodiment according to the present invention will be described with reference to FIGS. 19 to 22. The second embodiment includes a static protection circuit portion 126 that is not connected to a common line 125. Similar configurations, operations, and effects to the first embodiment described above will not be described.

Figure 19:
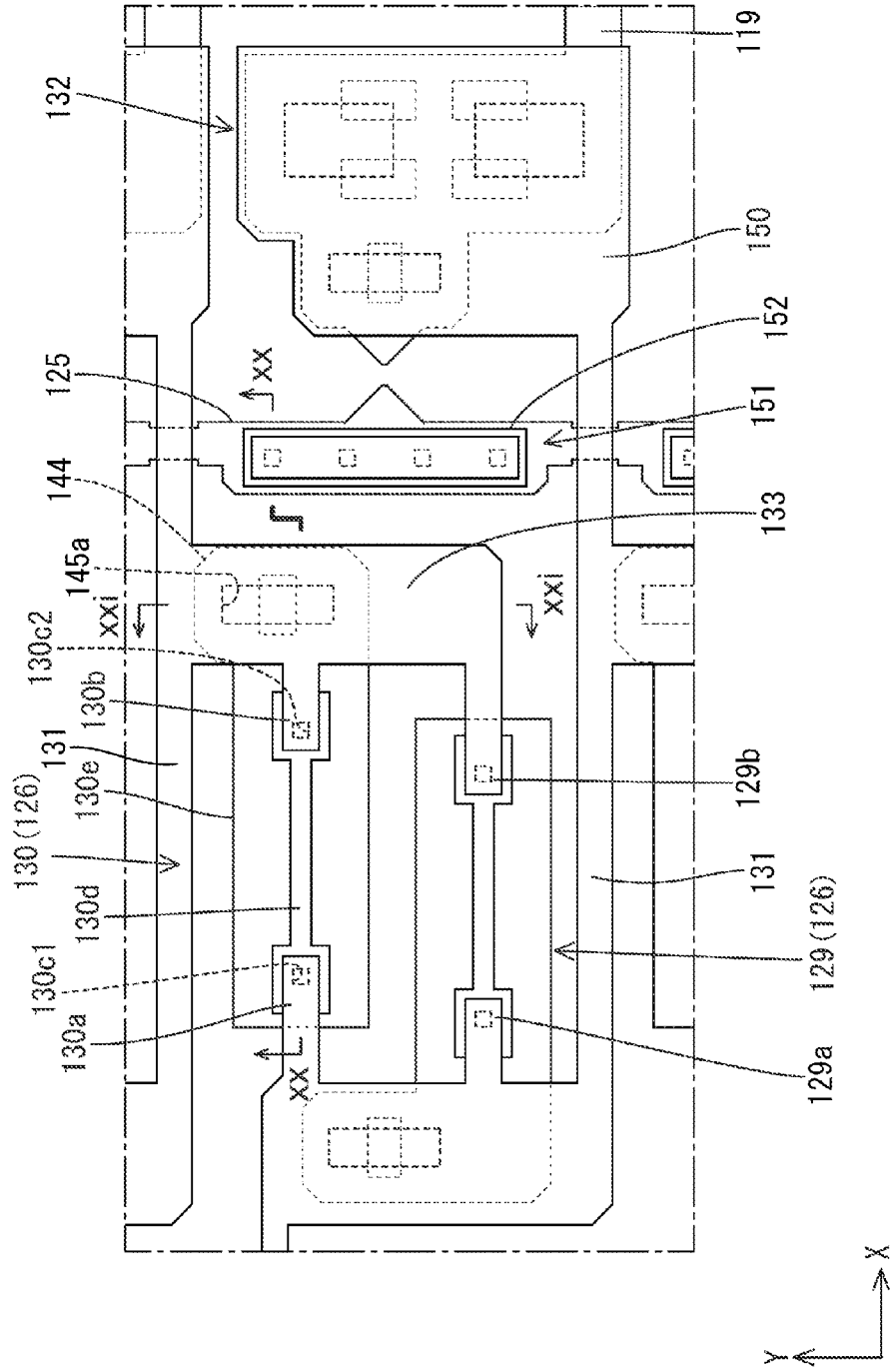
FIG. 19 is a plan view of an array board illustrating a static protection circuit portion, a common line, a static protection portion, and a contact portion according to a second embodiment of the present invention.
Figure 20:
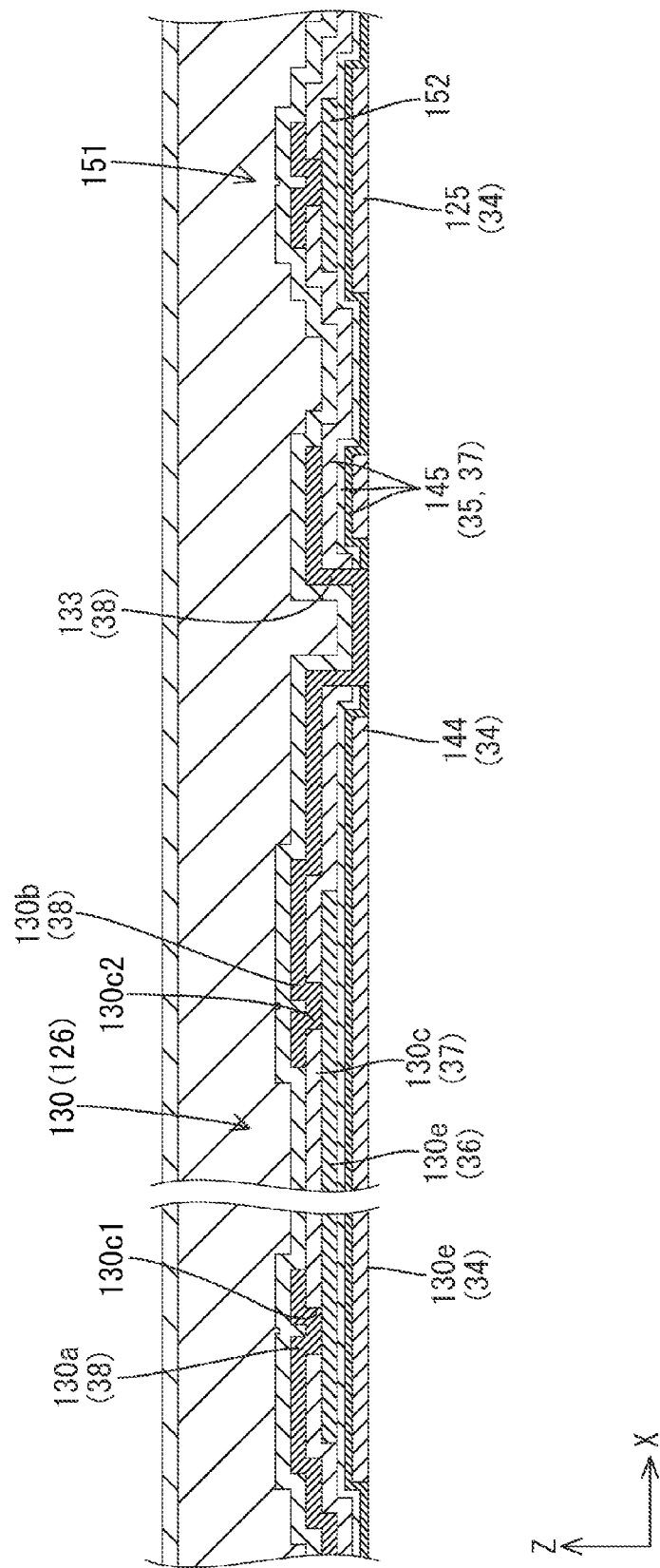
FIG. 20 is a cross-sectional view of FIG. 19 along line xx-xx.
Figure 21:
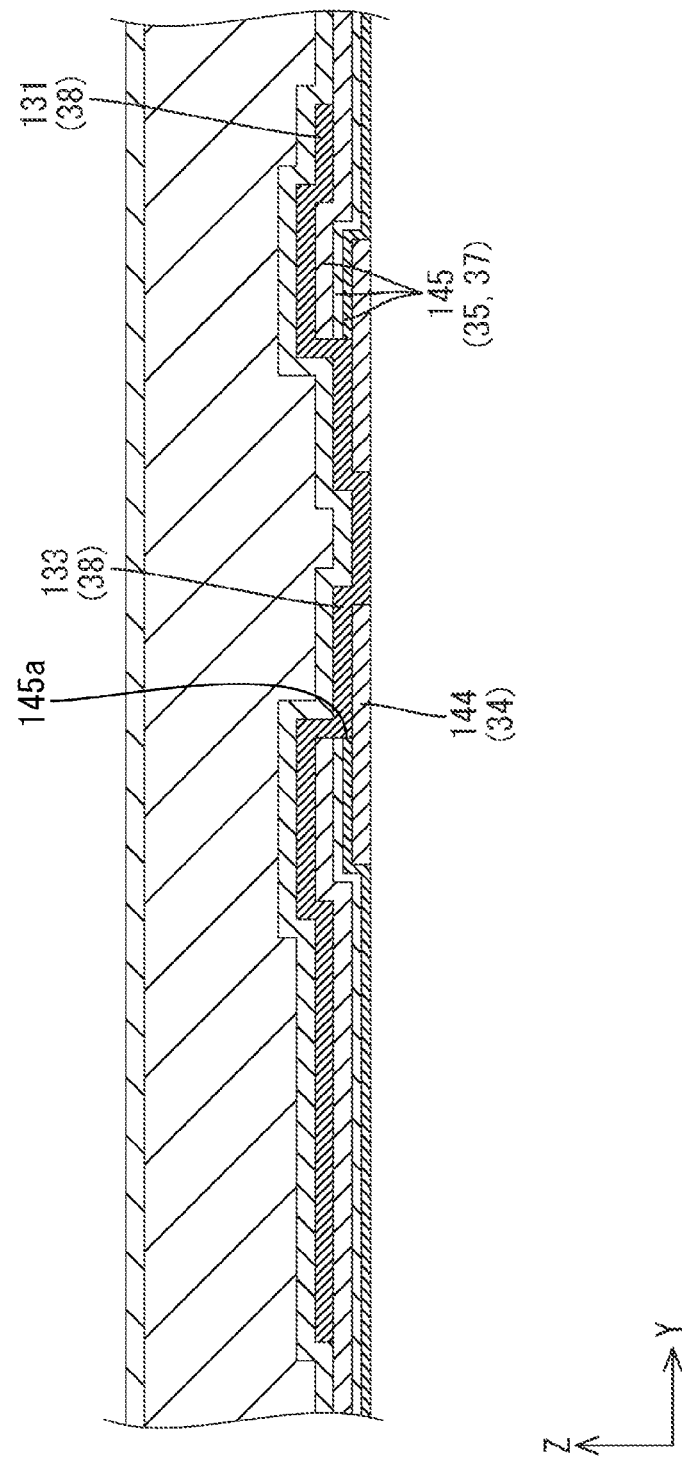
FIG. 21 is a cross-sectional view of FIG. 19 along line xxi-xxi.

As illustrated in FIGS. 19 and 20, the static protection circuit portion 126 of this embodiment includes diode 129, 130. One of electrodes 129a, 130a of each diode 129, 130 is connected to a first shorting line 131. The other one of electrodes 129b, 130b of each diode 129, 130 is connected to another first shorting line 131 and not electrically connected to the common line 125. According to this configuration, if static electricity is transferred to a static dissipating portion 152 in the stage prior to the formation of the second metal film 38, the static electricity is less likely to have an electrical influence on the diodes 129, 130 and thus malfunctions of the diodes 129, 130 are less likely to occur. Specifically, in the static protection circuit portion 126, one of the electrodes 129a, 130a of each diode 129, 130 is connected to the first shorting line 131 and the other one of the electrodes 129b, 130b is connected to a second shorting line 133. The second shorting line 133 is connected to the first shorting line 131 that is adjacent to the second shorting line 133 with respect to the Y-axis direction (a second direction) which is perpendicular to the X-axis direction (a first direction), that is, immediately above the second shorting line 133 in FIG. 19. The second shorting line 133 overlaps a second shorting line-side connecting portion 144 in a plan view. The second shorting line 133 extends farther toward the upper side in FIG. 19 than the second shorting line-side connecting portion 144. A distal end of the second shorting line 133 continues to the adjacent first shorting line 131. As illustrated in FIGS. 20 and 21, the second shorting line 133 is connected to another second shorting line-side connecting portion 144 that continues from a second gate electrode 130e via a second shorting line-side hole 145a formed in a second shorting line-side insulator 145. The second shorting line-side connecting portion 144 does not continue to the common line 125 and thus the common line-side connecting portion 46 of the first embodiment is not included in this embodiment.

Figure 22:
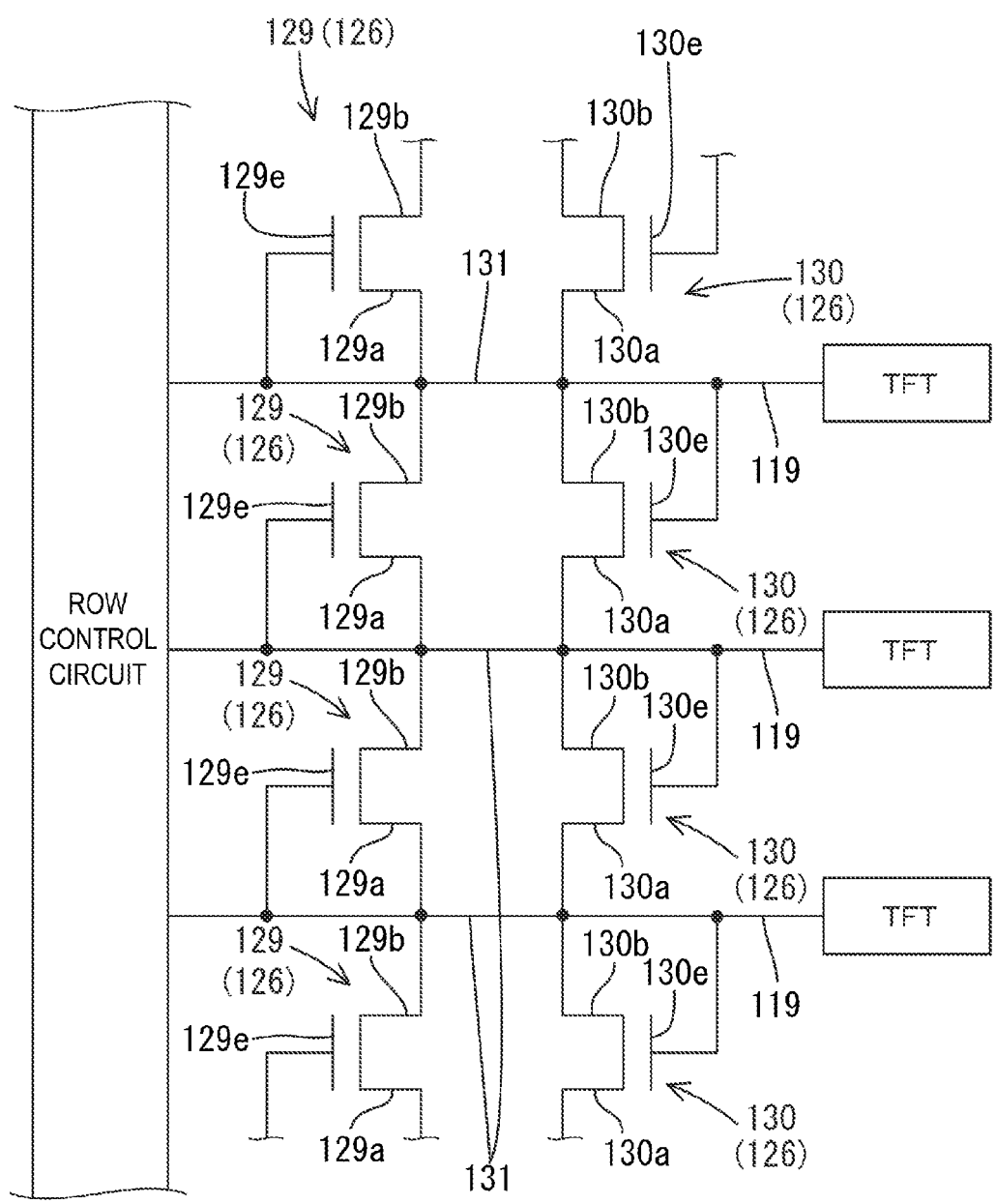
FIG. 22 is a schematic circuit diagram illustrating a configuration of the static protection circuit portion in the static protection portion.

Connections of the diodes 129, 130 in the static protection circuit portion 126 will be described with reference to the circuit diagram in FIG. 22. As illustrated in FIG. 22, a first electrode 129a and a first gate electrode 129e of each first diode 129 and a second electrode 130a of each second diode 130 are shorted by the first shorting line 131 and connected to a corresponding gate line 119. Another first electrode 129b of each first diode 129 and another second electrode 130b and a second gate electrode 130e of each second diode 130 are shorted by the second shorting line 133 and connected to an adjacent first shorting line 131 on an opposite side from the first shorting line 131 to which the first electrode 129a, 130a and the first gate electrode 129e are connected. The first shorting lines 131 and the gate lines 119 arranged in the Y-axis direction are connected to each other via the diodes 129, 130. If static electricity is applied to a specific gate line 119, the diodes 129, 130 turns on and the static electricity is transferred to other gate lines 119.

As described above, this embodiment includes the second diodes 130, the first shorting lines 131, and the second shorting line 133. Each of the second diodes 130 includes at least two second electrodes 130a, 130b, the second protection portion 130c, and the second semiconductor portion 130d. The second electrodes 130a, 130b are formed from the second metal film 38. The second protection portion 130c is formed from the protection film 37. The second protection portion 130c includes two second diode-side holes 130c1, 130c2 that are through holes formed at the positions overlapping the second electrodes 130a, 130b. The second semiconductor portion 130d is formed from the semiconductor film 36 and connected to the second electrodes 130a, 130b via the second diode-side holes 130c1, 130c2, respectively. The arrangement direction of the second electrodes 130a, 130b is defined as the first direction (the X-axis direction). With the first direction as a reference, the second diode 130 is arranged along the glass substrate GS and in the second direction perpendicular to the first direction (the Y-axis direction) relative to the first diode 129. The first shorting line 131 is formed from the second metal film 38. The first shorting line 131 shorts one of the first electrodes 129a, 129b to the other one of the second electrodes 130a, 130b. The first shorting line 131 continues to the diode-side connecting portion 150. The second shorting line 133 is formed from the second metal film 38. The second shorting line 133 shorts the other one of the first electrodes 129a, 129b to the other one of the second electrodes 130a, 130b. Multiple sets of the first diode 129, the second diode 130, the contact portion 132, the gate line 119, the static protection portion 151, the first shorting line 131, and the second shorting line 133 are arranged in the second direction. The second shorting line 133 is shorted to the first shorting line 131 in the set adjacent to the second shorting line 133 with respect to the second direction. Regarding the first diode 129 and the second diode 130, the first electrode 129a and the second electrode 130a are shorted by the first shorting line 131 and the first electrode 129b and the second electrode 130b are shorted by the second shorting line 133. The first shorting line 131 continues to the diode-side connecting portion 150 connected to the gate line 119. The second shorting line 133 is shorted to the first shorting line 131 in the adjacent set with respect to the second direction. If static electricity is applied to the gate line 119, the static electricity is transferred to the second shorting line 133 and the gate line 119 in the adjacent set, to which the gate line 119 is connected via the first shorting line 131 in the adjacent set. Therefore, malfunctions due to the static electricity are less likely to occur. Furthermore, the second shorting line 133 is not connected to the common connecting line-side connecting portion 146. In comparison to a configuration in which the second connecting line 133 is connected to the common line-side connecting portion 146, malfunctions of the first diode 129 and the second diode 130 due to the static electricity transferred to the static dissipating portion 152 are less likely to occur in the stage prior to the formation of the second metal film 138.

<Third Embodiment>

Figure 23:
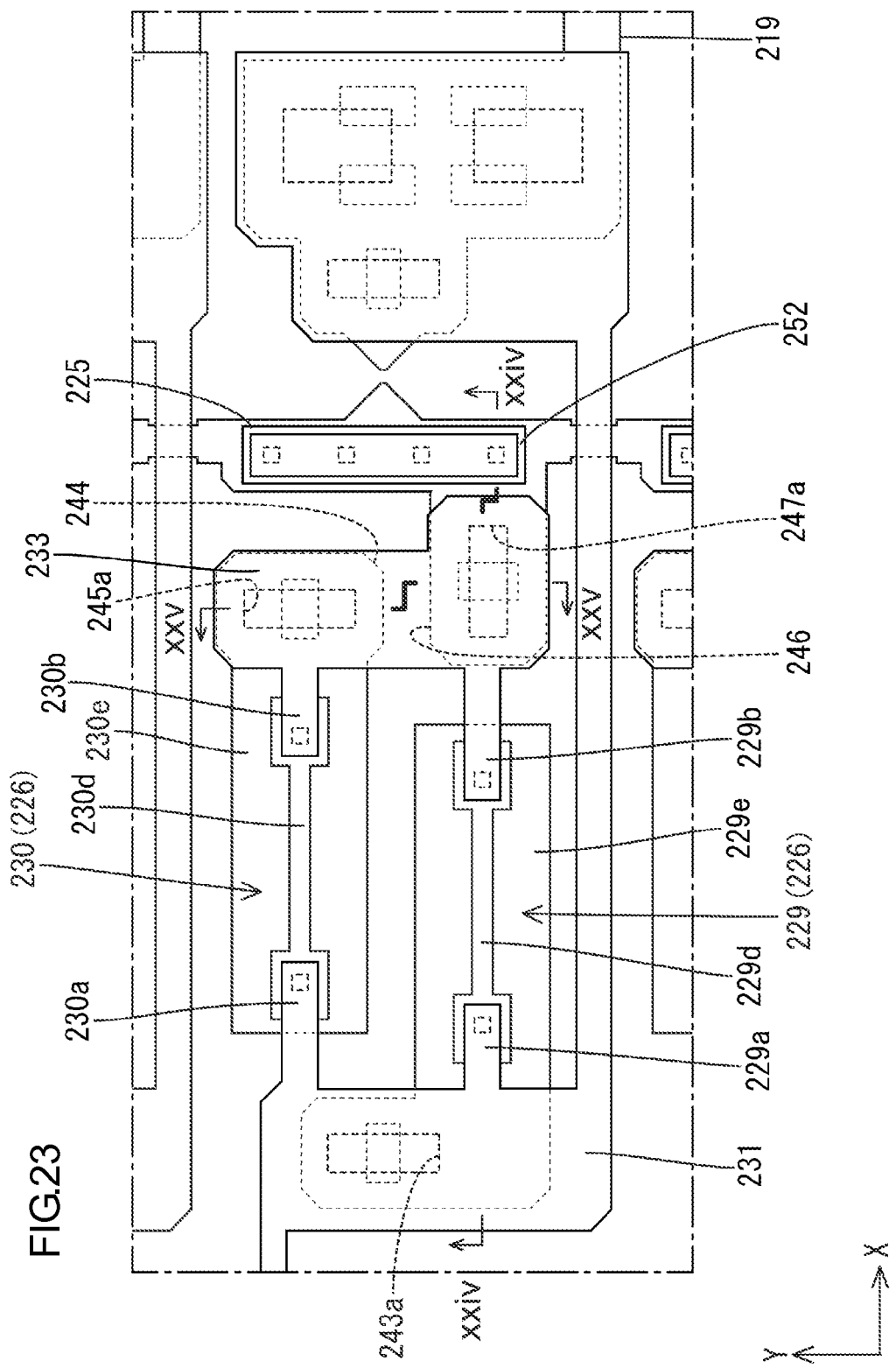
FIG. 23 is a plan view of an array board illustrating a static protection circuit portion, a common line, a static protection portion, and a contact portion according to a third embodiment of the present invention.
Figure 24:
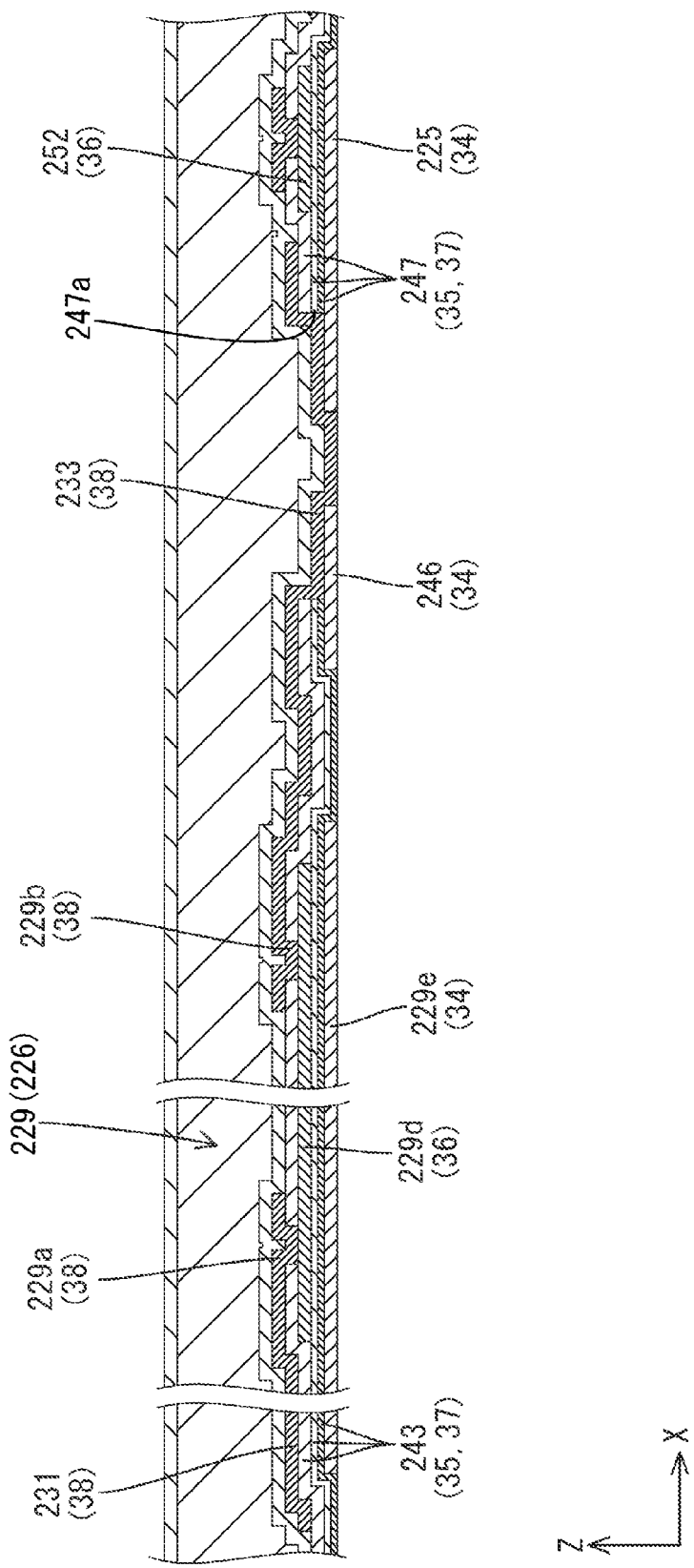
FIG. 24 is a cross-sectional view of FIG. 23 along line xxiv-xxiv.
Figure 25:
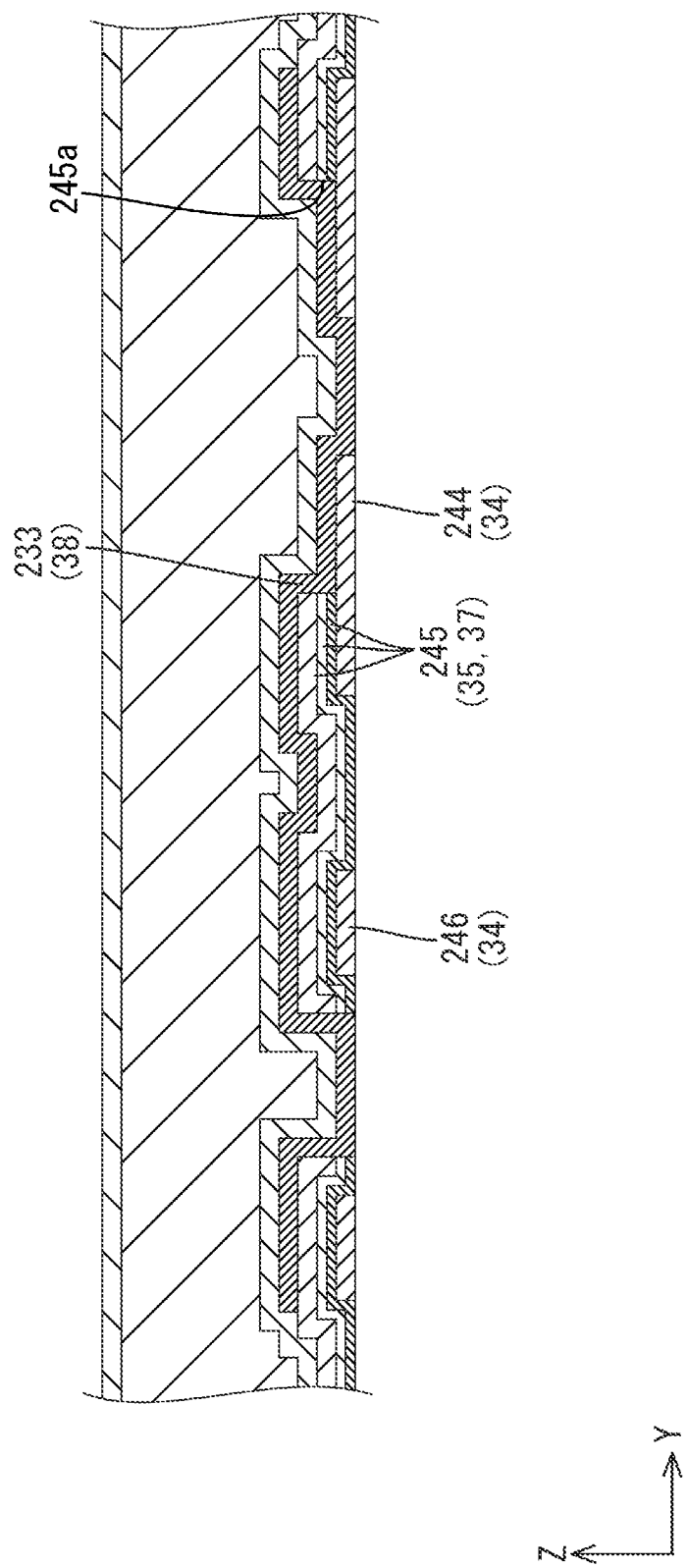
FIG. 25 is a cross-sectional view of FIG. 23 along line xxv-xxv.

A third embodiment according to the present invention will be described with reference to FIGS. 23 to 25. The third embodiment includes second shorting line-side connecting portion 244 and common line-side connecting portions 246 that are separated from one another. Similar configurations, operations, and effects to the first embodiment will not be described.

In this embodiment, second shorting line-side connecting portions 244 are connected to second gate electrodes 230e of second diodes 230, respectively. As illustrated in FIGS. 23 to 25, each second shorting line-side connecting portion 244 is connected to a second shorting line 233 via a second shorting line-side hole 245a formed in a second shorting line-side insulator (a second insulator) 245. However, the second shorting line-side connecting portion 244 is not directly connected to a common line 225. A common line-side connecting portion 246 projects from a portion of a side edge of the common line 225 closer to a static protection circuit portion 226. The common line-side connecting portion 246 overlaps a portion of the second shorting line 233 which does not overlap the second shorting line-side connecting portion 255 in a plan view. A common line-side insulator (a fourth insulator) 247 is arranged between the common line-side connecting portion 246 and the second shorting line 233, The common line-side insulator 247 includes a common line-side hole (a second second shorting line-side hole) 247a that is a through hole. The second shorting line 233 is connected to the common line-side connecting portion 246 via the common line-side hole 247a. Regarding a second gate electrode 230e, the second shorting line-side connecting portion 244 is indirectly connected to the common line 225 via the second shorting line 233 as described above. Even if static electricity is transferred to the static dissipating portion 252 in the stage prior to the formation of the second metal film 38, the static electricity is less likely to have an electrical influence on diodes 229, 230. Therefore, malfunctions of the diodes 229, 230 are less likely to occur.

This embodiment includes first shorting line-side insulator 243, gate electrodes 229e, common line-side insulator (fourth insulator) 247, and second gate electrodes 230e. Each of the first shorting line-side insulator 243 is formed from the protection film 37 and the gate insulator 35. The first shorting line-side insulator 243 includes a first shorting line-side hole 243a that is a through hole formed at a position overlapping the first shorting line 231. The gate electrodes 229e are included in the first diodes 229, respectively. Each of the gate electrodes 229e is formed from the first metal film 34 and arranged so as to overlap first electrodes 229a, 229b, a first semiconductor portion 229d, and a first shorting line 231 in a plan view. The gate electrode 229e is connected to the first shorting line 231 via the first shorting line-side hole 243a. The common line-side insulator 247 is formed from the protection film 37 and the gate insulator 35. The common line-side insulator 247 includes the second second shorting line-side hole 245a that is a through hole formed at the position overlapping the second shorting line 233. The second gate electrodes 230e are included in the second diodes 230, respectively. Each of the second gate electrodes 230e is formed from the first metal film 34 and arranged so as to overlap the second electrodes 230a, 230b, the second semiconductor portion 230d, and the second shorting line 233 in a plan view. The second gate electrode 230e is connected to the second shorting line 233 via the second second shorting line-side hole 245a. The gate electrode 229e is shorted to the electrodes 229a and the first electrode 230a by the first shorting line 231. The second gate electrode 230e is shorted to the first electrode 229b and the second electrode 230b by the second shorting line 33. The first diode 229 and the second diode 230 have transistor configurations. However, the static electricity can be transferred to the common line 225 only when the static electricity builds up by setting the threshold voltage higher than the voltage of the signal transmitted through the gate line 219 but lower than the voltage that may be applied when the static electricity builds up. Furthermore, the second gate electrode 230e is indirectly connected to the common line-side connecting portion 246 via the second shorting line 233. In comparison to a configuration in which the second gate electrode is directly connected to the common line-side connecting portion 246, malfunctions of the first diode 229 and the second diode 230 due to static electricity is less likely to occur when the static electricity is transferred to the static dissipating portion 252 in the stage prior to the formation of the second metal film 38.

<Fourth Embodiment>

A fourth embodiment according to the present invention will be described with reference to FIGS. 26 to 29. The fourth embodiment includes common line-side connecting portions 346 configured as static dissipating portions 352. The common line-side connecting portions 346 continue to a common line 325. Similar configurations, operations, and effects to the first embodiment will not be described.

Figure 26:
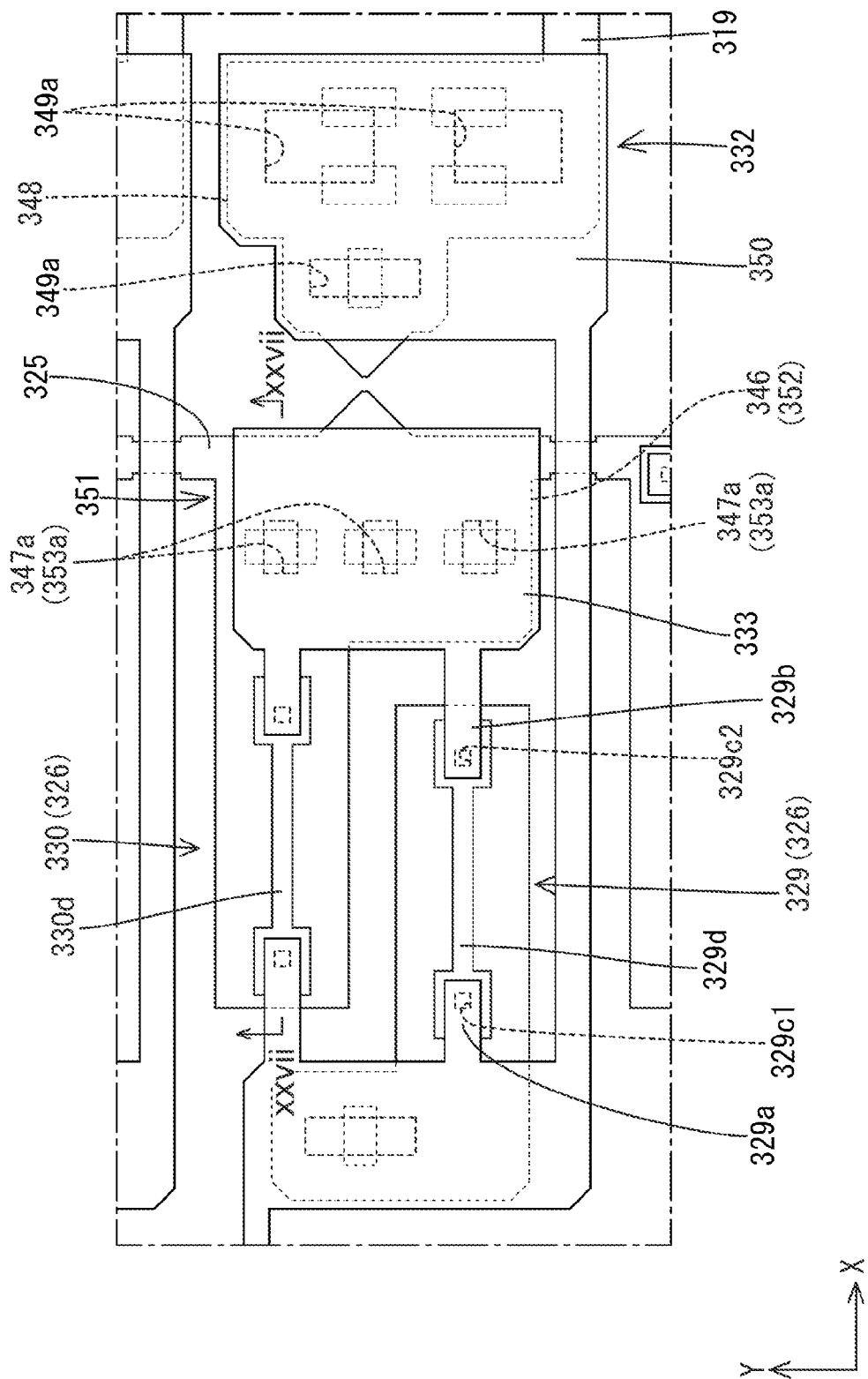
FIG. 26 is a plan view of an array board illustrating a static protection circuit portion, a common line, a static protection portion, and a contact portion according to a fourth embodiment of the present invention.
Figure 27:
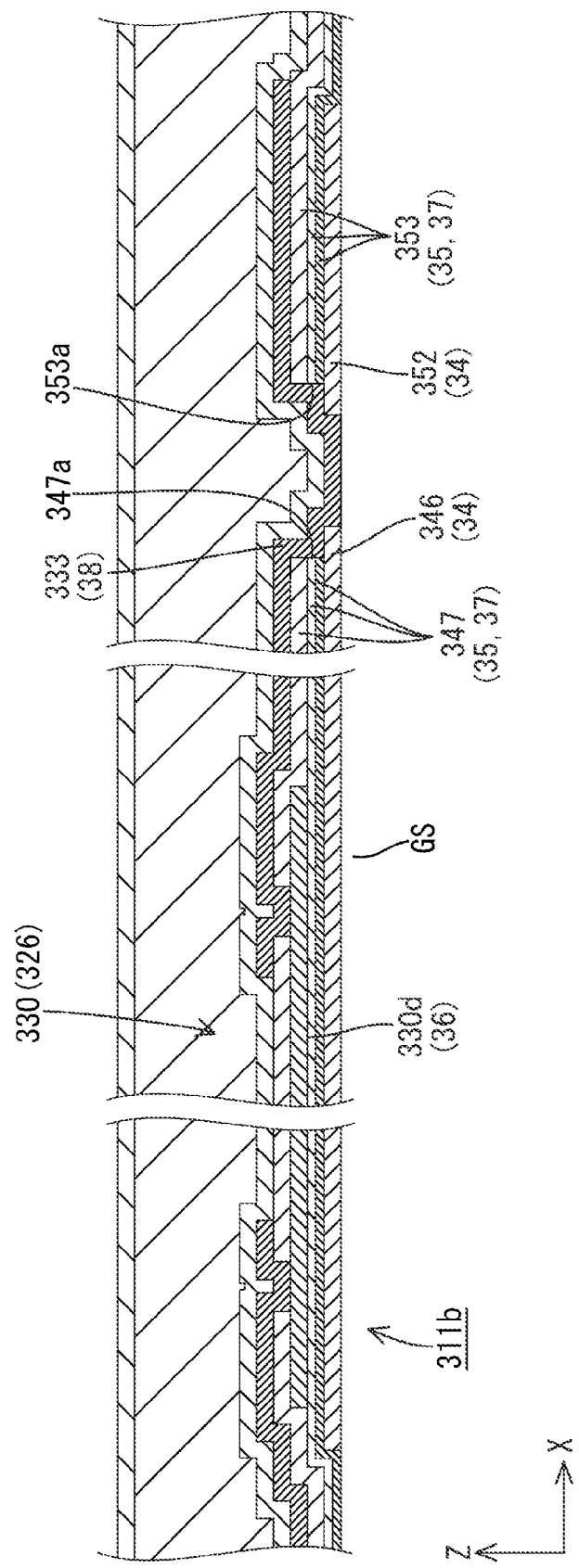
FIG. 27 is a cross-sectional view of FIG. 26 along line xxvii-xxvii.
Figure 28:
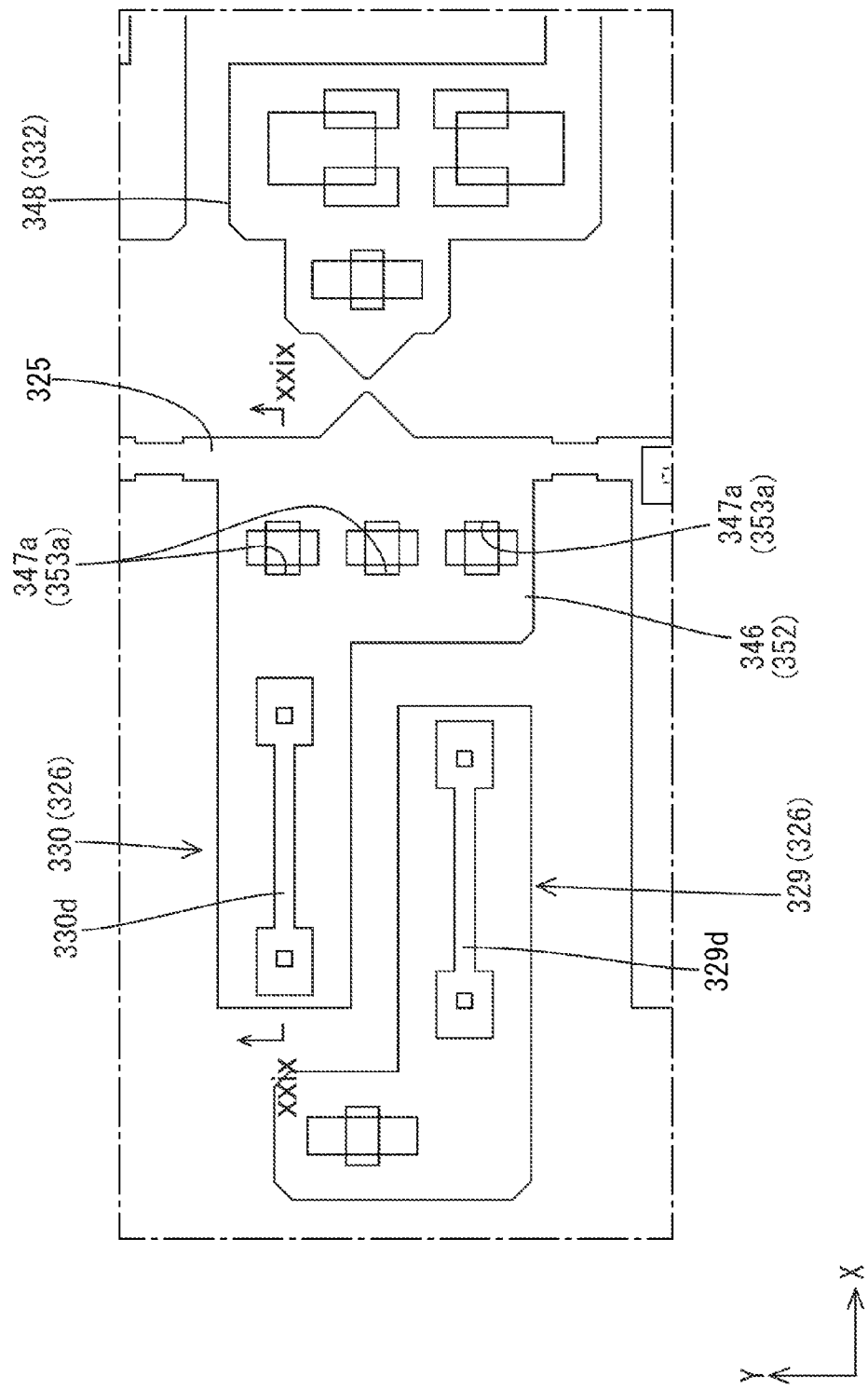
FIG. 28 is a plan view of the array board illustrating the static protection circuit portion, the common line, the static protection portion, and the contact portion in a stage prior to formation of the second metal film.
Figure 29:
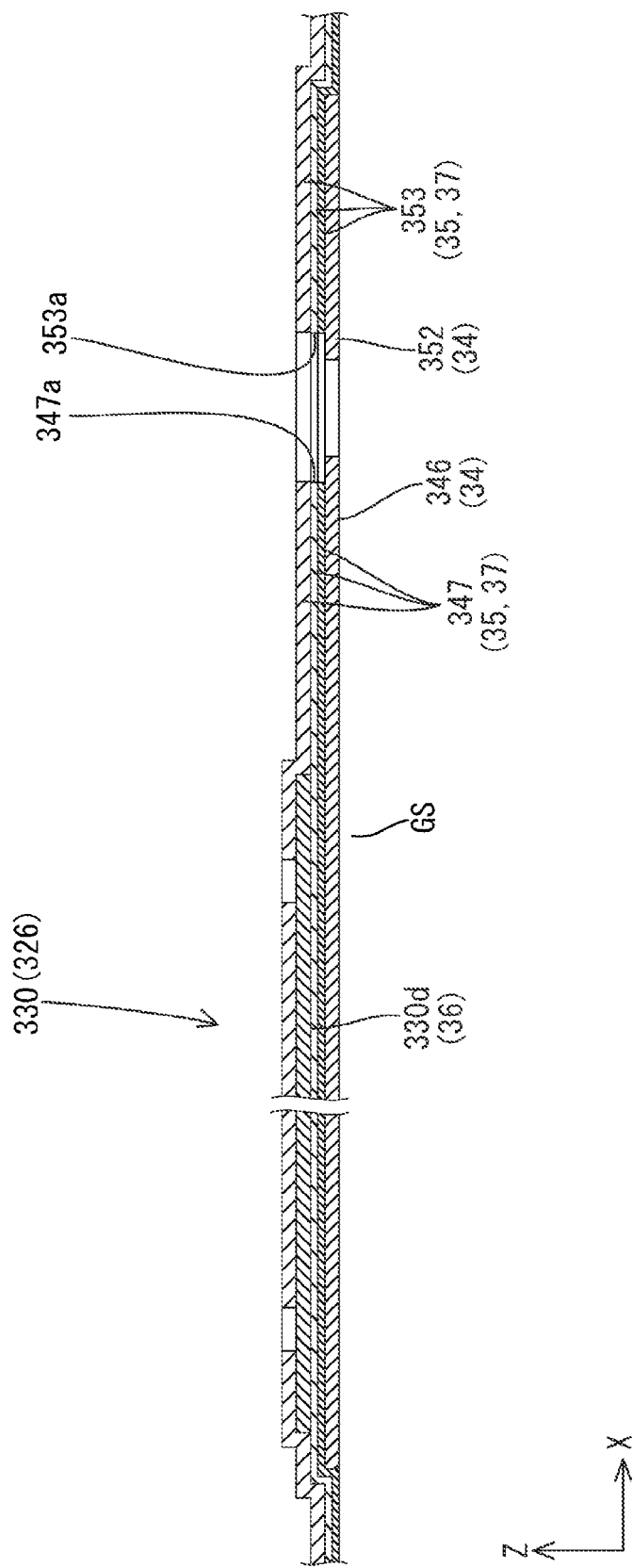
FIG. 29 is a cross-sectional view of FIG. 28 along line xxix-xxix.

As illustrated in FIGS. 26 and 27, in this embodiment, each common line-side connecting portion 346 that projects from a side edge of the common line 325 on a static protection circuit portion 326 side is configured as the static dissipating portion 352. This embodiment does not include the static dissipating portions formed from the semiconductor film 36 and the static dissipating portion connecting portion 54 formed from the second metal film 38 that are included in the first embodiment. The common line-side connecting portion 346 overlaps a second shorting line 333 in a plan view. The common line-side connecting portion 346 is connected to the second shorting line 333 via common line-side holes 347a that are through holes formed in a common line-side insulator 347 arranged between the common line-side connecting portion 346 and the second shorting line 333. The common line-side insulator 347 is configured as the static dissipating portion protection portion 353 and the common line-side holes 347a are configured as static dissipating holes 353a. Three common line-side holes 347a are arranged in the Y-axis direction. In the stage prior to the formation of the second metal film 38 in the fabrication process of an array board 311b, the common line-side connecting portion 346 (or the static dissipating portion 352) formed form the first metal film 34 is exposed to the outside through the common line-side holes 347a (or the static dissipating holes 353a) of the common line-side insulator 347 (or the static dissipating portion protection portion 353) as illustrated in FIGS. 28 and 29. If static electricity builds up in semiconductor portions 329d, 330d of the diodes 329, 330 or a gate-side connecting portion 348 of a contact portion 332, the static electricity may be transferred to the common line-side connecting portion 346 (or the static dissipating portion 352) via the common line-side hole 347a (or the static dissipating hole 353a) in a path toward the other. According to this configuration, electrostatic breakdown is less likely to occur in the static protection circuit portion 326 and the contact portion 332.

The array board 331b according to this embodiment includes the glass substrate GS, the first metal film 34, the gate insulator 35, the semiconductor film 36, the protection film 37, the second metal film 38, the first diodes 329, the gate lines 319, the gate line-side connecting portions 348, the contact portion-side insulators 349, the contact portions 332, and the static protection portions 351. The first metal film 34 is formed on the glass substrate GS. The gate insulator 35 is formed at least on the first metal film 34. The semiconductor film 36 is formed on the gate insulator 35. The protection film 37 is formed at least on the semiconductor film 36 and protects the semiconductor film 36. The second metal film 38 is formed on the protection film 37. Each first diode 329 includes at least two first electrodes 329a, 329b, a first protection portion 329c, and a first semiconductor portion 329d. The first electrodes 329a, 329b are formed from the second metal film 38. The first protection portion 329c is formed from the protection film 37. The first protection portion 329c includes two first diode-side holes 329c1, 329c2 that are through holes formed at positions overlapping the first electrodes 329a, 329b, respectively. The first semiconductor portion 329d is formed from the semiconductor film 36. The first semiconductor portion 329d is connected to the first electrodes 329a, 329b via the first diode-side holes 329c1, 329c2. Each gate line 319 is formed from the first metal film 34. Each gate line-side connecting portion 348 is formed from the first metal film 34 at an end of the gate line 319. Each contact portion-side insulator 349 is formed from the protection film 37 and the gate insulator 35. The contact portion-side insulator 349 includes contact portion-side holes 349a that are through holes formed at positions overlapping the gate line-side connecting portion 348. Each contact portion 332 includes at least a diode-side connecting portion 350 formed from the second metal film 38. The diode-side connecting portion 350 continues from one of the first electrodes 329a, 329b of the first diode 329. The diode-side connecting portion 350 is connected to the gate line-side connecting portion 348 via the contact portion-side holes 349a. Each static protection portion 351 includes at least the static dissipating portion 352 and the static dissipating portion protection portion 353. The static dissipating portion 352 is formed from the first metal film 34 and arranged between the first diode 329 and the contact portion 332. The static dissipating portion 352 is for dissipating static electricity that builds up in any one of the first diode 329 and the contact portion 332. The static dissipating portion protection portion 353 is formed from the protection film 37 and the gate insulator 35. The static dissipating portion protection portion 353 includes the static dissipating holes 353a that are through holes formed at positions overlapping the static dissipating portion 352 in a plan view.

The gate line-side connecting portion 348 is formed at the end of the gate line 319 in the contact portion 332. The gate line 319 is formed from the first metal film 34. The diode-side connecting portion 350 is formed from the second metal film 38. The diode-side connecting portion 350 continues from one of the first electrodes 329a, 329b of the first diode 329. The gate line-side connecting portion 348 is connected to the diode-side connecting portion 350 via the contact portion-side holes 349a that are through holes in the contact portion-side insulator 349. With this configuration, the signals from the first diode 329 are supplied to the gate line 319. In the stage prior to the formation of the second metal film 38 in the fabrication process of the array board 311b, the first diode-side holes 329c1, 329c2 are formed in the protection portion that are formed from the protection film 37 in the first diode 329. The first diode-side holes 329c1, 329c2 are through holes. Furthermore, the contact portion-side holes 349a are formed in the contact portion-side insulator 349 that are formed from the protection film 37 and the gate insulator 35 in the contact portion 332. The contact portion-side holes 349a are through holes. The first semiconductor portion 329d that is formed from the semiconductor film 36 is exposed through the first diode-side holes 329c1, 329c2. The gate line-side connecting portion 348 that is formed from the first metal film 34 is exposed through the contact portion-side holes 349a. If static electricity builds up in the first diode 329 or the contact portion 332 under the condition, the static electricity may be applied to the other first diode 329 or the gate line-side connecting portion 348. This may cause a malfunction of the first diode 329 or the contact portion 332.

This embodiment includes the static protection portions 351 each including at least the static dissipating portion 352 and the static dissipating portion protection portion 353. The static dissipating portion 352 is formed from the first metal film 34 and arranged between the first diode 329 and the contact portion 332 in a plan view. The static dissipating portion protection portion 353 is formed from the protection film 37 and the gate insulator 35. The static dissipating portion protection portion 353 includes the static dissipating holes 353a that are through holes formed at positions overlapping the static dissipating portion 353 in a plan view. In the stage prior to the formation of the second metal film 38 in the fabrication process of the array board 311b, the static dissipating portion 352 is exposed through the static dissipating holes 353a that are through holes in the static dissipating portion protection portion 353. Even if static electricity builds up in one of the first diode 329 and the contact portion 332 in the stage prior to the formation of the second metal film 38, the static electricity is transferred to the static dissipating portion 352 via the static dissipating holes 353a that are present in a path toward the other. With this configuration, a malfunction of the first diode 329 or the contact portion 332 due to the static electricity is less likely to occur.

Furthermore, the static dissipating portion 352 is formed from the first metal film 34 that also forms the gate line-side connecting portion 348 in the contact portion 332. According to this configuration, if static electricity builds up in the first semiconductor portion 329d of the first diode 329, the static electricity is effectively dissipated. Application of the static electricity to the gate line-side connecting portion 348 is properly restricted.

<Fifth Embodiment>

Figure 30:
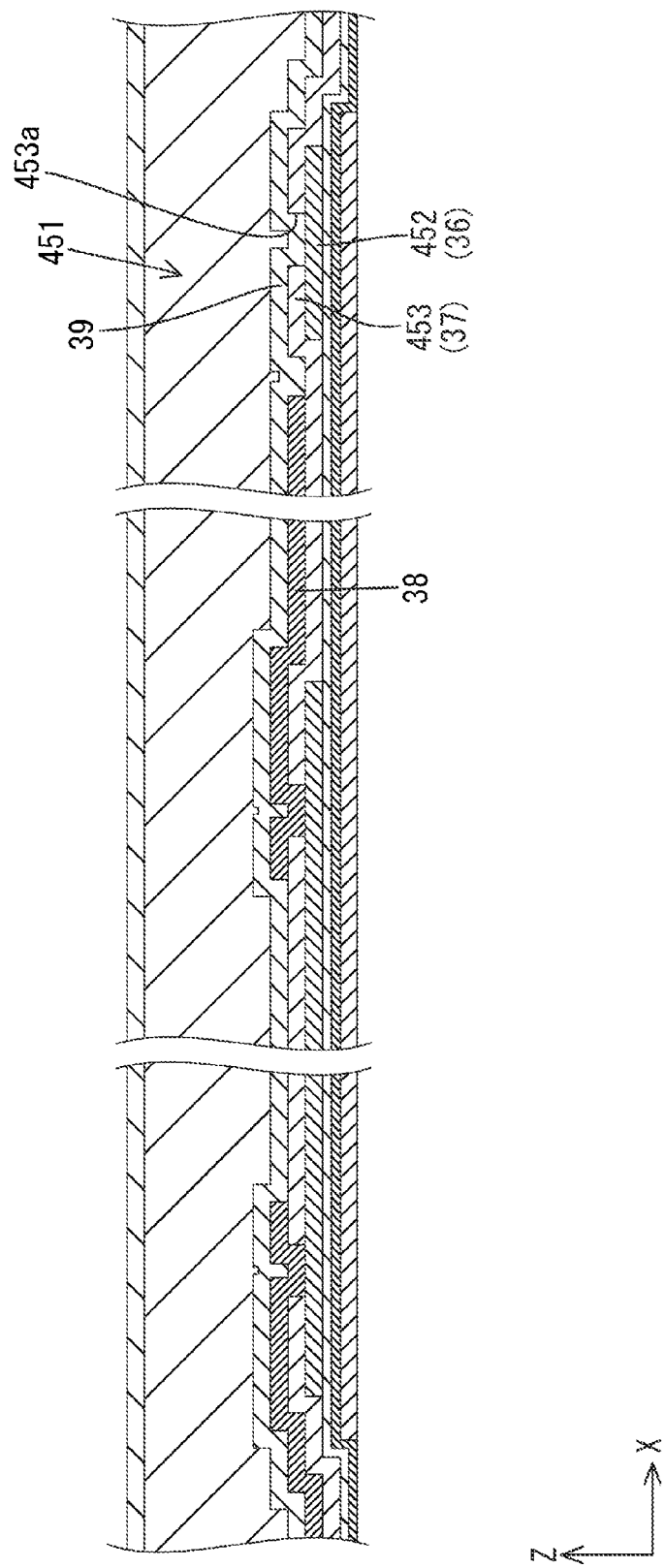
FIG. 30 is a cross sectional-view of a static protection portion an array board according to a fifth embodiment of the present invention.

A fifth embodiment according to the present invention will be described with reference to FIG. 30. The fifth embodiment has the same configuration as the first embodiment except for the static dissipating portion connecting portions 54. Similar configurations, operations, and effects to the first embodiment will not be described.

This embodiment includes static protection portions 451. As illustrated in FIG. 30, each static protection portion 451 includes a static dissipating portion 452 and a static dissipating portion protection portion 453. The static dissipating portion 452 is formed from the semiconductor film 36. The static dissipating portion protection portion 453 is formed from the protection film 37. The static dissipating portion protection portion 453 includes a static dissipating hole 453a. The second metal film 38 does not overlap them in a plan view. A portion of the first interlayer insulation film 39 is inserted in the static dissipating hole 453a. According to this configuration, in the stage prior to the formation of the second metal film 38, the static dissipating portion 452 is exposed to the outside through the static dissipating hole 453a. Therefore, static electricity that may build up in the fabrication process is properly dissipated.

<Sixth Embodiment>

A sixth embodiment according to the present invention will be described with reference to FIG. 31. The sixth embodiment includes second shorting lines 533 and static dissipating portion connecting portions 554 that are connected, respectively. Similar configurations, operations, and effects to the first embodiment will not be described.

Figure 31:
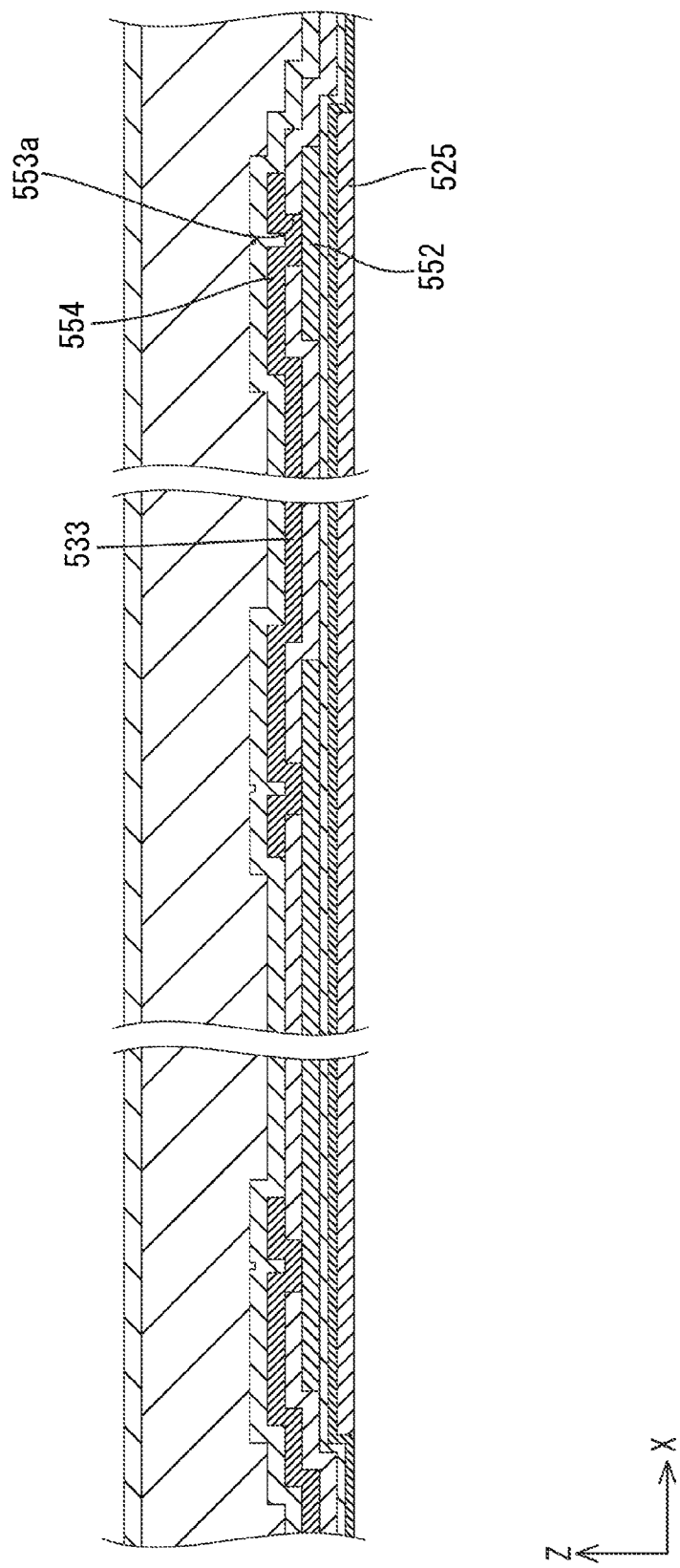
FIG. 31 is a cross sectional-view of a static protection portion an array board according to a sixth embodiment of the present invention.

As illustrated in FIG. 31, an X-axis dimension of an area in which each second shorting line 533 is formed is extended such that the second shorting line 533 overlaps a common line 525 in a plan view. An overlapping portion of the second shorting line 533 with the common line 525 is configured as the static dissipating portion connecting portions 554. The static dissipating portion connecting portions 554 continues from the second shorting line 533. The static dissipating portion connecting portions 554 is connected to a static dissipating portion 552 via a static dissipating hole 553a.

<Seventh Embodiment>

A seventh embodiment according to the present invention will be described with reference to FIGS. 32 and 33. The sixth embodiment includes static dissipating portions 652 and static dissipating portion connecting portions 654 having different configurations from those of the first embodiment. Similar configurations, operations, and effects to the first embodiment will not be described.

Figure 32:
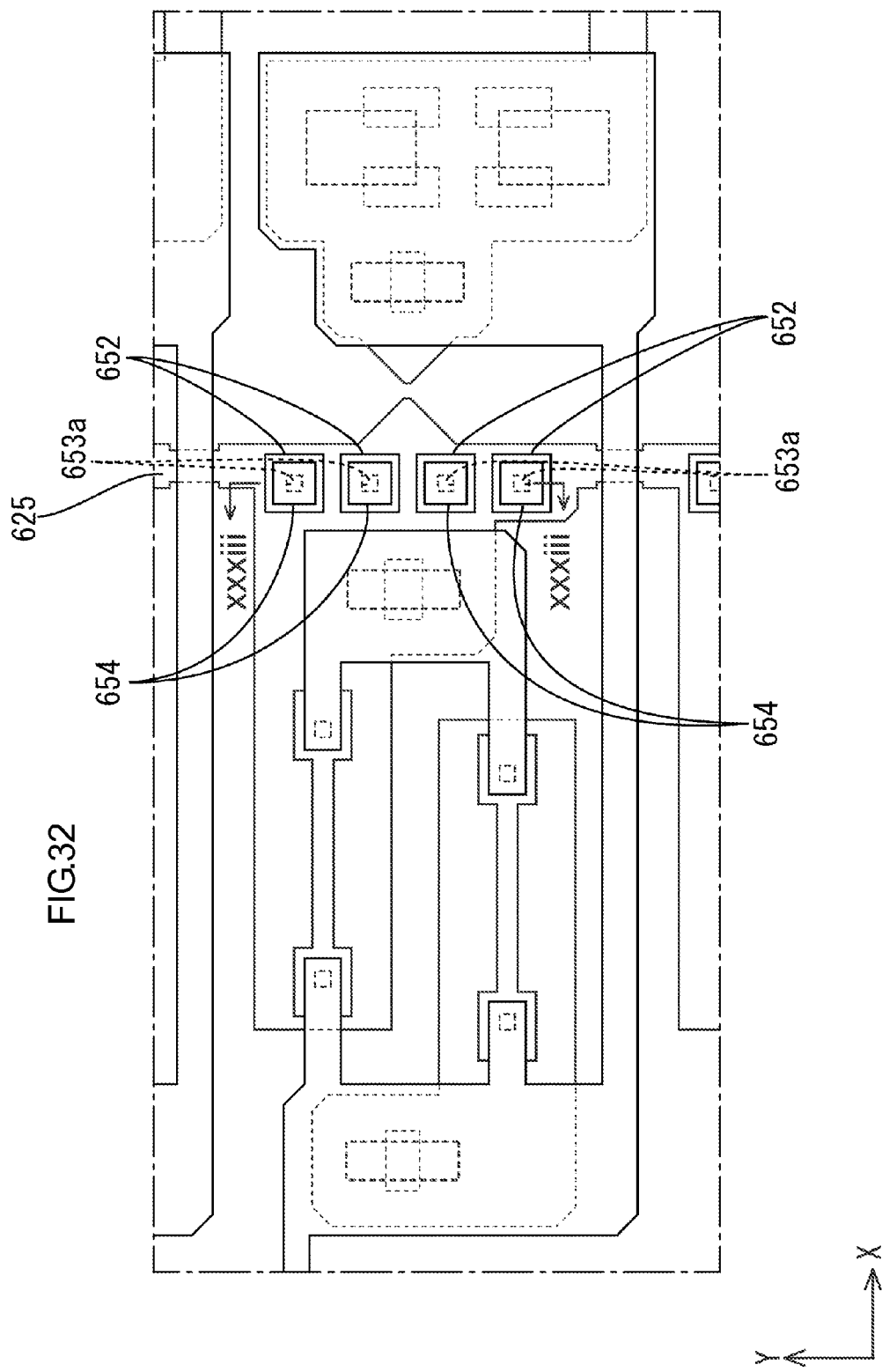
FIG. 32 is a plan view of an array board illustrating a static protection circuit portion, a common line, a static protection portion, and a contact portion according to a seventh embodiment of the present invention.
Figure 33:
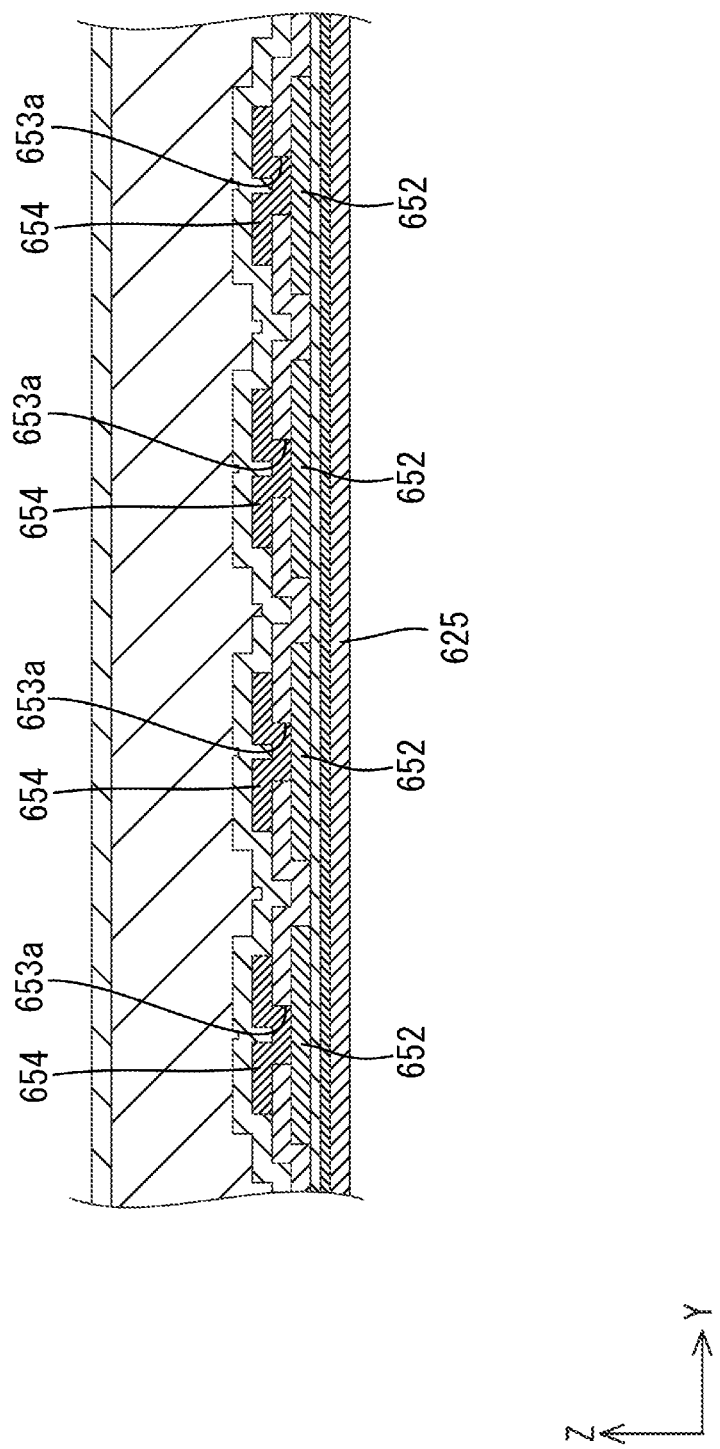
FIG. 33 is a cross-sectional view of FIG. 32 along line xxxiii-xxxiii.

As illustrated in FIGS. 32 and 33, four static dissipating portions 652 and four static dissipating portion connecting portions 654 are provided for four static dissipating holes 653a. The static dissipating portions 652 and the static dissipating portion connecting portions 654 are arranged at positions overlapping a common line 625 in a plan view. The static dissipating portions 652 and the static dissipating portion connecting portions 654 are arranged at intervals along a direction in which the common line 625 extends (the Y-axis direction). Each of the static dissipating portions 652 and the static dissipating portion connecting portions 654 has a substantially square shape in the plan view. Each static dissipating portion 652 is slightly larger than the static dissipating portion connecting portion 654 in the plan view.

<Other Embodiments>

The present invention is not limited to the embodiments described above and illustrated by the drawings. For examples, the following embodiments will be included in the technical scope of the present invention.

(1) Each of the above embodiments includes the diodes having a TFT configuration as static protection circuit components (semiconductor components) in the static protection circuit portions. Instead of such diodes, zener diodes or varistors may be used. In that case, each of the static protection circuit components (zener diodes or varistors) may include two electrodes, a protection portion having two semiconductor component-side holes, a semiconductor portion that is connected to the electrodes via the semiconductor component-side holes but may not include a gate electrode.

(2) The number, the plan-view size (the X-axis dimension and the Y-axis dimension of the area of formation), the plan-view shape of the static dissipating portions, those of the second dissipating holes, and those of the static dissipating portion connecting portions may be altered from the above embodiments as appropriate.

(3) In each of the above embodiments, the oxide semiconductor used for the semiconductor film is an oxide thin film that contains indium (In), gallium (Ga), and zinc (Zn). However, other types of oxide semiconductors may be used. Examples of oxides include an oxide that contains indium (In), silicon (Si), and zinc (Zn), an oxide that contains indium (In), aluminum (Al), and zinc (Zn), an oxide that contains tin (Sn), silicon (Si), and zinc (Zn), an oxide that contains tin (Sn), aluminum (Al), and zinc (Zn), an oxide that contains tin (Sn), gallium (Ga), and zinc (Zn), an oxide that contains gallium (Ga), silicon (Si), and zinc (Zn), an oxide that contains gallium (Ga), aluminum (Al), and zinc (Zn), an oxide that contains indium (In), copper (Cu), and zinc (Zn), and an oxide that contains tin (Sn), copper (Cu), and zinc (Zn).

(4) In the above embodiments, each of the TFTs, the column control circuits, and the row control circuits includes the oxide thin film that contains indium (In), gallium (Ga), and zinc (Zn) as a semiconductor film. However, a semiconductor film made of amorphous silicon (a-Si) or polysilicon may be used. For example, a continuous grain (CG) silicon thin film may be used.

(5) Each of the above embodiments includes the liquid crystal panel that includes an FFS mode as an operation mode. However, other liquid crystal panels are also included in the scope of the present invention, for example, a liquid crystal panel that includes an in-plane switching (IPS) mode or a vertical alignment (VA) mode as an operation mode is also included in the scope of the present invention.

(6) Each of the above embodiments includes the first metal film and the second metal film that are formed from a stacked film of titanium (Ti) and copper (Cu). However, the following materials may be used instead of titanium: molybdenum (Mo), molybdenum nitride (MoN), titanium nitride (TiN), tungsten (W), niobium (Nb), molybdenum-titanium alloy (MoTi), and molybdenum-tungsten (MoW) alloy. Furthermore, single-layered metal films such as titanium, copper, and aluminum films may be used.

(7) The plan-view shapes or the routing of the first shorting lines, the second shorting lines, and the common line may be altered from the above embodiment as appropriate. The arrangement of the diodes with respect the X-axis direction and the Y-axis direction, the arrangement of the electrodes of each diode, the width and the length of the semiconductor portion of each diode may be altered as appropriate. The arrangement of the number of the connecting points in the contact portions may be altered as appropriate.

(8) Each of the above embodiments includes the driver that is directly mounted on the array board through the COG method. A driver that is mounted on a flexible printed circuit board that is connected to the array board via an ACF is also included in the scope of the present invention.

(9) Each of the above embodiments includes the column control circuit and the row control circuit arrange in the non-display area of the array board. However, any one of the column control circuit and the row control circuit may be omitted, and the driver may be configured to perform the functions of the omitted circuit.

(10) Each of the above embodiments includes the liquid crystal panel having a vertically-long rectangular shape. However, liquid crystal panels having a horizontally-long rectangular shape of a square shape are also included in the scope of the present invention.

(11) Each of the above embodiments may further include a functional panel, such as a touch panel and a parallax barrier panel (a switching liquid crystal panel), layered and attached to the liquid crystal panel.

(12) The liquid crystal display device according to the above embodiments includes the edge-light type backlight unit. However, the liquid crystal display device may include a direct backlight unit.

(13) The transmission type liquid crystal display devices each including the backlight unit, which is an external light source, are described as the embodiments. However, reflection type liquid crystal display devices that use outside light to display images are also included in the scope of the present invention. The reflection type liquid crystal display devices do not require backlight units.

(14) Each of the above embodiments includes the TFTs as switching components of the liquid crystal display device. However, liquid crystal display devices that include switching components other than TFTs (e.g., thin film diodes (TFDs)) may be included in the scope of the present invention. Furthermore, black-and-white liquid crystal display devices, other than color liquid crystal display device, are also included in the scope of the present invention.

(15) The liquid crystal display devices including the liquid crystal panels as the display panels are described as the embodiments. However, display devices that include other types of display panels (e.g., plasma display panels (PDPs) and organic EL panels) are also included in the scope of the present invention. Such display devices do not require backlight units.

(16) The above embodiments include the liquid crystal panels that are classified as small sized or small to middle sized panels. Such liquid crystal panels are used in electronic devices including PDAs, mobile phones, notebook computers, digital photo frames, portable video games, and electronic ink papers. However, liquid crystal panels that are classified as middle sized or large sized (or supersized) panels having screen sizes from 20 inches to 90 inches are also included in the scope of the present invention. Such display panels may be used in electronic devices including television devices, digital signage, and electronic blackboard.

EXPLANATION OF SYMBOLS

11: liquid crystal panel (display panel), 11a: CF board (counter substrate), 11b, 311b: array board (semiconductor device), 11c: liquid crystal layer, 17: TFT (switching component), 19, 119, 219, 319: gate line (signal line), 25, 125, 225, 325, 525: common line (static dissipating line), 29, 129, 329: first diode (semiconductor component), 29a, 329a: one of first electrodes, 29b, 129b, 329b: the other one of the first electrodes, 29c, 329c: first protection portion (a protection portion), 29d, 129d: first semiconductor portion (semiconductor portion), 29c1, 29c2, 329c1, 329c2: first diode-side hole (semiconductor component-side hole), 29e: gate electrode (gate electrode), 30, 130, 230, 330: second diode (second semiconductor component), 30a, 130a: one of second electrodes (one of second electrode), 30b, 130b: the other one of the second electrodes (another second electrode), 30c, 130c: second protection portion (second protection portion), 30c1, 30c2, 130c1, 130c2: second diode-side hole (semiconductor component-side hole), 30d, 130d, 330d: second semiconductor portion (second semiconductor portion), 30e, 130e, 230e: second gate electrode (second gate electrode), 31, 131: first shorting line, 32, 132, 332: contact portion, 33, 133, 233, 333, 533: second shorting line, 34: first metal film, 35: gate insulator (insulation film), 36: semiconductor film, 37: protection film, 38: second metal film, 42: first shorting line-side connecting portion, 43: first shorting line-side insulator (third insulator), 43a: first shorting line-side hole, 45, 145, 245: second shorting line-side insulator (second insulator), 45a, 145a, 245a: second shorting line-side hole, 46, 246, 346: common line-side connecting portion (static dissipating line-side connecting portion), 47, 247, 347: common line-side insulator (fourth insulator), 47a, 247a, 347a: common line-side hole (second second shorting line-side hole), 48, 348: gate line-side connecting portion (signal line-side connecting portion), 49: contact portion-side insulator (insulator), 49a: contact portion-side hole, 50, 150, 350: diode-side connecting portion (semiconductor component-side connecting portion), 51, 151, 351, 451: static protection portion, 52, 152, 252, 352, 452, 552, 652: static dissipating portion, 53, 353, 453, 553: static dissipating portion protection portion, 53a, 353a, 453a, 553a, 653a: static dissipating hole, 54, 554, 654: dissipating portion connecting portion, 55: second static dissipating portion, GS: glass substrate (substrate)

The invention claimed is:

1. A semiconductor device comprising:
a substrate;
a first metal film formed on the substrate, the first metal film forming a signal line and a signal line-side connecting portion;
an insulation film formed at least on the first metal film;
a semiconductor film formed on the insulation film, the semiconductor film forming a semiconductor portion of a semiconductor component and a static dissipating portion of a static protection portion;
a protection film formed at least on the semiconductor film and protecting the semiconductor film, the protection film forming a protection portion of the semiconductor component; and
a second metal film formed on the protection film, the second meta film forming two electrodes and a semiconductor component-side connecting portion in a contact portion, wherein
the protection portion includes two semiconductor component-side holes that are through holes formed at positions overlapping the two electrodes,
the semiconductor portion is connected to the two electrodes via the semiconductor component-side holes,
the signal line-side connecting portion is formed at an end of the signal line,
the protection film and the insulation film form an insulator in the contact portion including a contact portion-side hole that is a through hole formed at a position overlapping the signal line-side connecting portion,
the semiconductor component-side connecting portion continues from one of the two electrodes of the semiconductor component and is connected to the signal line-side connecting portion via the contact portion-side hole,
the static dissipating portion is arranged between the semiconductor component and the contact portion in a plan view for dissipating static electricity that builds up in one of the semiconductor component and the contact portion in a stage prior to formation of the second metal film,
the static dissipating portion protection portion includes a static dissipating hole that is a through hole formed at a position overlapping the static dissipating portion in a plan view.

2. The semiconductor device according to claim 1, wherein the semiconductor film is made of oxide semiconductor.

3. The semiconductor device according to claim 1, wherein the first metal film forms a static dissipating line, arranged between the semiconductor component and the contact portion in a plan view and such that at least a portion of the static dissipating line overlaps the static dissipating portion and the static dissipating portion protection portion to dissipate static electricity that is transferred to the static dissipating portion.

4. The semiconductor device according to claim 3, wherein
the second metal film forms two second electrodes,
the protection film forms a second protection portion of a second semiconductor component including two second semiconductor component-side holes that are through holes formed at positions overlapping the two second electrodes,
the semiconductor film forms a second semiconductor portion of the second semiconductor component connected to the two second electrodes via the two second semiconductor component-side holes,
the second metal film forms a first shorting line,
the first shorting line continues to the semiconductor component-side connecting portion,
the first shorting line shorts one of the two electrodes to one of the two second electrodes,
the second metal film forms a second shorting line,
the second shorting line shorts another one of the two electrodes to another one of the two second electrodes,
the protection film and the insulation film form a second insulator,
the second insulator includes a second shorting line-side hole that is a through hole formed at a position overlapping the second shorting line,
the first metal film forms a static dissipating line-side connecting portion,
the static dissipating line-side connecting portion is arranged so as to overlap the static dissipating line and such that at least a portion of the static dissipating line-side connecting portion overlaps the second shorting line in a plan view, and
the static dissipating line-side connecting portion is connected to the second shorting line via the second shorting line-side hole.

5. The semiconductor device according to claim 4, wherein
the protection film and the insulation film form a third insulator,
the third insulator includes a first shorting line-side hole that is a through hole formed at a position overlapping the first shorting line,
the semiconductor component includes a gate electrode formed from the first metal film, arranged so as to overlap at least portions of the two electrodes, the semiconductor portion, and the first shorting line in a plan view, and connected to the first shorting line via the first shorting line-side hole, and
the second semiconductor component includes a second gate electrode formed from the first metal film, arranged so as to overlap the two second electrodes and the second semiconductor portion in a plan view, and continues to the static dissipating line-side connecting portion.

6. The semiconductor device according to claim 4, wherein
the protection film and the insulation film form a third insulator
the third insulator includes a first shorting line-side hole that is a through hole formed at a position overlapping the first shorting line,
the semiconductor component includes a gate electrode formed from the first metal film, arranged so as to overlap the two electrodes, the semiconductor portion, and the first shorting line in a plan view, and connected to the first shorting line via the first shorting line-side hole,
the protection film and the insulation film form a fourth insulator,
the fourth insulator includes a second second shorting line-side hole that is a through hole formed at a position overlapping the second shorting line and,
the second semiconductor component includes a second gate electrode formed from the first metal film, arranged so as to overlap the two second electrodes, the second semiconductor portion, and the second shorting line in a plan view, and connected to the second shorting line via the second second shorting line-side hole.

7. The semiconductor device according to claim 1, wherein
the second metal film forms two second electrodes,
the semiconductor film forms a second semiconductor component,
the second semiconductor component including at least:
a second protection portion formed from the protection film and including two second semiconductor component-side holes that are through holes formed at positions overlapping the two second electrodes; and
a second semiconductor portion formed from the semiconductor film, connected to the two second electrodes via the two second semiconductor component-side holes, arranged along a plate surface of the substrate and relative to the semiconductor component in a second direction that is perpendicular to a first direction in which the two second electrodes are arranged,
the second metal film forms a first shorting line that continues to the semiconductor component-side connecting portion,
the first shorting line shorts one of the two electrodes to one of the two second electrodes
the second metal film forms a second shorting line,
the second shorting line shorts another one of the two electrodes to another one of the two second electrodes,
multiple sets of the semiconductor component, the second semiconductor component, the contact portion, the signal line, the static protection portion, the first shorting line, and the second shorting line are arranged along the second direction, and
the second shorting line is connected to the first shorting line in an adjacent set with respect to the second direction.

8. The semiconductor device according to claim 3, wherein the first metal film forms second static dissipating portions at a portion of the signal line-side connecting portion in the contact portion and a portion of the static dissipating line,
the portions being opposite to each other, and
the second static dissipating portions projecting toward each other.

9. The semiconductor device according to claim 8, wherein the second static dissipating portion formed at the static dissipating line is arranged adjacent to the static dissipating portion.

10. The semiconductor device according to claim 9, wherein
the static protection portion includes static dissipating holes each having the same configuration as that of the static dissipating hole, and the static dissipating holes is arranged across the second static dissipating portion along a plate surface of the substrate and a direction perpendicular to a direction in which the two second static dissipating portions are arranged.

11. The semiconductor device according to claim 1, wherein
the static protection portion includes a static dissipating portion connecting portion formed from the second metal film,
the static dissipating portion connecting portion is arranged so as to overlap the static dissipating portion in a plan view, and connected to the static dissipating portion via the static dissipating hole.

12. A display device comprising:
the semiconductor device according to claim 1;
a counter substrate arranged opposite the semiconductor device;
a liquid crystal layer arranged between the semiconductor device and the counter substrate; and
a switching component included in the semiconductor device and connected to the signal line.

13. A semiconductor device comprising:
a substrate;
a first metal film formed on the substrate, the first metal film forming a signal line, a signal line-side connecting portion, and a static dissipating portion of a static protection portion;
an insulation film formed at least on the first metal film;
a semiconductor film formed on the insulation film, the semiconductor film forming a semiconductor portion of a semiconductor component;
a protection film formed at least on the semiconductor film and protecting the semiconductor film, the protection film forming a protection portion of the semiconductor component; and
a second metal film formed on the protection film, the second metal film forming two electrodes and a semiconductor component-side connecting portion in the contact portion, wherein
the protection portion includes two semiconductor component-side holes that are through holes formed at positions overlapping the two electrodes,
the semiconductor portion is connected to the two electrodes via the semiconductor component-side holes,
the signal line-side connecting portion is formed at an end of the signal line, the protection film and the insulation film form an insulator that includes a contact portion-side hole that is a through hole formed at a position overlapping the signal line-side connecting portion,
the semiconductor component-side connecting portion continues from one of the two electrodes of the semiconductor component and is connected to the signal line-side connecting portion via the contact portion-side hole,
the static dissipating portion is arranged between the semiconductor component and the contact portion in a plan view,
the static dissipating portion is for dissipating static electricity that builds up in one of the semiconductor component and the contact portion in a stage prior to formation of the second metal film, and
the protection film and the insulation film form a static dissipating portion protection portion, and the static dissipating portion protection portion includes a static dissipating hole that is a through hole formed at a position overlapping the static dissipating portion in a plan view.

14. A method of fabricating a semiconductor device, the method comprising:
forming a first metal film on a substrate;
forming an insulation film at least on the first metal film;
forming a semiconductor film on the insulation film;
forming a protection film at least on the semiconductor film;
forming second metal film on the protection film;
forming two electrodes from the second metal film;
forming a protection portion of a semiconductor component from the protection film;
forming two semiconductor component-side holes in the protection portion at positions overlapping the two electrodes, the two semiconductor component-side holes being through holes;
forming a semiconductor portion of the semiconductor component from the semiconductor film;
connecting the semiconductor portion to the two electrodes via the semiconductor component-side holes;
forming a signal line from the first metal film;
forming a signal line-side connecting portion from the first metal film at an end of the signal line;
forming an insulator from the protection film and the insulation film in a contact portion;
forming a contact portion-side hole in the insulator at a positon overlapping the signal line-side connecting portion, the contact portion-side hole being a through hole;
forming a semiconductor component-side connecting portion from the second metal film so as to continue from one of the two electrodes of the semiconductor component;
connecting the semiconductor component-side connecting portion to the signal line-side connecting portion via the contact portion-side hole;
forming a static dissipation portion of a static protection portion from the first metal film between the semiconductor component and the contact portion in a plan view for dissipating static electricity that builds up in one of the semiconductor and the contact portion in a stage prior to formation of the second metal film;
forming the static dissipating portion protection portion from the protection film; and
forming a static dissipating hole at a position overlapping the static dissipating portion in a plan view, the static dissipating hole being a through hole.

15. The method according to claim 14 further comprising forming a static dissipating line from the first metal film between the semiconductor component and the contact portion in a plan view such that at least a portion of the static dissipating line overlaps the static dissipating portion and the static dissipating portion protection portion.

16. The method according to claim 15 further comprising:
forming two second electrodes from the second metal film;
forming a second protection portion of a second semiconductor component from the protection film;
forming two second semiconductor component-side holes in the second protection portion at positions overlapping the two second electrodes, the two second semiconductor component-side holes being through holes;

forming a second semiconductor portion of the second semiconductor component from the semiconductor film;
connecting the second semiconductor portion to the two second electrodes via the two second semiconductor component-side holes;
forming a first shorting line from the second metal film so as to continue to the semiconductor component-side connecting portion and to short one of the two electrodes to one of the two second electrodes;
forming a second shorting line from the second metal film so as to short another one of the two electrodes to another one of the two second electrodes; and
forming a second insulator from the protection film and the insulation film;
forming a second shorting line-side hole in the second insulator at a position overlapping the second shorting line, the second shorting line-side hole being a through hole;
forming a static dissipating line-side connecting portion from the first metal film so as to overlap the static dissipating line and such that at least a portion of the static dissipating line-side connecting portion overlaps the second shorting line in a plan view; and
connecting the static dissipating line-side connecting portion to the second shorting line via the second shorting line-side hole.

17. The method according to claim 16 further comprising:
forming a third insulator from the protection film and the insulation film;
forming a first shorting line-side hole in the third insulator at a position overlapping the first shorting line;
forming a gate electrode of the semiconductor component from the first metal film so as to overlap at least portions of the two electrodes, the semiconductor portion, and the first shorting line in a plan view;
connecting the gate electrode to the first shorting line via the first shorting line-side hole;
forming a second electrode of the second semiconductor component from the first metal film; and
connecting the second electrode to the first shorting line in an adjacent set with respect to the second direction.

18. The method according to claim 16 further comprising:
forming a third insulator from the protection film and the insulation film;
forming a first shorting line-side hole in the third insulator at a position overlapping the first shorting line, the first shorting line-side hole being a through hole;
forming a gate electrode in the semiconductor component from the first metal film so as to overlap the two electrodes, the semiconductor portion, and the first shorting line in a plan view;
connecting the gate electrode to the first shorting line via the first shorting line-side hole;
forming a fourth insulator from the protection film and the insulation film;
forming a second second shorting line-side hole in the fourth insulator at a position overlapping the second shorting line, the second second shorting line-side hole being a through hole;
forming a second gate electrode in the second semiconductor component from the first metal film so as to overlap the two second electrodes, the second semiconductor portion, and the second shorting line in a plan view; and
connecting the second gate electrode to the second shorting line via the second second shorting line-side hole.

19. The method according to claim 14 further comprising:
forming two second electrodes from the second metal film;
forming a second semiconductor component from the semiconductor film;
forming a second protection portion of the second semiconductor component from the protection film;
forming two second semiconductor component-side holes in the second protection portion at positions overlapping the two second electrodes, the two second semiconductor component-side holes being through holes;
forming a second semiconductor portion of the second semiconductor component from the semiconductor film so as to be arranged along a plate surface of the substrate and relative to the semiconductor component in a second direction that is perpendicular to a first direction in which the two second electrodes are arranged;
connecting the second semiconductor portion to the two second electrodes via the two second semiconductor component-side holes;
forming a first shorting line from the second metal film so as to continue to the semiconductor component-side connecting portion and to short one of the two electrodes to one of the two second electrodes;
forming a second shorting line from the second metal film so as to short another one of the two electrodes to another one of the two second electrodes;
arranging multiple sets of the semiconductor component, the second semiconductor component, the contact portion, the signal line, the static protection portion, the first shorting line, and the second shorting line along the second direction; and
connecting the second shorting line to the first shorting line in an adjacent set with respect to the second direction.

20. A method of fabricating a semiconductor device, the method comprising:
forming a first metal film on a substrate;
forming an insulation film at least on the first metal film;
forming a semiconductor film on the insulation film;
forming a protection film at least on the semiconductor film;
forming second metal film on the protection film;
forming two electrodes from the second metal film;
forming a protection portion of a semiconductor component from the protection film;
forming two semiconductor component-side holes in the protection portion at positions overlapping the two electrodes, the two semiconductor component-side holes being through holes;
forming a semiconductor portion of the semiconductor component from the semiconductor film;
connecting the semiconductor portion to the two electrodes via the semiconductor component-side holes;
forming a signal line from the first metal film;
forming a signal line-side connecting portion from the first metal film at an end of the signal line;
forming an insulator from the protection film and the insulation film in a contact portion;
forming a contact portion-side hole in the insulator at a positon overlapping the signal line-side connecting portion, the contact portion-side hole being a through hole;

forming a semiconductor component-side connecting portion from the second metal film so as to continue from one of the two electrodes of the semiconductor component;

connecting the semiconductor component-side connecting portion to the signal line-side connecting portion via the contact portion-side hole;

forming a static dissipation portion of a static protection portion from the first metal film between the semiconductor component and the contact portion in a plan view for dissipating static electricity that builds up in one of the semiconductor and the contact portion in a stage prior to formation of the second metal film;

forming the static dissipating portion protection portion from the protection film and the insulation from; and forming a static dissipating hole at a position overlapping the static dissipating portion in a plan view, the static dissipating hole being a through hole.

* * * * *